US011496110B2

(12) United States Patent
Gong et al.

(10) Patent No.: US 11,496,110 B2
(45) Date of Patent: *Nov. 8, 2022

(54) SPURIOUS-MODE-FREE, LATERALLY-VIBRATING MICROELECTROMECHANICAL SYSTEM RESONATORS

(71) Applicant: Board of Trustees of the University of Illinois, Urbana, IL (US)

(72) Inventors: Songbin Gong, Champaign, IL (US); Yong-Ha Song, Urbana, IL (US)

(73) Assignee: The Board of Trustees of the University of Illinois, Urbana, IL (US)

( * ) Notice: Subject to any disclaimer, the term of this patent is extended or adjusted under 35 U.S.C. 154(b) by 420 days.

This patent is subject to a terminal disclaimer.

(21) Appl. No.: 16/678,449

(22) Filed: Nov. 8, 2019

(65) Prior Publication Data
US 2020/0212873 A1 Jul. 2, 2020

Related U.S. Application Data

(63) Continuation of application No. 15/434,829, filed on Feb. 16, 2017, now Pat. No. 10,476,469.
(Continued)

(51) Int. Cl.
*H03H 9/02* (2006.01)
*H03H 9/17* (2006.01)
(Continued)

(52) U.S. Cl.
CPC .......... *H03H 9/02086* (2013.01); *H03H 3/02* (2013.01); *H03H 9/02015* (2013.01);
(Continued)

(58) Field of Classification Search
CPC .. H03H 9/02086; H03H 3/02; H03H 9/02015; H03H 9/02157; H03H 9/02228;
(Continued)

(56) References Cited

U.S. PATENT DOCUMENTS 6,215,375 B1   4/2001  Larson, III et al.
6,476,536 B1  11/2002  Pensala
(Continued)

FOREIGN PATENT DOCUMENTS

EP   2299593 A1    3/2011
WO  2014/035530 A2  3/2014

OTHER PUBLICATIONS

Adbolvand et al., "Thin-Film Piezoelectric-on-Silicon Resonators for High-Frequency Reference Oscillator Applications," pp. 2596-2606, IEEE Transactions on Ultrasonics, Ferroelectrics, and Frequency Control, vol. 55, No. 12, Dec. 2008.
(Continued)

*Primary Examiner* — Samuel S Outten
*Assistant Examiner* — Jorge L Salazar, Jr.
(74) *Attorney, Agent, or Firm* — Lowenstein Sandler LLP

(57) ABSTRACT

A micro-resonator includes a first electrode positioned on a piezoelectric plate at a first end of the piezoelectric plate, the first electrode including a first set of fingers and a second electrode positioned on the piezoelectric plate at a second end of the piezoelectric plate. The second electrode including a second set of fingers interdigitated with the first set of fingers with an overlapping distance without touching the first set of fingers, the overlapping distance being less than seven-tenths the length of one of the first set of fingers or the second set of fingers. At least one of the first end or the second end of the piezoelectric plate may define a curved shape.

20 Claims, 28 Drawing Sheets

Related U.S. Application Data

(60) Provisional application No. 62/296,176, filed on Feb. 17, 2016.

(51) Int. Cl.
    *H03H 3/02*     (2006.01)
    *H03H 9/56*     (2006.01)

(52) U.S. Cl.
CPC .... *H03H 9/02157* (2013.01); *H03H 9/02228* (2013.01); *H03H 9/02259* (2013.01); *H03H 9/02992* (2013.01); *H03H 9/171* (2013.01); *H03H 9/564* (2013.01); *H03H 9/568* (2013.01); *H03H 2003/021* (2013.01); *H03H 2003/027* (2013.01)

(58) Field of Classification Search
CPC ........... H03H 9/02259; H03H 9/02992; H03H 9/171; H03H 9/564; H03H 9/568; H03H 2003/021; H03H 2003/027
USPC ........................................................ 333/186
See application file for complete search history.

(56) References Cited

U.S. PATENT DOCUMENTS

| | | | |
|---|---|---|---|
| 8,228,141 B2 | 7/2012 | Abdolvand et al. | |
| 8,368,487 B1 | 2/2013 | Sorenson | |
| 8,497,747 B1 | 7/2013 | Wojciechowski et al. | |
| 8,638,178 B1 | 1/2014 | Wang | |
| 8,816,567 B2 | 8/2014 | Zuo et al. | |
| 9,525,398 B1 | 12/2016 | Olsson et al. | |
| 9,941,857 B1 | 4/2018 | Olsson et al. | |
| 10,476,469 B2 * | 11/2019 | Gong | H03H 9/171 |
| 2009/0133237 A1 | 5/2009 | Onishi et al. | |
| 2015/0162520 A1 | 6/2015 | Gong et al. | |
| 2015/0270826 A1 | 9/2015 | Burak | |

OTHER PUBLICATIONS

Adler, "Electromechanical Coupling to Lamb and Shear-Horizontal Modes in Piezoelectric Plates," pp. 223-231, IEEE Transactions on Ultrasonics, Ferroelecrics, and Frequency Control, vol. 36, No. 2, Mar. 1989.
Ansari et al., "A Temperature-Compensated Gallium Nitride Micromechanical Resonator," pp. 1127-1129, IEEE Electron Device Letters, vol. 35, No. 11, Nov. 2014.
Branch et al., "Elucidating the Origin of Spurious Modes in Aluminum Nitride Microresonators Using a 2-D Finite-Element Model," pp. 729-738, IEEE Transactions on Ultrasonics, Ferroelectrics, and Frequency Control, vol. 61, No. 5, May 2014.
Branch et al., "Suppressing Fine-Frequency Modes in Aluminum Nitride Microresonators," pp. 572-577, IEEE International Ultrasonics Symposium Proceedings, Sep. 3-6, 2014.
Cassella et al., "Reduction of Anchor Losses by Etched Slots in Aluminum Nitride Contour Mode Resonators," pp. 926-929, Joint UFFC, EFTF and PFM Symposium, Jul. 21-25, 2013.
Cassella, "Cross-Sectional Lamé Mode Ladder Filters for UHF Wideband Applications," pp. 681-683, IEEE Electron Device Letters, vol. 37, No. 5, May 2016.
Chandorkar, "Limits Of Quality Factor In Bulk-Mode Micromechanical Resonators," pp. 74-77, MEMS 2008, Tucson, AZ, USA, Jan. 13-17, 2008.
Chandrahalim, "Fully-Differential Mechanically-coupled PZT-on-Silicon Filters," pp. 713-716, IEEE International Ultrasonics Symposium Proceedings, Nov. 2-5, 2008.
Chandrahalim, "Performance Comparison of Pb(Zr0.52Ti0.48)O3-only and Pb(Zr0.52Ti0.48)O3-on-Silicon Resonators," Applied Physics Letters vol. 93, Issue 23, Dec. 2008.
Chang et al., "Analysis of Methods for Determining Electromechanical Coupling Coefficients of Piezoelectric Elements," pp. 630-641, IEEE Transactions On Ultrasonics, Ferroelectrics, And Frequency Control, vol. 42, No. 4, Jul. 1995.
Crespin et al., "Fully Integrated Switchable Filter Banks," pp. 1-3, Microwave Symposium Digest (MTT), 2012 IEEE MTT-S International, Jun. 17-22, 2012.
Diest et al., "Silver Diffusion Bonding And Layer Transfer Of Lithium Niobate To Silicon," pp. 1-4, Applied Physics Letters, Letter 93, Sep. 2008.
Giobannini, "Apodization Technique For Spurious Mode Suppression in AlN Contour-Mode Resonators," pp. 42-50, Sensors and Actuators A 206, Feb. 2014.
Gong et al., "An 880 Mhz Ladder Filter Formed By Arrays Of Laterally Vibrating Thin Film Lithium Niobate Resonators," pp. 1241-1244, MEMS 2014, San Francisco, CA, USA, Jan. 26-30, 2014.
Gong et al., "Design and Analysis of Lithium-Niobate-Based High Electromechanical Coupling RF-MEMS Resonators for Wideband Filtering," pp. 403-414, IEEE Transactions On Microwave Theory And Techniques, vol. 61, No. 1, Jan. 2013.
Gong et al., "Ghz AlN Lateral Overmoded Bulk Acoustic Wave Resonators with a f Q of 1.17X 10 13," Frequency Control and the European Frequency and Time Forum (FCS), 2011 Joint Conference of the IEEE Interanational 2011, pp. 1-5.
Gong et al., "Overmoded Shear Horizontal Wave MEMS Resonators Using X-Cut Lithium Niobate Thin Film," pp. 568-571, IEEE International Ultrasonics Symposium Proceedings, Sep. 3-6, 2014.
Gong, "An 880 Mhz Ladder Filter Formed By Arrays Of Laterally Vibrating Thin Film Lithium Niobate Resonators," pp. 1241-1244, MEMS 2014, San Francisco, CA, USA, Jan. 26-30, 2014.
Gong, "Design and Analysis of Lithium-Niobate-Based High Electromechanical Coupling RF-MEMS Resonators for Wideband Filtering," Gong, pp. 403-414, IEEE Transactions On Microwave Theory And Techniques, vol. 61, No. 1, Jan. 2013.
Gong, "Figure-of-Merit Enhancement for Laterally Vibrating Lithium Niobate MEMS Resonators," pp. 3888-3894, IEEE Transactions on Electron Devices, vol. 60, No. 11, Nov. 2013.
Gong, "GHz High-Q Lateral Overmoded Bulk Acoustic-Wave Resonators Using Epitaxial SiC Thin Film," pp. 253-255, Journal of Microelectromechanical Systems, vol. 21, No. 2, Apr. 2012.
Gong, "Monolithic Multi-Frequency Wideband RF Filters Using Two-Port Laterally Vibrating Lithium Niobate MEMS Resonators," pp. 1188-1197, Journal Of Microelectromechanical Systems, vol. 23, No. 5, Oct. 2014.
Hao et al., "An Analytical Study On Interfacial Dissipation In Piezoelectric Rectangular Block Resonators With In-Plane Longitudinal-Mode Vibrations," pp. 401-409, Sensors and Actuators, vol. 163, Issue 1, Sep. 2010.
Kadota, "5.4 GHz Lamb Wave Resonator on LiNbO3 Thin Crystal Plate and Its Application," pp. 1-5, Japanese Journal of Applied Physics 50 07HD11, The Japan Society of Applied Physics, Jul. 20, 2011.
Kaitila, "Review Of Wave Propagation In Baw Thin Film Devices Progress And Prospects," pp. 120-129, IEEE Ultrasonics Symposium, Oct. 28-31, 2007.
Kuo et al., "Micromachined Sapphire GHz Lateral Overtone Bulk Acoustic Resonators Transduced By Aluminum Nitride," pp. 27-30, MEMS 2012, Paris, France, Jan. 29, 2012-Feb. 2, 2012.
Kuznetsova, "Investigation of Acoustic Waves in Thin Plates of Lithium Niobate and Lithium Tantalate," pp. 322-328, IEEE Transactions on Ultrasonics, Ferroelecrics, and Frequency Control, vol. 48, No. 1, Jan. 2001.
Lakin et al., "Thin Film Bulk Acoustic Wave Filters for GPS," pp. 471-476, Ultrasonics Syposium, Proceedings, Oct. 20-23, 1992.
Lee, "Tunable Inter-Resonator Coupling Structure With Positive and Negative Values and Its Application to the Field-Programmable Filter Array (FPFA)," pp. 3389-3400, IEEE Transactions On Microwave Theory And Techniques, vol. 59, No. 12, Dec. 2011.
Liang et al., "Design And Fabrication Of Aluminum Nitride Lamb Wave Resonators Towards High Figure Of Merit For Intermediate Frequency Filter Applications," pp. 1-11, IOP Publishing, Journal of Micromechanics and Microengineering, Feb. 11, 2015.

(56) References Cited

OTHER PUBLICATIONS

Lin et al., "AlN/3C—SiC Composite Plate Enabling High-Frequency and High-Q Micromechanical Resonators," pp. 2722-2727, Wiley-VCH Verlag GmbH & Co. KGaA, Weinheim, Apr. 12, 2012.
Lu et al., "Study Of Thermal Nonlinearity In Lithium Niobate-Based Mems Resonators," pp. 1993-1996, Transducers 2015, Anchorage, Alaska, USA, Jun. 21-25, 2015.
Menendez, "Closed-Form Expressions for the Design of Ladder-Type FBAR Filters," pp. 657-659, IEEE Microwave and Wireless Components Letters, vol. 16, No. 12, Dec. 2006.
Nguyen, "MEMS-Based RF Channel Selection for True Software-Defined Cognitive Radio and Low-Power Sensor Communications," pp. 110-119, IEEE Communications Magazine, Apr. 2013.
Olsson et al., "A High Electromechanical Coupling Coefficient SH0 Lamb Wave Lithiumniobate Micromechanical Resonator And a Method For Fabrication," pp. 183-190, Sensors and Actuators A: Physical, vol. 209, Mar. 1, 2014.
Olsson III et al., "A Method for Attenuating the Spurious Responses of Aluminum Nitride Micromechanical Filters," pp. 1198-1207, Journal Of Microelectromechanical Systems, vol. 23, No. 5, Oct. 2014.
Olsson III et al., "Post-CMOS Compatible Aluminum Nitride MEMS Filters and Resonant Sensors," pp. 412-419, Frequency Control Symposium, 2007 Joint with the 21st European Frequency and Time Forum. IEEE International, May 2007.
Patterson et al., "Application Of Statistical Element Selection To 3D Integrated ALN MEMS Filters For Performance Correction And Yield Enhancement," pp. 996-999, MEMS 2015, Estoril, Portugal, Jan. 18-22, 2015.
Piazza et al., "Piezoelectric Aluminum Nitride Vibrating Contour-Mode MEMS Resonators," pp. 1406-1418, Journal of Microelectromechanical Systems, vol. 15, No. 6, Dec. 2006.
Piazza, "Single-Chip Multiple-Frequency ALN MEMS Filters Based on Contour-Mode Piezoelectric Resonators," pp. 319-328, Journal Of Microelectromechanical Systems, vol. 16, No. 2, Apr. 2007.
Pijolat, "Large Qxf Product for HBAR Using Smart Cut Transfer of LiNb0 Thin Layers Onto LiNb0 Substrate," pp. 201-204, IEEE International Ultrasonics Symposium Proceedings, Nov. 2-5, 2008.
Popa, "L-Band Lamb Mode Resonators in Gallium Nitride MMIC Technology," pp. 1-4, Frequency Control Symposium (FCS), 2014 IEEE International, May 19-22, 2014.
Pulskamp et al., "Piezoelectric PZT MEMS Technologies For Small-Scale Robotics And RF Applications," pp. 1062-1070, MRS Bulletin;Nov. 2012, vol. 37 Issue 11, p1062, Nov. 2012.
Rabiei, "Heterogeneous Lithium Niobate Photonics on Silicon Substrates," pp. 1-9, Optical Society of America, vol. 21, No. 21, Oct. 18, 2013.
Rinaldi et al, "Super-High-Frequency Two-Port AlN Contour-Mode Resonators for RF Applications," pp. 38-35, IEEE Transactions on Ultrasonics, Ferroelectrics, and Frequency Control, vol. 57, No. 1, Jan. 2010.
Ruby et al., "The Effect of Perimeter Geometry on FBAR Resonator Electrical Performance," pp. 217-220, Microwave Symposium Digest, 2005 IEEE MTT-S International, Jul. 2005.
Ruby et al., "Ultra-Miniature High-Q Filters and Duplexers Using FBAR Technology," pp. 1-3, 2001 IEEE International Solid-State Circuits Conference, Feb. 6, 2011.
Segovia-Fernandez et al., "Impact of Metal Electrodes on the Figure of Merit (kt2-Q) and Spurious Modes of Contour Mode AlN Resonators," pp. 299-302, IEEE International Ultrasonics Symposium Proceedings, Oct. 7-10, 2012.
Small et al., "Wafer-scale Packaging for FBAR-based Oscillators," pp. 1-4, Proceedings of the IEEE International Frequency Control Symposium and Exposition, May 1-5, 2011.
Smith et al., "Temperature Dependence of the Elastic, Piezoelectric, and Dielectric Constants of Lithium Tantalate and Lithium Niobate," pp. 1-13, Journal of Applied Physics, vol. 42, No. 2219, Dec. 2003.
Song et al., "Arraying SH0 Lithium Niobate Laterally Vibrating Resonators For Mitigation Of Higher Order Spurious Modes," pp. 111-114, MEMS 2016, Shanghai, China, Jan. 24-28, 2016.
Song et al., "Spurious Mode Suppression in SH0 Lithium Niobate Laterally Vibrating MEMS Resonators", 2015 IEEE International Electron Devices Meeting (IEDM), Dec. 7-9, 2015, Washington DC, pp. 18.5.1-18.5.4 (Year: 2015).
Song, "Analysis and Removal of Spurious Response in SH0 Lithium Niobate MEMS Resonators," pp. 2066-2073, IEEE Transactions On Electron Devices, vol. 63, No. 5, May 2016.
Thakar, "Acoustically Coupled Thickness-Mode AlN-on-Si Band-Pass Filters—Part II: Simulation and Analysis," pp. 2270-2277, IEEE Transactions on Ultrasonics, Ferroelectrics, and Frequency Control, vol. 59, No. 10, Oct. 2012.
Trai, "Versatile CMOS-MEMS Integrated Piezoelectric Platform," pp. 2248-2251, Transducers 2015, Anchorage, Alaska, USA, Jun. 21-25, 2015.
Wang, "Design and Fabrication of S0 Lamb-Wave Thin-Film Lithium Niobate Micromechanical Resonators," pp. 300-308, Journal Of Microelectromechanical Systems, vol. 24, No. 2, Apr. 2015.
Wu, "Piezoelectrically Transduced High-Q Silica Micro Resonators," pp. 122-125, MEMS 2013, Taipei, Taiwan, Jan. 20-24, 2013.
Zener, "Internal Friction in Solids," pp. 230-235, Physical Review, vol. 52, Aug. 1, 1937.
Zhang et al., "Transverse Mode Spurious Resonance Suppression in Lamb Wave MEMS Resonators: Theory, Modeling, and Experiment," pp. 3034-3041, IEEE Transactions On Electron Devices, vol. 62, No. 9, Sep. 2015.
Zuo et al., "Very high frequency channel-select MEMS filters based on self-coupled piezoelectric AlN contour-mode resonators," pp. 132-141, Sensors and Actuators A: Physical, vol. 160, Issues 1-2, May 2010.
Olsson III et al., "Origins and Mitigation of Spurious Modes in Aluminum Nitride Microresonators," pp. 1272-1276, IEEE International Ultrasonics Symposium Proceedings, Oct. 11-14, 2010.

* cited by examiner

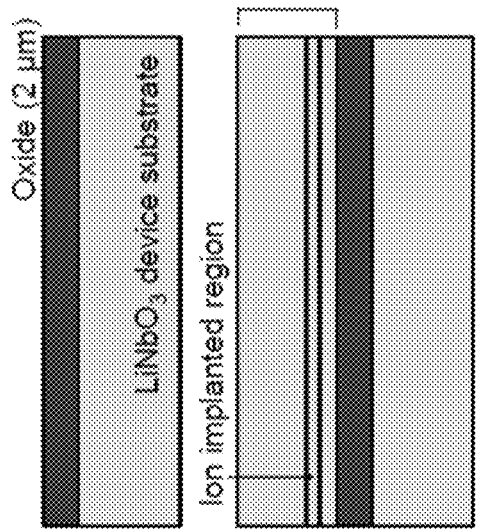
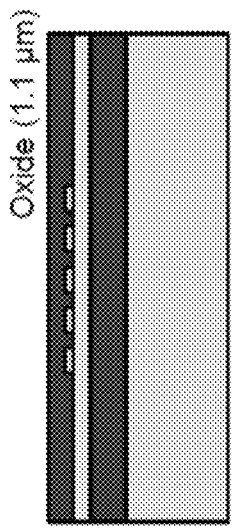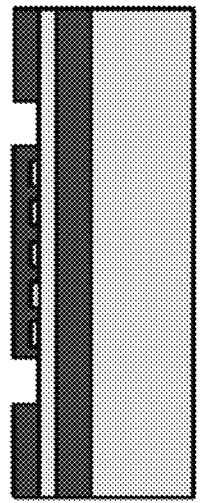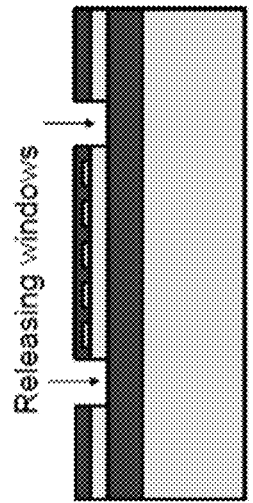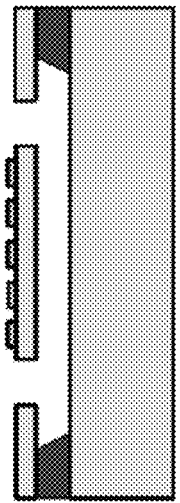
FIG. 4A  FIG. 4B  FIG. 4C  FIG. 4D
FIG. 4E  FIG. 4F  FIG. 4G  FIG. 4H

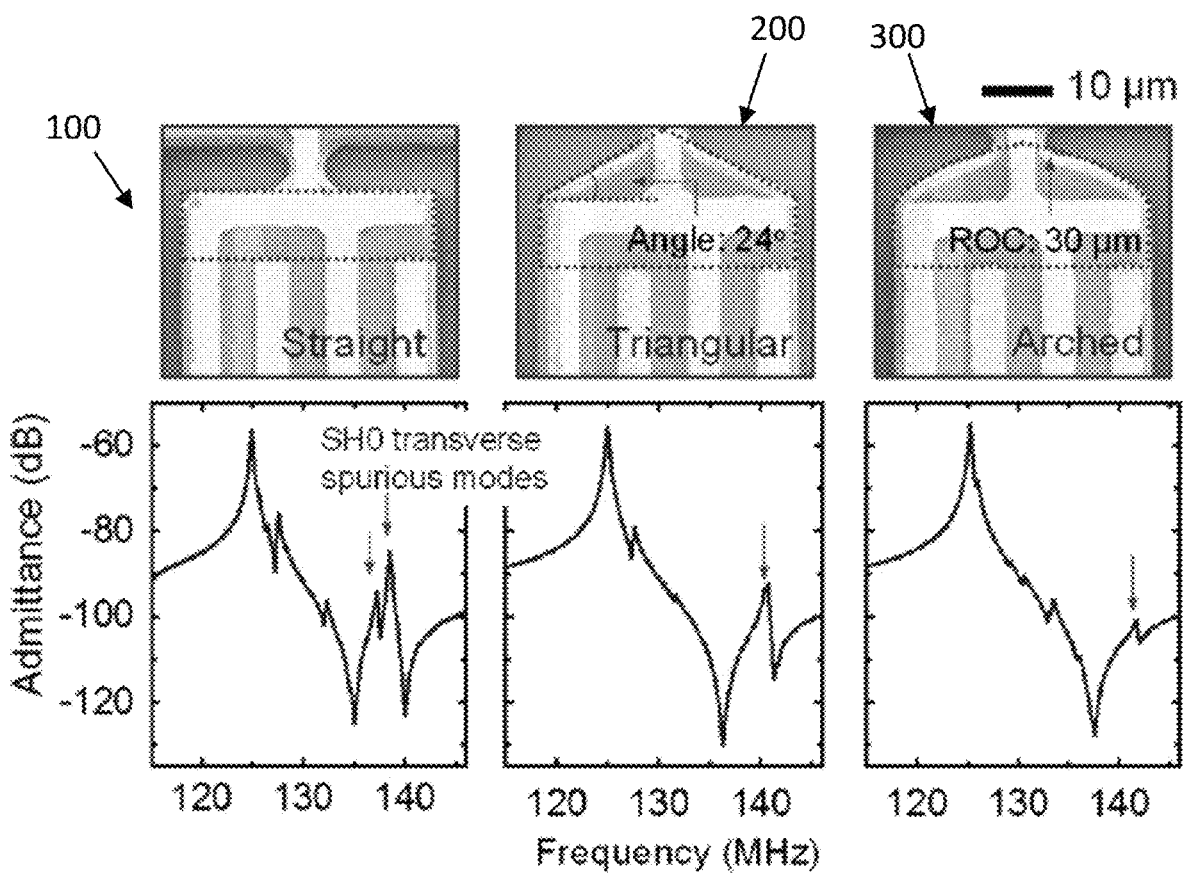
*FIG. 5A*  *FIG. 5B*  *FIG. 5C*
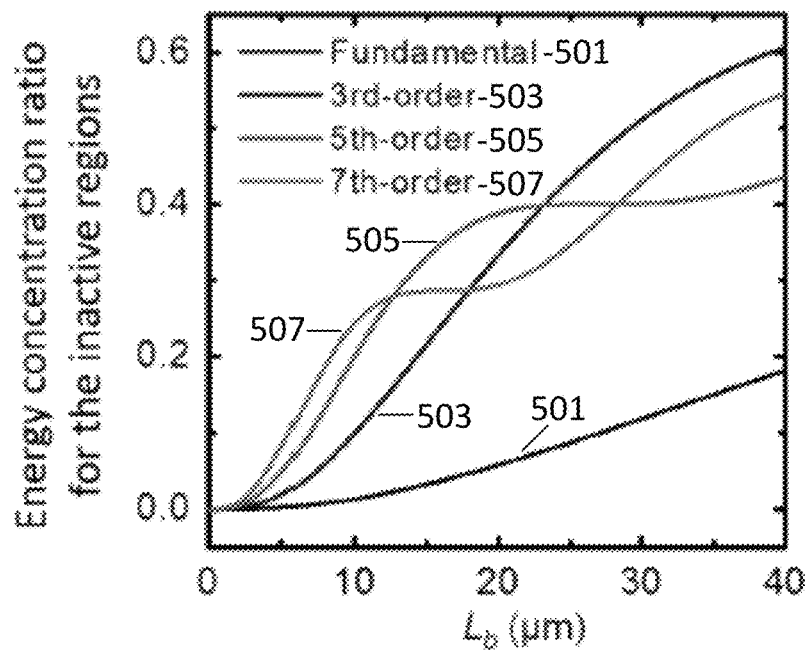
*FIG. 5D*

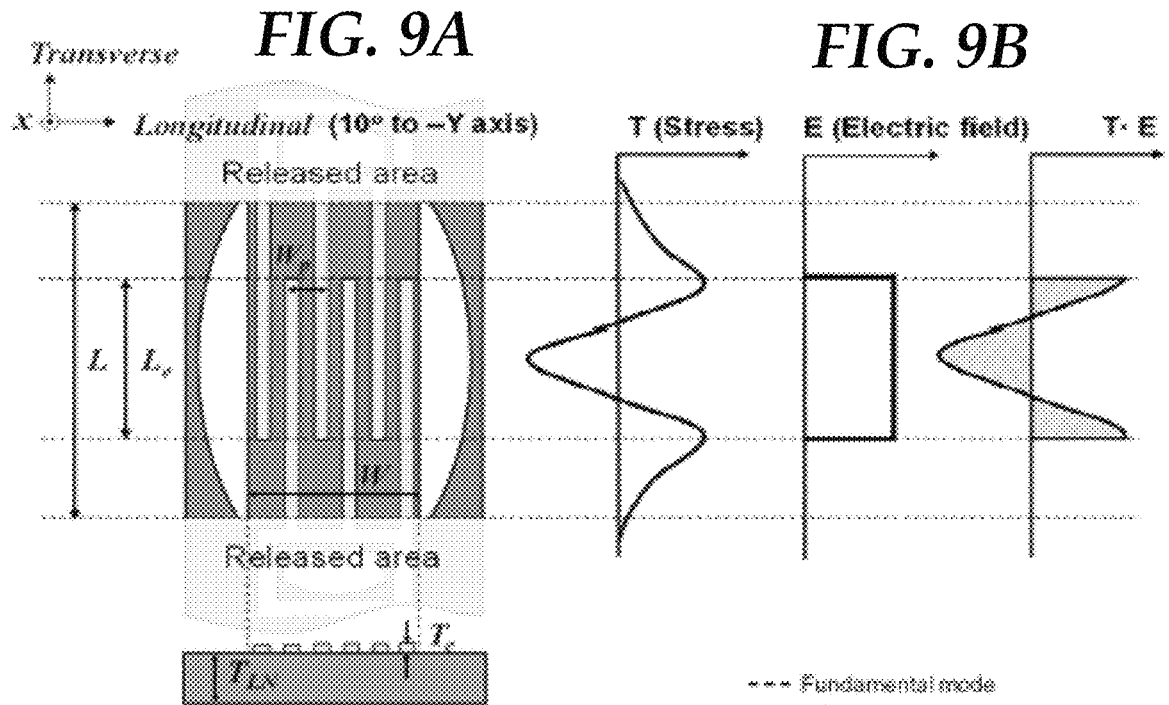
FIG. 9A  FIG. 9B
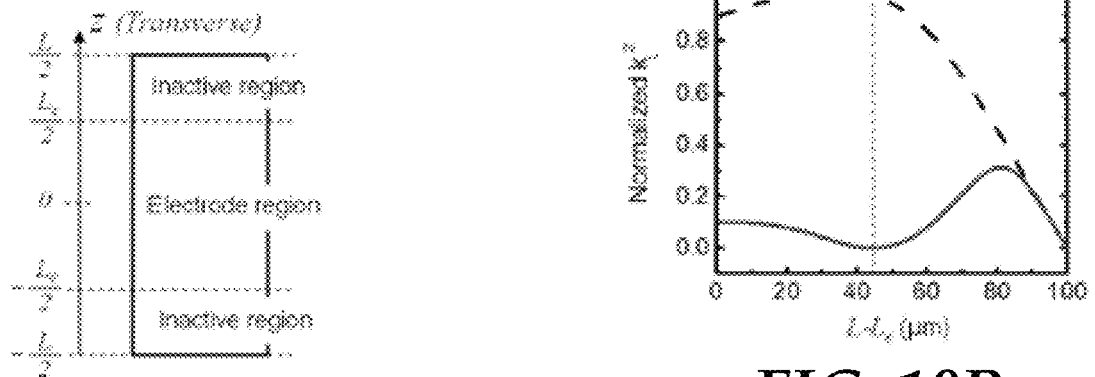
FIG. 10A  FIG. 10B
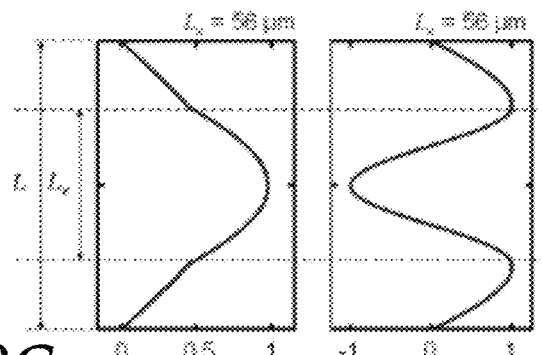
FIG. 10C  FIG. 10D

FIG. 11A
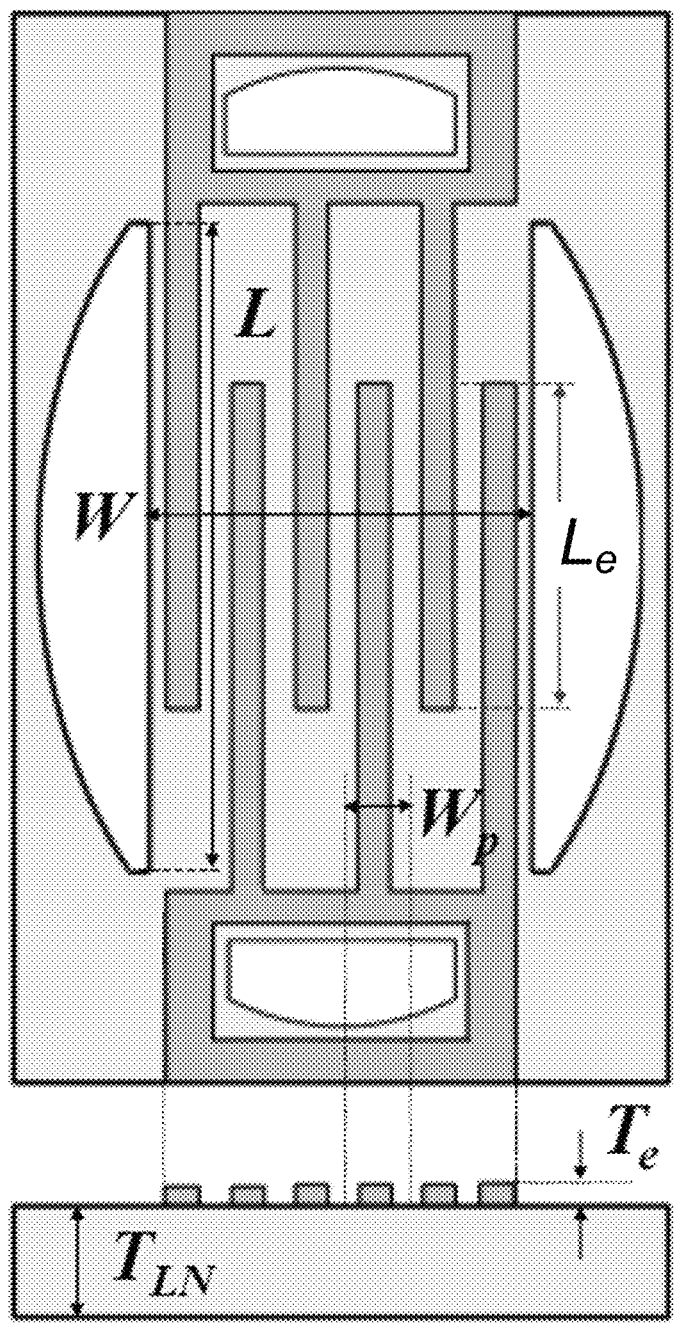
FIG. 11B
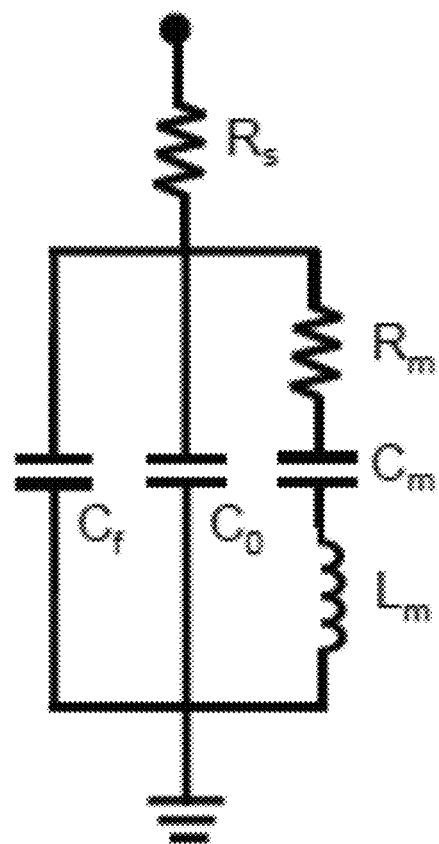
FIG. 11C

*FIG. 14A*
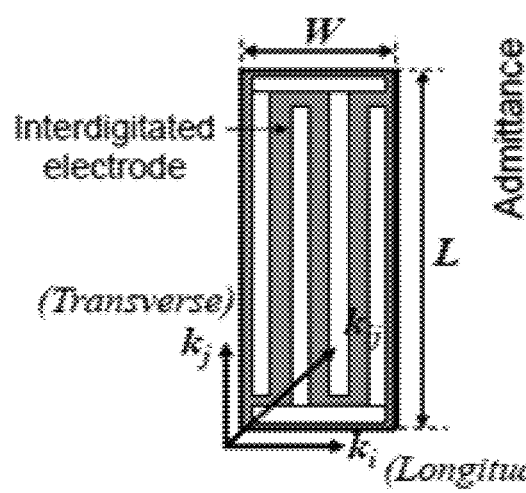
*FIG. 14B*
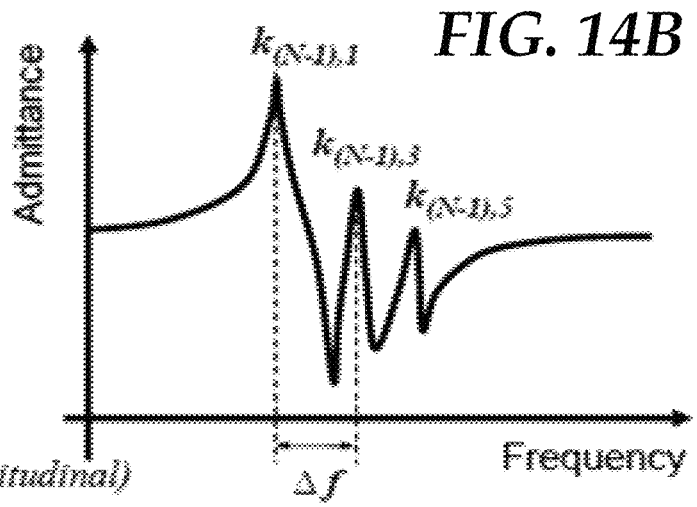
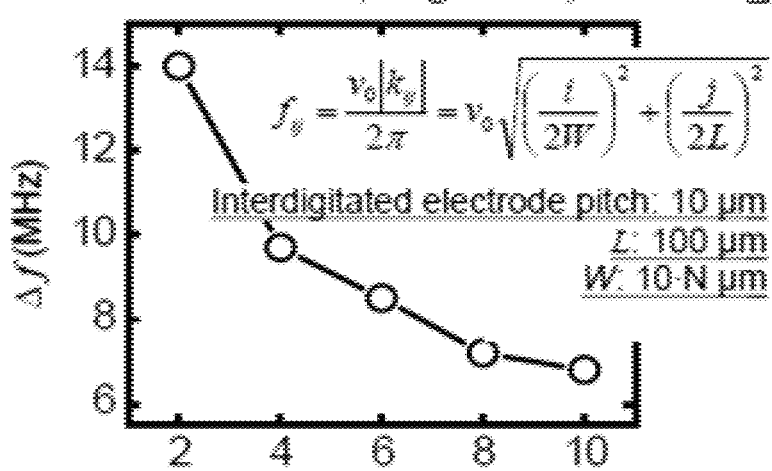
*FIG. 14C*
*FIG. 14D*

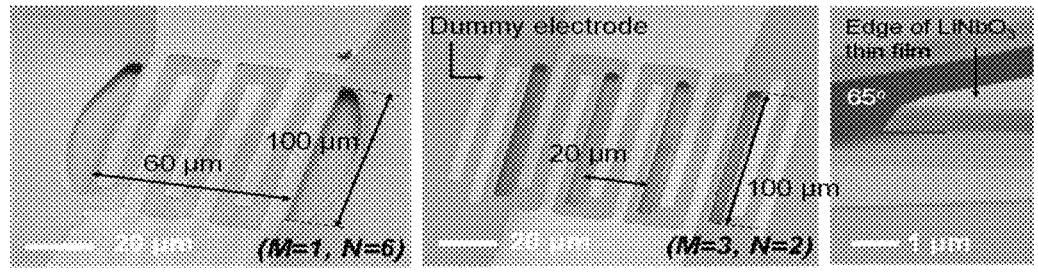
FIG. 15A  FIG. 15B  FIG. 15C
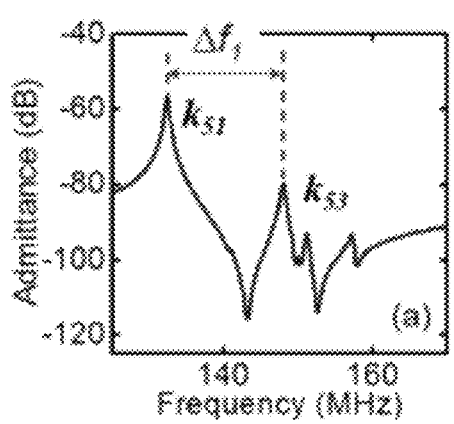 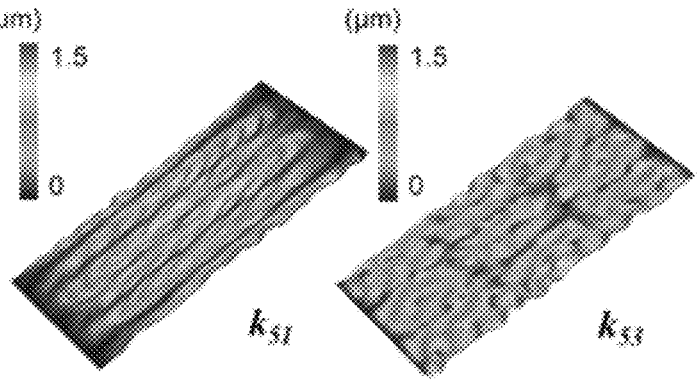
FIG. 16A  FIG. 16B  FIG. 16C
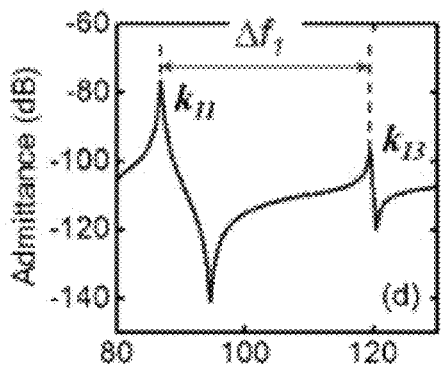 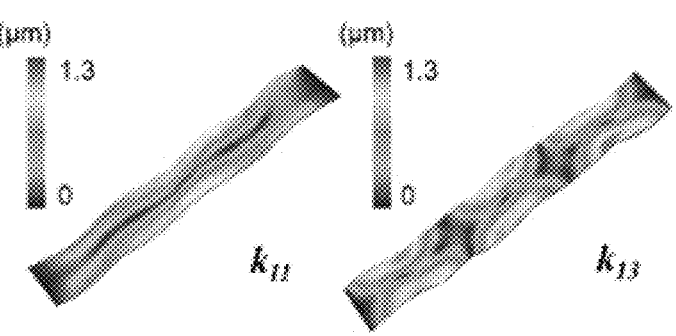
FIG. 16D  FIG. 16E  FIG. 16F

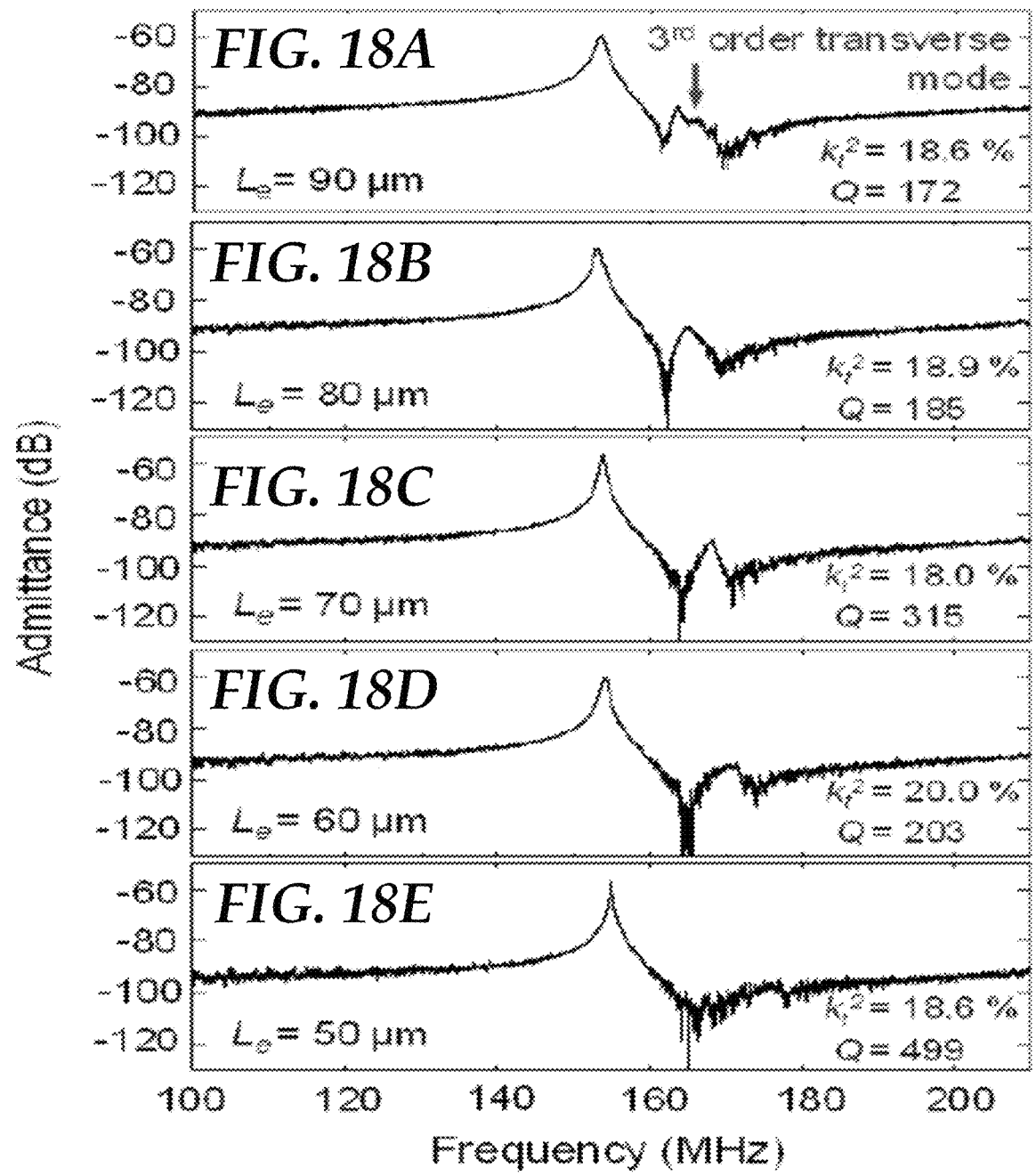

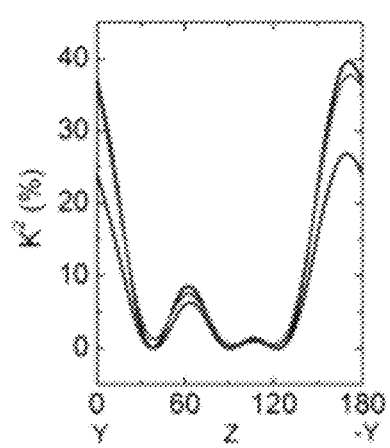
FIG. 19A
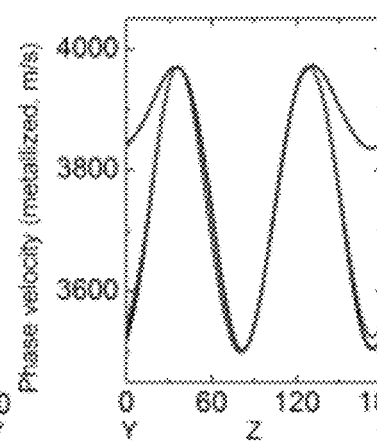
FIG. 19B
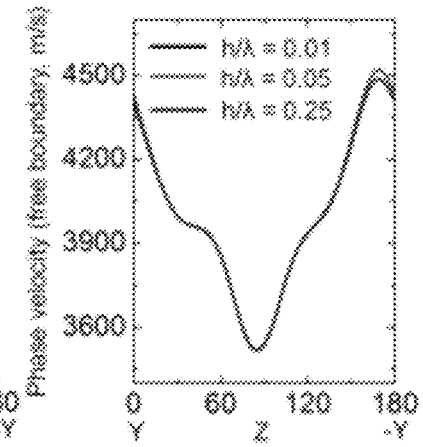
FIG. 19C
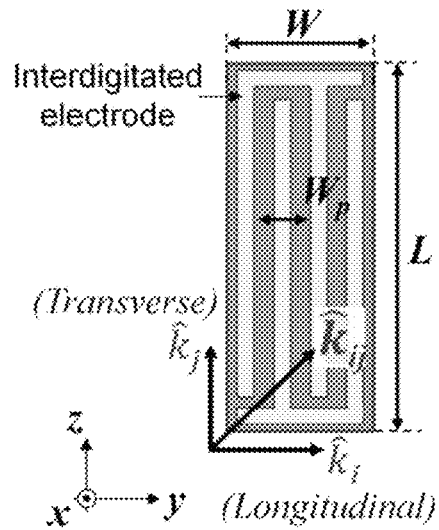
FIG. 20A
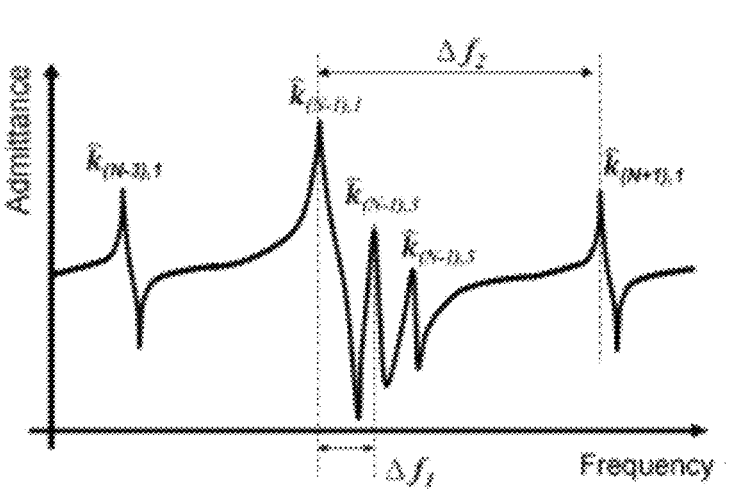
FIG. 20B
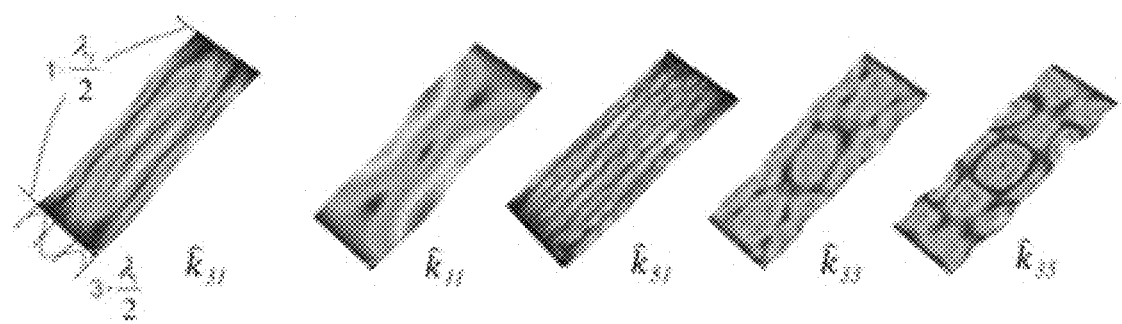
FIG. 20C                    FIG. 20D

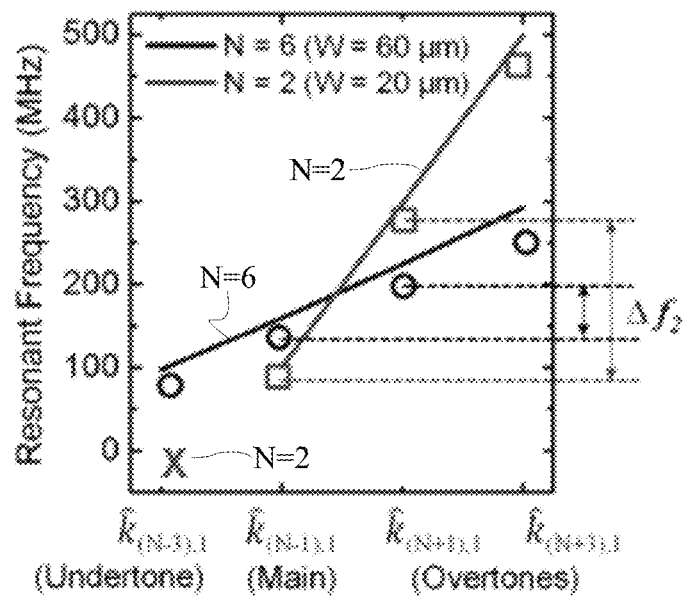
FIG. 21
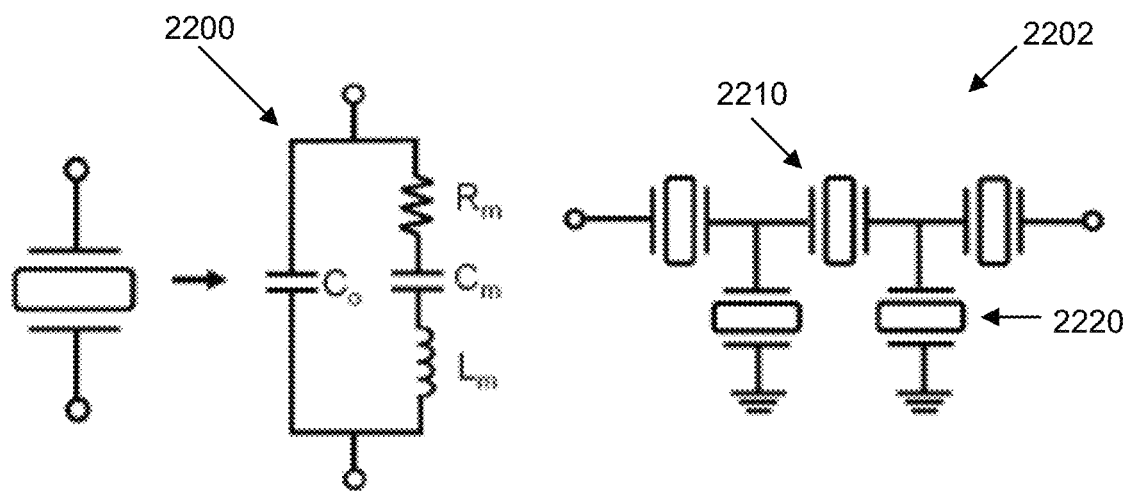
FIG. 22A  FIG. 22B

*FIG. 23A*      *FIG. 23C*
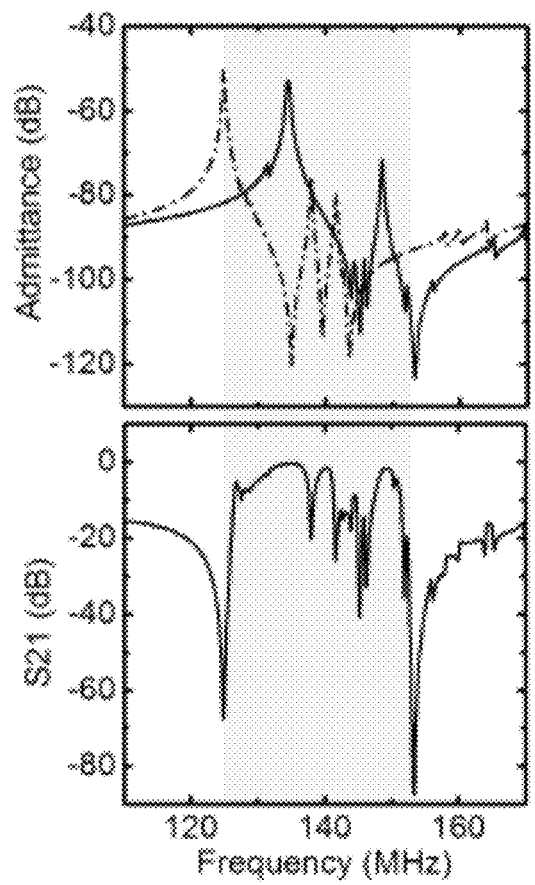
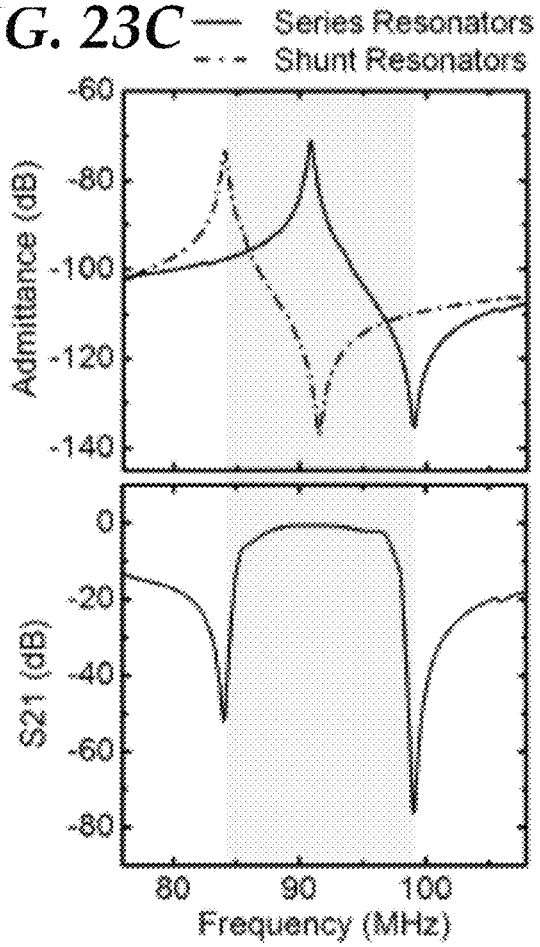
*FIG. 23B*      *FIG. 23D*
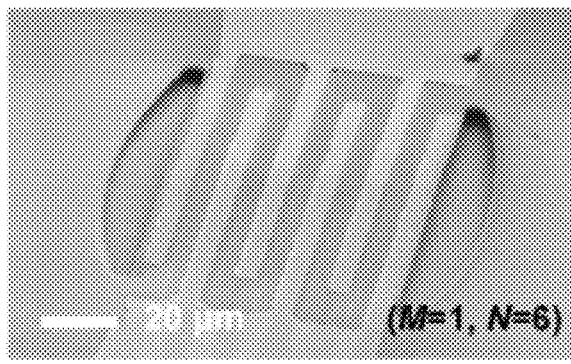
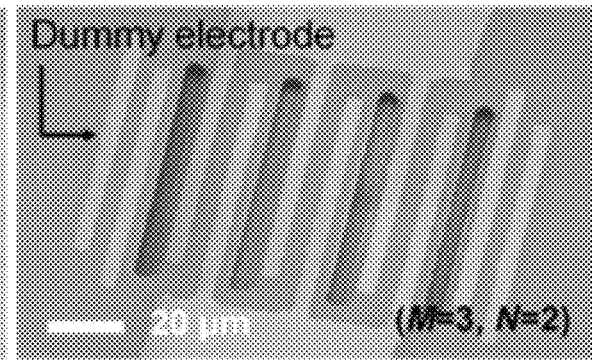
*FIG. 24A*      *FIG. 24B*

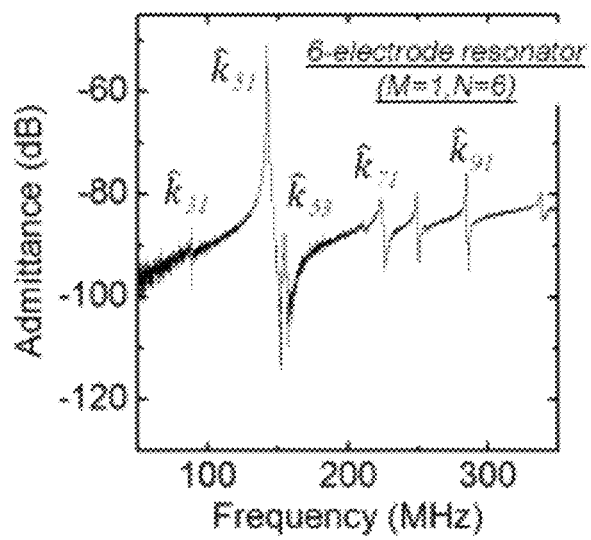
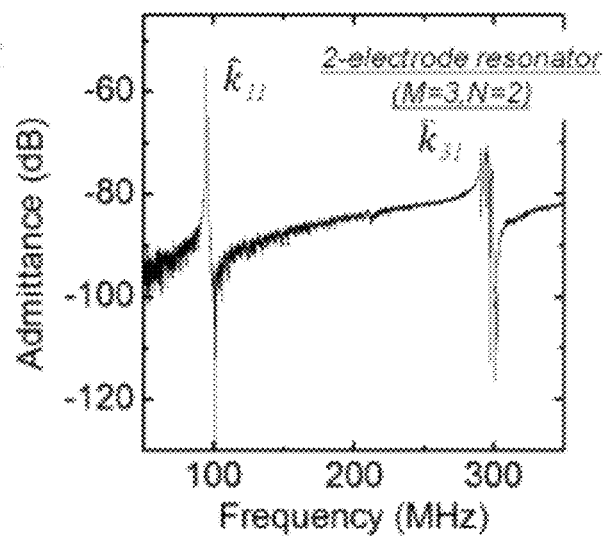
*FIG. 26A*  *FIG. 26B*

FIG. 28A
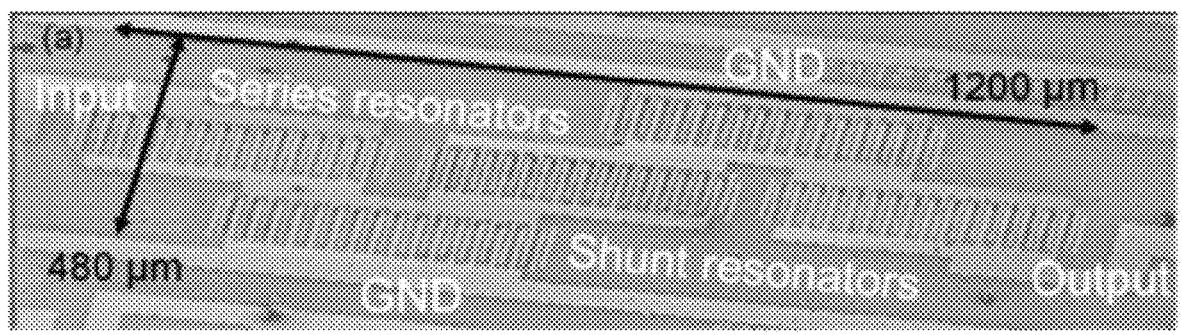
FIG. 28B
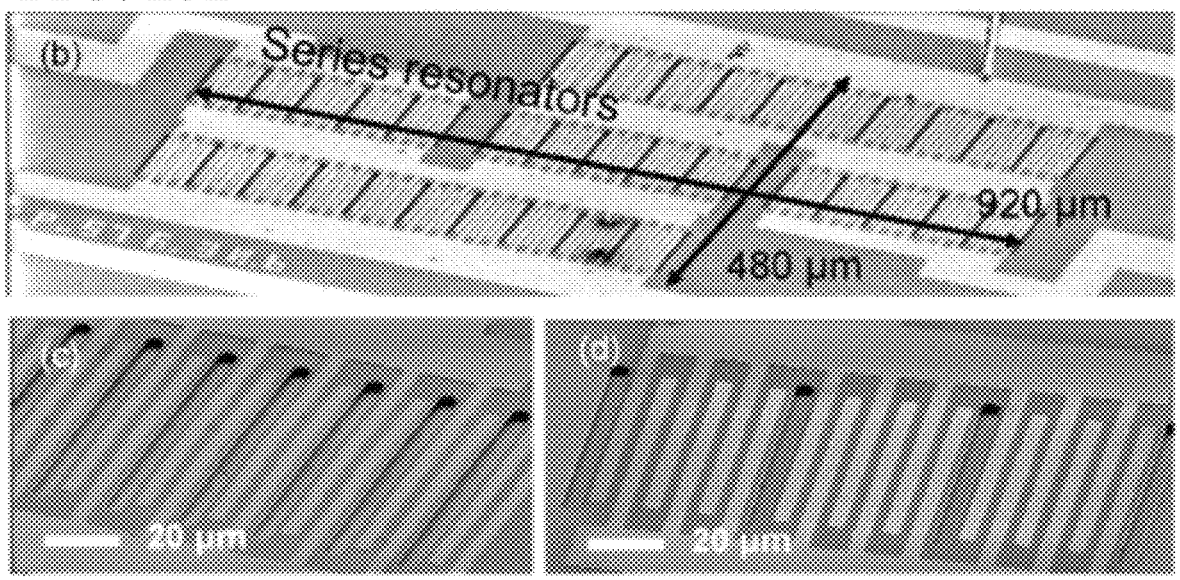
FIG. 28C      FIG. 28D

SPURIOUS-MODE-FREE, LATERALLY-VIBRATING MICROELECTROMECHANICAL SYSTEM RESONATORS

REFERENCE TO EARLIER FILED APPLICATION

This application is a continuation of U.S. application Ser. No. 15/434,829, filed Feb. 16, 2017, now U.S. Pat. No. 10,476,469, issued Nov. 12, 2019, which claims the benefit under 35 U.S.C. § 119(e) of U.S. Provisional Patent Application No. 62/296,176, filed Feb. 17, 2016, which are incorporated herein, in their entireties, by this reference.

FEDERALLY SPONSORED RESEARCH OR DEVELOPMENT

This disclosure was made with government support under N66001-14-1-4042 awarded by the Department of Defense. The government has certain rights in the invention.

BACKGROUND

Recently, piezoelectric laterally vibrating resonators (LVRs) have received a great deal of attention thanks to their small size, high quality factor (Q), low impedance, low cost integration with complementary metal-oxide semiconductor (CMOS) circuitry, and multiple operating frequencies on a single chip. Among the various piezoelectric material platforms, LVRs based on transferred Lithium Niobate (LiNbO$_3$) thin films are promising in meeting demanding specifications of next-generation radio frequency (RF) front-end duplexers, due to their capability to feature high electromechanical coupling ($k_t^2$) and high Q simultaneously for various acoustic modes over a wide frequency range. Among these acoustic modes, the shear horizontal (SH0) as well as the symmetrical (S0) modes have both been theoretically predicted and experimentally demonstrated in X-cut, LiNbO$_3$ LVRs with very large $k_t^2$, high Q, and a record-breaking figure of merit (FoM).

In spite of their strong potential, LiNbO$_3$ LVRs are still confronted with the bottleneck of having pronounced spurious modes. These spurious modes cause in-band ripples and out-of-band spurious response for the filters, obstructing the LiNbO$_3$ LVRs' deployment as a commercial solution for future radios. The spurious modes in LVRs typically originate from several sources, such as higher order symmetric overtones, asymmetric wave propagation, acoustic wave interaction with bus lines and anchors, and transversely guided standing waves. To overcome this bottleneck, numerous studies have focused on subduing the various spurious modes in the LVRs, especially for the Aluminum Nitride (AlN) devices. A weighted electrode design has also been reported to subdue the S0 mode overtones in LiNbO$_3$ LVRs. However, there has not yet been a report addressing the suppression of transverse spurious modes in LiNbO$_3$ LVRs. In comparison to other LiNbO$_3$ LVRs with various high $k_t^2$ modes, the SH0 devices have been demonstrated to feature fewer spurious modes. Nonetheless, SH0 devices are still prone to transverse spurious modes owing to the high intrinsic $k_t^2$ of LiNbO$_3$.

BRIEF DESCRIPTION OF THE DRAWINGS

A more particular description of the disclosure briefly described above will be rendered by reference to the appended drawings. Understanding that these drawings only provide information concerning typical embodiments and are not therefore to be considered limiting of its scope, the disclosure will be described and explained with additional specificity and detail through the use of the accompanying drawings.

FIGS. 4A, 4B, 4C, 4D, 4E, 4F, 4G, and 4H are a set of diagrams illustrating a fabrication process for LiNbO$_3$ micro-resonators, according to embodiments of the present disclosure.

FIGS. 5A, 5B, and 5C are SEM images and corresponding graphs illustrating simulated admittance responses for micro-resonator devices with straight, triangular, and arched edges, respectively, according to embodiments of the present disclosure.

FIG. 5D is a graph illustrating energy dispersion into the inactive regions of the micro-resonator as a function of the length of the inactive regions.

FIG. 9A is a schematic illustration of a micro-resonator device with length-controlled electrode configuration, according to embodiments of the present disclosure.

FIG. 9B is a graph illustrating a simplified distribution of the stress and electric fields along the transverse direction for the third order transverse mode of the micro-resonator device of FIG. 17A, according to embodiments of the present disclosure.

FIG. 10A is graph illustrating the geometry of a prototype micro-resonator device with one transverse dimension (z), according to embodiments of the present disclosure.

FIG. 10B is a graph illustrating normalized $k_t^2$ (to the maximum) for the fundamental and third order transverse modes with respect to the $(L-L_e)$ for the $LiNbO_3$ micro-resonator, according to embodiments of the present disclosure.

FIGS. 10C and 10D are graphs illustrating stress field profiles of fundamental and third order modes at the optimal $L_e$, respectively, according to embodiments of the present disclosure.

FIGS. 11A and 11B are, respectively, a top and side view of a $LiNbO_3$ micro-resonator with a length-controlled electrode configuration, illustrating various design parameters, according to embodiments of the present disclosure.

FIG. 11C is a circuit diagram of the MBVD model representing the micro-resonator behavior in the electrical domain.

FIG. 14A is a schematic diagram illustrating wave vectors in a resonant cavity of a micro-resonator device with four top interdigitated electrodes, according to embodiments of the present disclosure.

FIG. 14B is a graph illustrating an admittance response of a spurious mode plagued micro-resonator where i and j indicate mode orders in the longitudinal and transverse directions, respectively, according to embodiments of the present disclosure.

FIG. 14C is a graph illustrating spectral spacing (Δf) between the fundamental and third order transverse modes with respect to the number of the interdigitated electrodes, according to embodiments of the present disclosure.

FIG. 14D is a table illustrating estimated resonant frequencies for $f_{ij}$ of FIG. 11C, according to embodiments of the present disclosure.

FIGS. 15A, 15B, and 15C are SEM images of the fabricated $LiNbO_3$ SH0 devices showing a traditional micro-resonator, a micro-resonator array, and a zoomed-in view of a micro-resonator sidewall, respectively, according to embodiments of the present disclosure.

FIGS. 16A, 16B, 16C, 16D, 16E, and 16F are graphs and images illustrating simulated admittance response and displacement mode shapes of the fundamental and third order transverse modes for the disclosed resonant devices with six interdigitated electrodes (FIGS. 16A-16C) and two interdigitated electrodes (FIGS. 16D-16F), according to embodiments of the present disclosure.

FIGS. 18A, 18B, 18C, 18D, and 18E illustrate measured admittance response of micro-resonators (at an orientation of 20 to −Y axis) for different overlapping lengths of the interdigitated electrodes ($L_e$), according to embodiments of the present disclosure.

FIG. 19A is graph illustrating simulated $K^2$ of the SH0 mode in an X-cut $LiNbO_3$ plate at various orientations, according to embodiments of the present disclosure.

FIG. 19B is a graph illustrating simulated phase velocities of SH0 mode in an X-cut $LiNbO_3$ plate with a metallized top surface, according to embodiments of the present disclosure.

FIG. 19C is a graph illustrating simulated phase velocities of SH0 mode in an X-cut $LiNbO_3$ plate with free boundary conditions, according to embodiments of the present disclosure where h denotes the thickness of the $LiNbO_3$ plate and $\lambda$ is the wavelength, according to embodiments of the present disclosure.

FIG. 20A is a schematic diagram illustrating wave vectors in a resonant cavity of a micro-resonator device with four top interdigitated electrodes, according to embodiments of the present disclosure.

FIG. 20B is a graph illustrating admittance response of a spurious-mode-plagued micro-resonator with N top electrodes.

FIGS. 20C and 20D are displacement mode shapes of a fundamental mode and a lateral spurious mode, respectively, with a four top electrode configuration of FIG. 11A, according to embodiments of the present disclosure.

FIG. 21 is a graph illustrating calculated (line) and simulated (symbol) resonant frequencies of the intended and longitudinal modes for resonate devices with the six- and two-electrode configurations, according to embodiments of the present disclosure.

FIG. 22A is a schematic diagram illustrating a lumped equivalent circuit model of a one-port micro-resonator, according to an embodiment of the present disclosure.

FIG. 22B is a schematic diagram of a ladder filter topology made up of three series and two shunt branch micro-resonators, according to an embodiment of the present disclosure, according to embodiments of the present disclosure.

FIGS. 23A, 23B, 23C, 23D are graphs illustrating simulated admittance responses (FIGS. 23A, 23C) and S21 responses (FIGS. 23B, 23D) of the single series and shunt micro-resonators of FIG. 22B for a six-electrode micro-resonator design (FIGS. 23A-23B) and two-electrode micro-resonator design (FIGS. 23C-23D), according to embodiments of the present disclosure.

FIGS. 24A, 24B are SEM images of the fabricated $LiNbO_3$ SH0 devices illustrating the traditional six-electrode micro-resonator and two-electrode micro-resonator array, respectively, according to an embodiment of the present disclosure.

FIG. 26A is a graph illustrating measured admittance response of the traditional one-port micro-resonator (M=1, N=6), according to embodiments of the present disclosure.

FIG. 26B is a graph illustrating measured admittance response of a micro-resonator array with three single devices (M=3, N=2) over a wide frequency range, according to embodiments of the present disclosure.

FIGS. 28A and 28B are SEM images of the fabricated SH0 ladder filters made up of two-electrode and six-electrode micro-resonator arrays, respectively, according to embodiments of the present disclosure.

FIGS. 28C and 28D are SEM images of zoomed-in views of the two-electrode and six-electrode micro-resonator arrays in the ladder filters of FIGS. 28A and 28B, respectively, according to embodiments of the present disclosure.

DETAILED DESCRIPTION

Disclosed are various microelectromechanical (MEMS) resonator devices (hereinafter "micro-resonator devices") adapted for radio frequency (RF) filters (and other similar uses) for which higher order transverse spurious modes are removed or almost entirely removed. In various embodiments of the present disclosure, the micro-resonator devices may be adapted with a length-controlled electrode configuration in which interdigitated fingers of opposing electrodes have less overlap than seen in traditional micro-resonator devices. The overlapping length between adjacent interdigitated fingers may be modified to achieve a response free, or substantially-free, of spurious resonances. The overlapping distance may change in various embodiments, such as being less than seven-tenths the length of a set of fingers, but greater than from one-tenth to three-tenths the length of the set of fingers.

The disclosed micro-resonator devices may be formed on top of a piezoelectric plate made out of a thin film of a material such as Lithium Niobate ($LiNbO_3$). A cavity may be defined within a bulk substrate positioned below the piezoelectric plate to help to further dissipate the higher order transverse spurious modes. In various embodiments, at least one of the first end or the second end of the piezoelectric plate defines a triangular shape or a curved shape to effectively scatter dispersed higher order acoustic energy in one or more inactive regions of the micro-resonator device. If a triangular shape, an angle of the triangular shape with respect to an axis formed by a conductive bus, connected to the at least one of the first end or the second end, may be between about one degree and 75 degrees.

The Figures described below reference they and z axes for illustrative purposes only. The z axis may sometimes be referred to as a transverse direction. They axis may sometimes be referred to as a longitudinal direction. Further, the electrodes are shown generally straight along their longitudinal axes, although the electrodes can be curved, i.e., have arced contours, be angled, or have other geometries, depending on the desired implementation.

Figure 1:
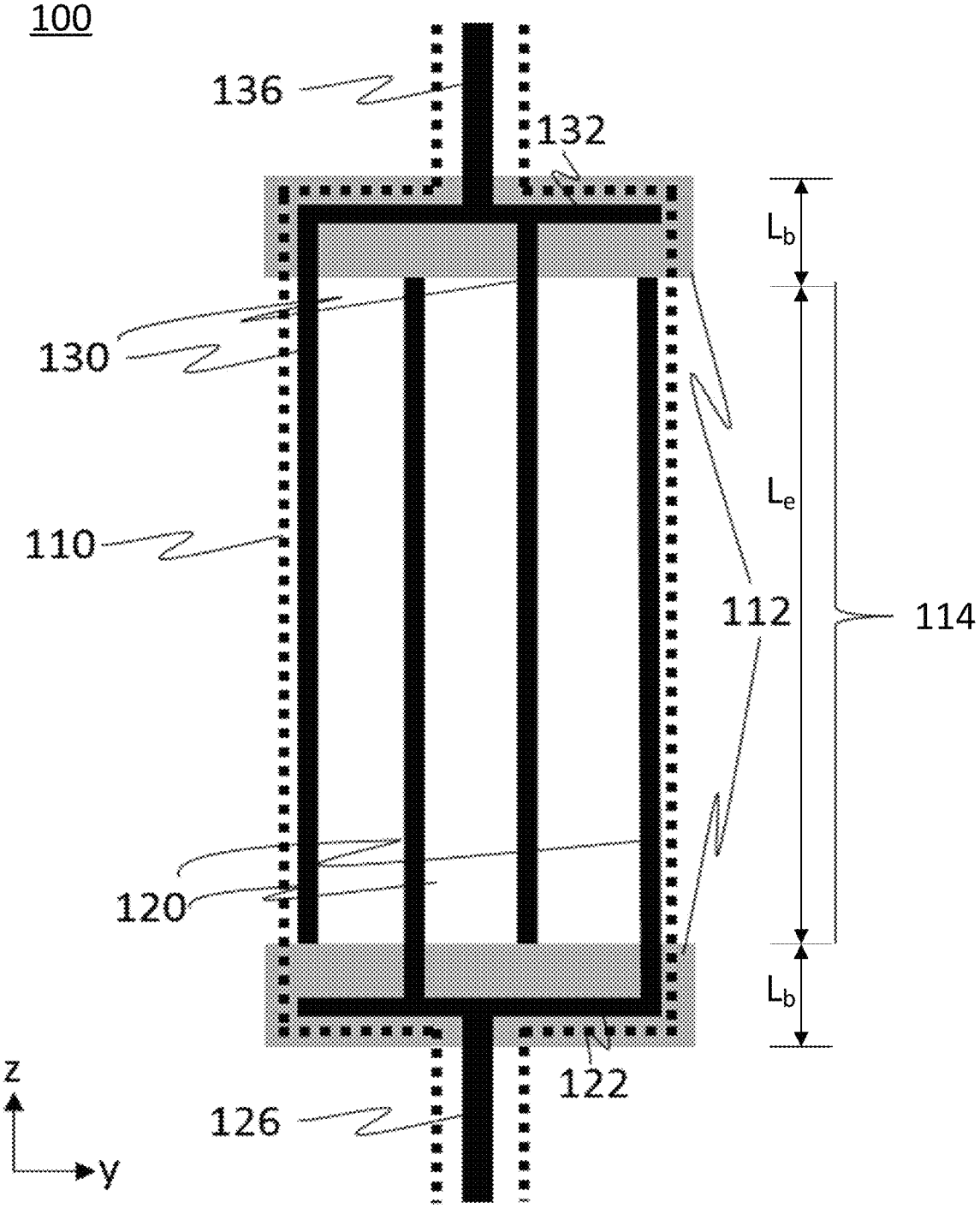
FIG. 1 is a schematic diagram illustrating a laterally-vibrating micro-resonator, according to embodiments of the present disclosure.

Elongated portions of electrodes having any of these various shapes are sometimes referred to herein as "fingers." In figures referenced herein, the pattern of interdigitated electrodes in a conductive layer is periodic in one direction, for instance, along the z-axis of FIG. 1. As illustrated, the periodic arrangement of electrodes includes alternating areas of metal, representing electrode regions, and space regions, e.g., areas without metal. Such space regions between the electrodes are also referred to herein as "spaces." These electrode fingers that are interdigitated may be referred to as interdigitated electrodes (IDE). In various implementations, the areas of metal and the spaces have the same width, the areas of metal are wider than the spaces, the areas of metal are narrower than the spaces, or any other appropriate relation between the metal widths and spaces. The finger width of the LVRs, a parameter based on a combination of electrode width and spacing can be adjusted to control one or more resonant frequencies of the structure. For instance, a first finger width in a conductive layer can correspond to a first resonant frequency of the LVR, and a second finger width in the conductive layer can provide a different second resonant frequency of the LVR.

The present disclosure provides improved devices incorporating a spurious mode suppression technique for the shear horizontal (SH0) mode Lithium Niobate ($LiNbO_3$) laterally vibrating micro-resonators (LVRs). The devices may utilize triangular and arched edge shapes on the transversal sides of a resonant cavity to effectively distribute and scatter the acoustic waves in the inactive regions, yielding the suppression of transverse spurious modes. Two-dimensional (2D) models and three-dimensional (3D) finite element analysis (FEA) were employed to theoretically verify the technique. For devices with arched-shape edges, complete removal of higher-order transverse modes has been experimentally demonstrated with two-times enhancement for quality factor (Q). The Q enhancement arises from the improved concentration of mechanical energy under the interdigitated transducers. The fabricated micro-resonator device exhibits a Q of 920, a large electromechanical coupling ($k_t^2$) of 17.8%, and a figure of merit of 164.

The disclosed implementations include examples of structures and configurations of micro-resonator devices, such as piezoelectric micro-resonators. Electrodes are generally disposed in contact with or in proximity to a piezoelectric material. For instance, the electrodes can be located on the same surface or on opposite surfaces of a layer of the piezoelectric material. An electric field applied between electrodes is transduced into a mechanical strain in the piezoelectric material. For instance, a time-varying electrical signal can be provided to an input electrode of the LVR and transduced to a corresponding time-varying mechanical motion. A portion of this mechanical energy can be transferred back to electrical energy at the input electrode or at a separate output electrode. The frequency of the input electrical signal that produces the greatest substantial amplification of the mechanical displacement in the piezoelectric material is generally referred to as a resonant frequency of the piezoelectric micro-resonator.

The piezoelectric materials that can be used in fabrication of the piezoelectric layers of electromechanical systems micro-resonators disclosed herein include, but not limited to, aluminum nitride (AlN), zinc oxide, gallium arsenide, aluminum gallium arsenide, gallium nitride, quartz and other piezoelectric materials such as zinc-sulfide, zinc oxide, cadmium-sulfide, lithium tantalate, lithium niobate, lead zirconate titanate, members of the lead lanthanum zirconate titanate family, doped aluminum nitride (AlN:Sc), AlN-on-Silica, AlN-on-Sapphire/SiC, and combinations thereof.

The electrodes may be made of various conductive materials including, but not limited to, platinum, aluminum, molybdenum, tungsten, titanium, niobium, ruthenium, chromium, doped polycrystalline silicon, doped AlGaAs compounds, gold, copper, silver, tantalum, cobalt, nickel, palladium, silicon germanium, doped conductive zinc oxide, and combinations thereof. In various implementations, the metal electrodes can include the same conductive materials or different conductive materials.

A person having ordinary skill in the art will readily appreciate the terms "upper" and "lower" are sometimes used for ease of describing the Figures, and indicate relative positions corresponding to the orientation of the figure on a properly oriented page, and may not reflect any exact orientation of the laterally-vibrating micro-resonator, as implemented.

The LVR structure can be driven into resonance by applying a harmonic electric potential that varies in time across the patterned conductive layers. The layout and interconnectivity of the periodic electrodes transduce the desired mode of vibration while suppressing the response of undesired spurious modes of vibration of the structure. For example, a specific higher order vibrational mode can be transduced without substantially transducing other modes. Compared to its response to a constant DC electric potential, the amplitude of the mechanical response of the micro-resonator is multiplied by the Q factor (the typical Q factor is on the order of 500 to 5000). Engineering the total width of the micro-resonator structure and the number of electrode periods provides control over the impedance of the micro-resonator structure by scaling the amount of charge generated by the motion of the piezoelectric material.

In the present implementations, the resonant frequency of an LVR can be directly controlled by setting the finger width. For instance, the resonant frequency is generally lowered as the finger width increases, and vice versa. The total width, length, and thickness of the micro-resonator structure are parameters that also can be designated to optimize performance. In some LVR implementations, the finger width of the micro-resonator is the main parameter that is controlled to adjust the resonant frequency of the structure, while the total width multiplied by the total length of the micro-resonator (total area) can be set to control the impedance of the micro-resonator structure.

The pass band frequency can be determined by the layout of the micro-resonator structure, as can the terminal impedance. For example, by changing the shape, size and number of electrodes, the terminal impedance can be adjusted. In some examples, longer fingers along the z-axis of FIG. 1 yield smaller impedance. This, in turn, is inversely proportional to the capacitance of the LVR. The resonant frequencies of the LVR structures described herein are generally insensitive to the fabrication process, to the extent that the piezoelectric thickness and thicknesses of the conductive layers do not significantly impact the frequency. The impedance and the frequency can be controlled independently, since the length and the width/spacing of electrodes are in perpendicular directions.

In other implementations, overlapping length of adjacent electrodes may modify the presence of stress and electric field distribution in the micro-resonator body, enabling near zero electromechanical coupling coefficient ($k_t^2$) of the higher order transverse spurious modes. The overlapping may be applied for different center frequencies by modifying the electrode design without additional fabrication steps.

The traditional $LiNbO_3$ LVR consists of a main body and at least one anchor. The main body of the LVR is a suspended $LiNbO_3$ plate (e.g., piezoelectric plate) with top inter-digitated electrodes (IDEs) that are alternatingly connected to the input signal and ground. The mechanically suspended resonant cavity may confine acoustic energy and attain high Q. The mechanical suspension is accomplished by extending an anchor between a base material and the $LiNbO_3$ plate. The anchor is sometimes referred to as a "tether." The anchor may be made up of the same material as the micro-resonator plate.

Multiple resonant frequencies can be attained monolithically as the center frequency of LVRs is lithographically set by the pitch of the metal electrodes. The micro-resonator can be divided into two major parts: the electrode region that contains the IDEs and the inactive regions that include bus lines and areas uncovered by electrodes. The inactive regions can be visualized as the shaded rectangular areas at either end of the micro-resonator displayed in FIG. 1, which illustrates a traditional laterally vibrating micro-resonator (LVR) 100.

In operation, the IDEs are alternatingly connected to the signal and ground, inducing time-varying electric field in the piezoelectric layer. Through piezoelectric coupling coefficients and bounded by the four sides of the micro-resonator body, the electromagnetic field produces acoustic standing waves in the micro-resonator cavity along both the longitudinal and transverse directions. The intended resonances of LVRs are manifested by the longitudinal SH0 acoustic standing waves. For this reason, the orientation of SH0 devices within the piezoelectric crystal, such as $LiNbO_3$ crystal, may be modified to achieve larger $k_t^2$ for SH0 mode vibration. For example, the orientation of SH0 may be selected to be 10° to −Y axis in the X-cut plane of the base material because this orientation has been shown to feature the largest $k_t^2$ for SH0 mode vibration. The −Y axis of the crystal should not be confused with the orientation given in the present Figures. The capital letter "Y" with reference to axis refers to the orientation of the base material, such as $LiNbO_3$ crystal, and it is determined by the material properties of the base material. On the other hand, the lower letter "y" axis is arbitrarily chosen to represent the longitudinal direction of the LVR. In the example implementations provided below, the orientation of the longitudinal axis of the micro-resonator is selected to be 10° to −Y axis in the X-cut plane of the base material. The resonant frequency of SH0 mode may be set by the pitch of the metal electrodes. Therefore, multiple resonant frequencies can be lithographically defined on the same substrate.

Figure 2:
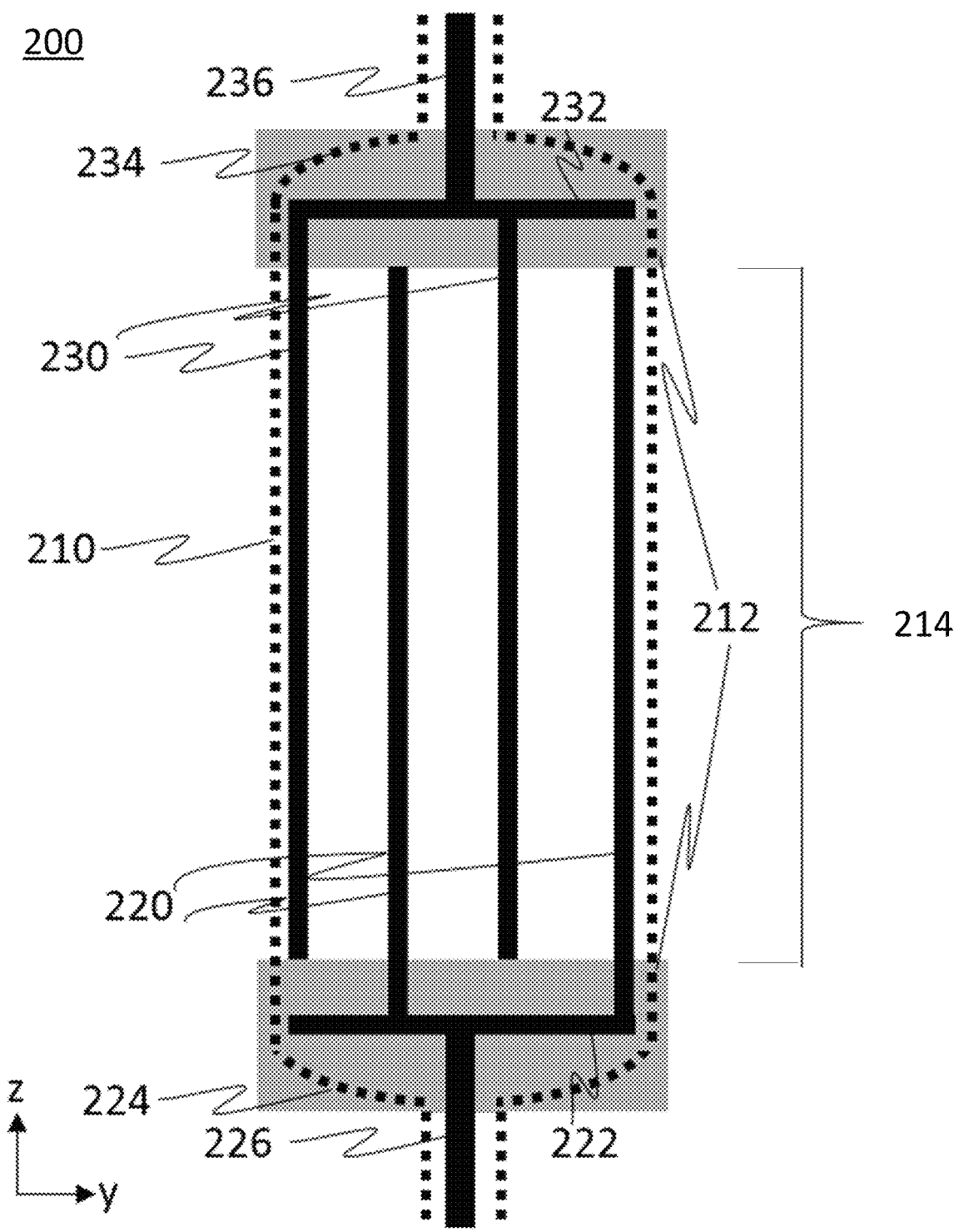
FIG. 2 is a schematic diagram illustrating the embodiment of a laterally-vibrating micro-resonator with curved transverse boundaries, according to embodiments of the present disclosure.
Figure 3:
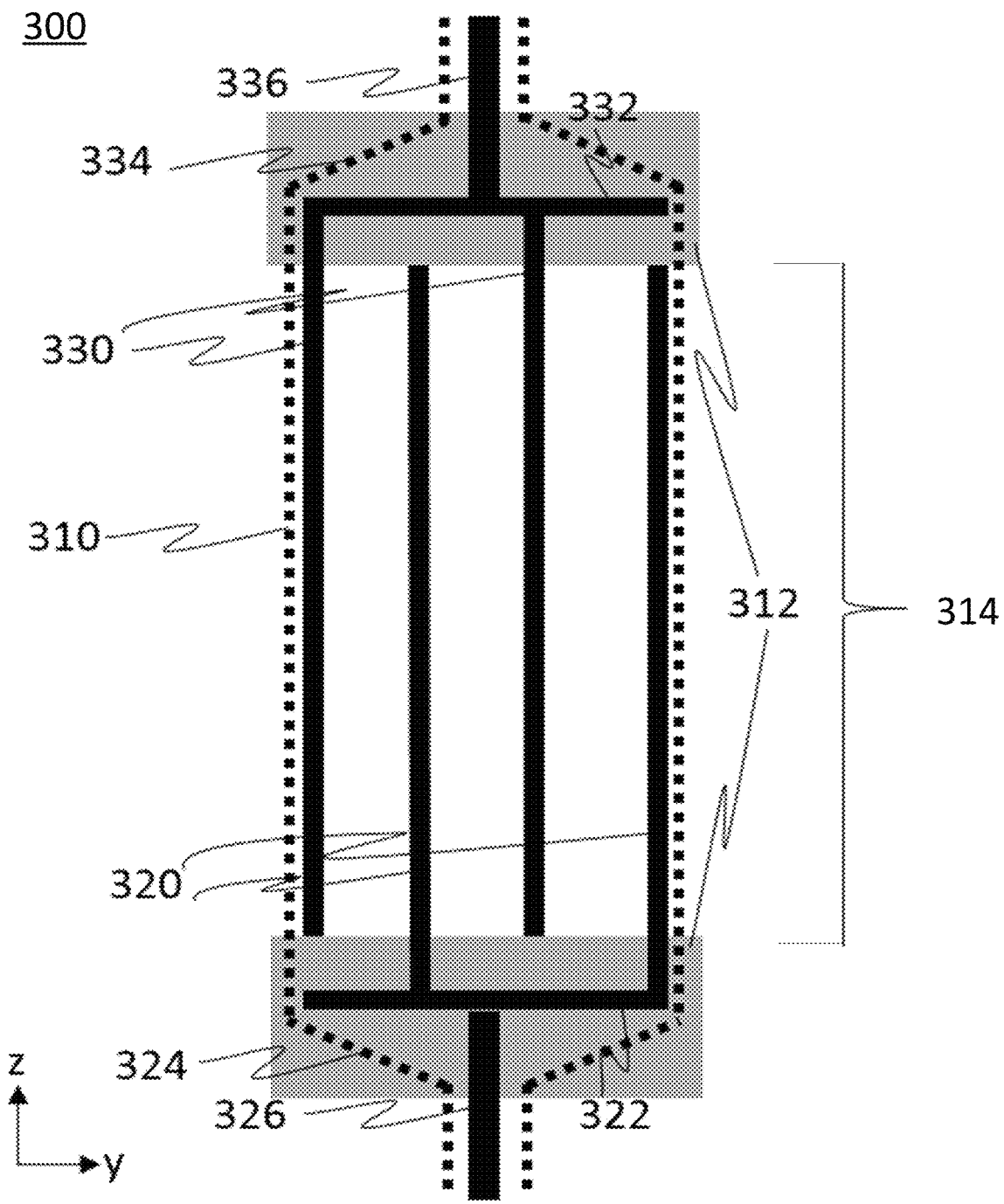
FIG. 3 is a schematic diagram illustrating a laterally-vibrating micro-resonator with triangular transverse boundaries, according to embodiments of the present disclosure.

As seen in the FIGS. 2 and 3, by modifying the straight top and bottom edges of the piezoelectric plate into an arched or triangular shape, the inactive regions are enlarged, thus discriminatingly dispersing higher percentage of energy into the bus region especially for higher-order transverse spurious modes. The higher order acoustic waves can be subsequently scattered from the modified non-parallel acoustic boundaries of the resonant cavity in the transverse direction, therefore eliminating the spurious mode resonances.

With further reference to FIG. 1, in a traditional rectangular resonant cavity formed by high $k_t^2$ X-cut LiNbO$_3$ thin film, SH0 mode acoustic waves can be excited in both longitudinal ($k_i$) and transverse ($k_j$) directions, forming standing waves of various order acoustic modes off the four boundaries. These modes can be interpreted as the superposition of the $i^{th}$ order longitudinal and $j^{th}$ order transverse standing waves. Therefore, they can be represented with a composite wave vector ($k_{ij}$), of which the resonant frequency is directly set by the cavity dimensions and mode orders. For a given number of electrodes (N), the resonant frequencies of higher-order transverse modes ($k_{(N-1),3}$, $k_{N-1),5}$ ... ) are often positioned closer to the desired mode ($k_{(N-1),1}$) as N increases. A device with a minimum number of interdigitated electrodes (N=2) would distance and attenuate higher order transverse modes (larger Δf), and create a larger spurious free range for the resulting filters. To compensate the loss of static capacitance from a reduced N, an array of parallel-connected, two-electrode micro-resonators modes may be employed for better impedance matching.

In one or more implementations of the disclosed LVR, the micro-resonator structure is suspended in a cavity of a supporting structure and generally includes a conductive electrode layer positioned along the transverse axis in contact with or in close proximity to the piezoelectric layer. The micro-resonator structure can be suspended in the cavity by specially designed tethers coupling the micro-resonator structure to the supporting structure. The supporting structure may include the same material as the micro-resonator structure or it may be a different material. These tethers are often fabricated in the layer stack of the micro-resonator structure itself. The micro-resonator structure can also be suspended in the cavity by virtue of mechanical strength of the piezoelectric material without needing a support structure for additional support. The micro-resonator structure can be acoustically isolated from the surrounding structural support and other apparatus by virtue of the cavity.

With further reference to FIG. 1, the traditional LVR 100 includes a piezoelectric plate 110, a first finger set 120, a second finger set 130, a first conductive bus 122, a conductive input line 126 (or other signal connector), and a second conductive bus 132, a conductive ground line 136 (or other ground connector), a set of inactive regions 112, and an active region 114. The piezoelectric plate 110 may be in physical contact with the first finger set 120, the second finger set 130, the second conductive bus 132, the conductive input line 126, the first conductive bus 122, and the conductive ground line 136, The first finger set 120 may be disposed along the z-axis and be approximately parallel to each other. The first finger set 120 may be physically and electrically connected to the first conductive bus 122. The second finger set 130 may be physically and electrically connected to the first conductive bus 132. The first finger set 120 and the second finger set 130 may be positioned such that no two fingers in the sequence connect to the same conductive bus. This arrangement of the fingers is referred to as "interdigitated."

In alternative embodiments, the first conductive bus 122 may be physically and electrically connected to the conductive input line 126, and the second conductive bus 132 may be physically and electrically connected to the conductive ground line 136. The first conductive bus 122 and second conductive bus 132 may be connected to either the conductive ground line 136 or the conductive input line 126, but for are described as above solely for descriptive purposes.

In operation, one or more electrical input signal is provided to the LVR 100 through the conductive input line 126. The electrical input signal may be transmitted from the conductive input line 126 through the first conductive bus 122 to the first finger set 120. In response to the electrical input signal, the first finger set 120 may cause the piezoelectric layer 110 to have a kinetic response. The kinetic response can include a vibrational oscillation along one or more of the x, y, and z axes. Although not shown in FIG. 1, a person having ordinary skill in the art will understand that the x-axis is perpendicular to the y and z axes in the direction away from the surface of the piezoelectric layer 110, e.g., out of the page. The resonant frequency response of the laterally-vibrating structure can be controlled according to a periodic arrangement of electrodes in the conductive layer, for example, by adjusting the width(s) as well as the spacing(s) of the finger from one another in a conductive layer, e.g., along the z-axis of FIG. 1.

The traditional LVR 100 may also include the set of inactive regions 112 (shaded) and the active region 114 (unshaded). For purposes of explanation herein, and as illustrated, the length of one of the inactive regions 112 may be referred to as $L_b$, and the length of the active region 114 may be referred to as $L_e$, where the total length (L) of the micro-resonator may be the addition of $L_e$ and two times $L_b$. These general dimensions may also be referred to in relation to the alternative embodiments illustrated and discussed herein. In brief, with reference to FIG. 1, the inactive regions 112 are the areas of the traditional LVR that fall outside of the overlapping lengths of the interdigitated electrodes. The active region 114 is the area of the overlapping lengths of the interdigitated electrodes.

The analysis of energy distribution for the transverse modes over the inactive and electrode regions is approximated with a simple and effective 2D model. In this model, the confined mechanical energy, $U_m$, in the micro-resonator body is derived using the formula, $$U_m = \int_v T_i s_{ij}^E T_j dv, \quad (1)$$

where $T_i$ and $S_i$ are the stress and strain tensors, respectively, and $s^E_{ij}$ is the elastic compliance under constant electric field.

Because the plate length (L) and width (W) are much greater than the plate thickness, assume the wave vector of the transverse modes is parallel to the y-z plane. Hence, the strain component of the $m^{th}$ transverse mode may be expressed as:

$$S_1^{1,m} = A(y,z)\sin\frac{\pi}{W}y\,\sin\frac{m\pi}{L}z, \quad (2)$$

where m is the order of the transverse mode, and A(y, z) is a coefficient dependent on the mode order. Using the constitutive relationship (T=cS, where c is the stiffness constant), the energy confined in the inactive regions may be expressed as:

$$U_m^{inactive} \propto \int_a^{L_b} \sin^2\left(\frac{m\pi}{L}z\right)dz + \int_{L+L_b}^{L+2L_b} \sin^2\left(\frac{m\pi}{L}z\right)dz. \tag{3}$$

Using Equation 3, the energy concentration ratio, defined as the ratio of the energy in inactive region over the energy in the entire micro-resonator body, may be calculated by integrating corresponding length intervals along the z-axis. As an example, the calculation results for a cavity with the traditional straight shape edges and a fixed electrode length of 90 μm are illustrated in FIG. 1. For higher-order (greater than or equal to three) transverse modes, a more significant portion of the mechanical energy may be dispersed into the inactive regions as $L_b$ increases. This reduction in mechanical energy consequently reduces the presence of transverse modes in micro-resonator's electrical response as less higher-order mechanical energy is converted to the electrical domain via IDE and piezoelectricity. It also hardly impacts the transduction of the intended mode, since increasing $L_b$ only disperses mechanical energy into the inactive regions at a much slower rate for the fundamental mode than it does for higher order modes. The overlapping length of the first finger set 120 and second finger set 130 is more than two thirds of the total finger length and less than three fourths of the total finger length.

FIG. 2 illustrates a laterally vibrating micro-resonator (LVR) 200 with curved transverse boundaries. The LVR 200 may include a piezoelectric plate 210, a set of inactive regions 212, an active region 214, a first finger set 220, a first conductive bus 222, a lower arched transverse boundary 224, a conductive input line 226 (or other signal connector), a second finger set 230, a second conductive bus 232, an upper arched transverse boundary 234, and a conductive ground line 236 (or other ground connector). Each finger set 220 and 230 may include at least two fingers, e.g., interdigitated electrodes (IDE), within the active region 214.

The piezoelectric plate 210 may be in physical contact with the first finger set 220, the second finger set 230, the first conductive bus 222, the conductive input line 226, the second conductive bus 232, and the conductive ground line 236. The first finger set 220 and the second finger set 230 may be disposed along the z-axis and may be approximately parallel to each other. The first finger set 220 may be physically and electrically connected to the first conductive bus 222. The first conductive bus 222 may be physically and electrically connected to the conductive input line 226. The second finger set 230 may be physically and electrically connected to the second conductive bus 232. The second conductive bus 232 may be physically and electrically connected to the conductive ground line 236. The first finger set 220 and the second finger set 230 are positioned such that no two fingers in the sequence connect to the same conductive edge. This arrangement of the fingers is referred to as interdigitated.

In operation, one or more electrical input signals may be provided to the LVR 200 through the conductive input line 226. The electrical input signal may be transmitted from the conductive input line 226 through the first conductive bus 222 to the first finger set 220. The first finger set 220, in response to the electrical input signal, may cause the piezoelectric layer 210 and the second finger set 230 to have a kinetic response. The kinetic response may include a vibrational oscillation along one or more of the x, y, and z axes. The resonant frequency response of the laterally vibrating structure may be controlled according to a periodic arrangement of electrodes in the conductive layer, for instance, by adjusting the width(s) as well as the spacing(s) of the electrodes from one another in a conductive layer, e.g., along the z-axis of the LVR 200.

The shape of the upper and lower transverse boundaries may be determined by a mathematical function. The shape of the upper and lower transverse boundaries may be provided as a perfect smooth ellipse in FIG. 2 and determined by the function:

$$\frac{x^2}{a^2} + \frac{y^2}{b^2} = 1, \tag{4}$$

where x and y are the coordinates of any point on the ellipse, and a and b are the radius on the x and y axes respectively. In alternative embodiments the exact shape of the boundary may not be as smooth. It may be a jagged surface rather than a perfect curve.

In various embodiments, the piezoelectric plate 210 may have a length of 95 μm along the z-axis and a width of 39 μm. Each finger in the first finger set 220 and the second finger set 230 may have a width of 10 μm. The overlapping lengths of the adjacent fingers may be 90 μm or some other length as will be discussed. The thickness of the electrode may be 80 nm. The lower arched transverse boundary 224 and the upper arched transverse boundary 234 may have a radius of 30 μm or some other radius. As described above, the dimensions of the device can be altered based on particular applications and specification without deviating from the disclosure, as will be further explained.

In alternative embodiments, the lower arched transverse boundary 224 and the upper arched transverse boundary 234 are determined by a mathematical function and it may not be a smooth line. For example, in alternative embodiments, the transverse boundaries may be shaped as an exponential curve. In one embodiment, the piezoelectric plate 210 includes piezoelectric material, such as Lithium Niobate (LiNbO$_3$), for example. Additionally, or alternatively, the fingers in the first finger set 220 and the second finger set 230 are curved.

In an alternative embodiment, the conductive ground line 236 and the conductive input line 226 are swapped. In such alternative embodiment, the first conductive bus 222 may be physically and electrically connected to the conductive ground line 236 and the second conductive bus 232 may be physically and electrically connected to the conductive input line 226. Alternatively, or additionally, the number fingers in the first finger set 220 and the second finger set 230 is at least two. In another alternative, the number fingers in the first finger set 220 and the second finger set 230 is less than 100.

FIG. 3 illustrates a laterally-vibrating micro-resonator (LVR) with triangular transverse boundaries 300. The LVR with triangular transverse boundaries 300 includes a piezoelectric plate 310, a set of inactive regions 312, an active region 314, a first finger set 320, a first conductive bus 322, a lower triangular transverse boundary 324, a conductive input line 326 (or other signal connector), a second finger set 330, an second conductive bus 332, an upper triangular transverse boundary 334, and a conductive ground line 336 (or other ground connector). Each finger set 320, 330 may include at least two fingers, e.g., interdigitated electrodes (IDE) within the active region 314.

The piezoelectric plate 310 may be in physical contact with the first finger set 320, the second finger set 330, the first conductive bus 322, the conductive input line 326, the second conductive bus 332, and the conductive ground line 336. The first finger set 320 and the second finger set 330 may be disposed along the z-axis and may be about parallel to each other. The first finger set 320 may be physically and electrically connected to the first conductive bus 322. The first conductive bus 322 may be physically and electrically connected to the conductive input line 326. The second finger set 330 may be physically and electrically connected to the second conductive bus 332. The second conductive bus 332 may be physically and electrically connected to the conductive ground line 336. The first finger set 320 and the second finger set 330 may be positioned such that no two fingers in sequence connect to the same conductive edge. This arrangement of the fingers may be referred to as interdigitated.

In operation, one or more electrical input signals may be provided to the system through the conductive input line 326. The electrical input signal may be transmitted from the conductive input line 326 through the first conductive bus 322 to the first finger set 320. The first finger set 320, in response to the electrical input signal, may cause the piezoelectric layer 310 to have a kinetic response. The kinetic response may include a vibrational oscillation along one or more of the x, y, and z axes. The resonant frequency response of the laterally vibrating structure may be controlled according to a periodic arrangement of electrodes in the conductive layer, for example, by adjusting the width(s) as well as the spacing(s) of the electrodes from one another in a conductive layer, e.g., along the z-axis.

In various embodiments, the piezoelectric plate 310 may have a length of 95 μm along the z-axis and width of 39 μm, or some other length and width. Each finger in the first finger set 320 and the second finger set 330 may have a width of 10 μm. The active region may be 90 μm in length, or some other length. The thickness of the electrode is 80 nm. The lower triangular transverse boundary 324 and the upper triangular transverse boundary 334 may be angled 24 degrees from the first conductive bus 322 and the second conductive bus 332, respectively. The angle of the upper triangular transverse boundary 334 from the first conductive bus 332 is shown in FIG. 3. In various embodiments, the dimensions of the device can be altered based on particular applications and specification without deviating from the disclosure.

In one embodiment, the piezoelectric plate 310 includes piezoelectric material such as Lithium Niobate ($LiNbO_3$). In an alternative embodiment, the fingers in the first finger set 320 and the second finger set 330 are curved. In an additional alternative embodiment, the conductive ground line 336 and the conductive input line 326 are swapped. In such alternative embodiment, the first conductive bus 322 may be physically and electrically connected to the conductive ground line 336. The second conductive bus 332 may be physically and electrically connected to the conductive input line 326.

Fabrication

The LVRs with traditional, triangular, and arched edges may be fabricated using any methods of fabricating LVRs known to a person having ordinary skill in the art. The method of fabrication will be more fully understood upon consideration of the following non-limiting example, which is offered for purposes of illustration, not limitation.

FIGS. 4A, 4B, 4C, 4D, 4E, 4F, 4G, and 4H are a set of diagrams illustrating a fabrication process for $LiNbO_3$ micro-resonators, according to embodiments of the present disclosure. The micromachining process involves micromachining techniques of ion slicing, bonding, and wand selective dry etching and wet releasing. The fabrication starts with the deposition of a $SiO_2$ thin film (FIG. 4A), which serves as an intermediate layer to facilitate the direct bonding of the thin-film donor wafer on the $LiNbO_3$ carrier substrate. Ion implantation with appropriate dose and energy may then be performed to a $LiNbO_3$ donor wafer to install micro-cavities below the surface before the direct bonding process (FIG. 4B). The bonded stack undergoes a thermal treatment, enabling the micro-cavities to expand and cause the splitting process (FIG. 4C). Use of ion slicing technique allows for the integration of bulk quality $LiNbO_3$ thin films on the $LiNbO_3$ device substrates.

Figure 4I:
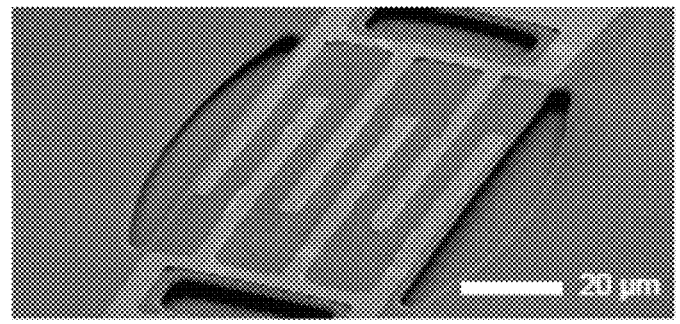
FIG. 4I is a scanning electron microscope (SEM) image of a micro-resonator according to embodiments of the present disclosure.
Figure 4J:
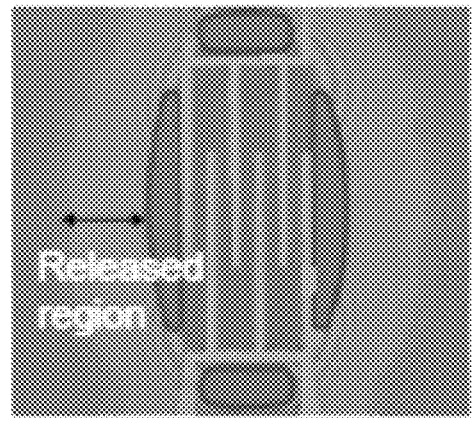
FIG. 4J is an optical image of the fabricated micro-resonator with a length-controlled configuration, according to embodiments of the present disclosure.

In disclosed embodiments, 80 nm-thick interdigitated electrodes (made of Au) may then be defined on top of the sample with transferred $LiNbO_3$ thin film using a lift-off process (FIG. 4D). A composition of PECVD $SiO_2$ may subsequently be deposited to serve as a hard etch mask for defining the $LiNbO_3$ micro-resonator body (FIG. 4E). The $SiO_2$ in the region of releasing windows may be removed by $CHF_3$-based reactive ion etching (RIE) (FIG. 4F). Following the definition of etch mask, $LiNbO_3$ thin film may be etched with $Cl_2$-based RIE with inductive coupled plasma (ICP) to define the acoustic boundaries for the resonant structure (FIG. 4G). The sacrificial layer ($SiO_2$) under and on top of the micro-resonator may be simultaneously removed with 10:1 BOE-based wet etching (FIG. 4H). Lastly, critical point drying (CPD) may be performed to complete the release of the micro-resonators. The ion sliced and $LiNbO_3$ thin film samples are provided by NanoLN® of Jinan, P.R of China. As illustrated in FIG. 4I, the $LiNbO_3$ resonant structure is fully suspended without substantial bending or cracking, indicating the absence of high residual stress in the released thin film. The pattern of the released region illustrated in FIG. 4J also indicates $SiO_2$ is isotropically removed. FIG. 4J is an optical image of the fabricated micro-resonator with a length-controlled configuration, which will be discussed in more detail.

The described implementations may be implemented in any device that is configured to display an image, whether in motion (e.g., video) or stationary (e.g., still image), and whether textual, graphical or pictorial. More particularly, it is contemplated that the implementations may be implemented in or associated with a variety of electronic devices such as, but not limited to, mobile telephones, multimedia Internet-enabled cellular telephones, mobile television receivers, wireless devices, smartphones, Bluetooth® devices, personal data assistants (PDAs), wireless electronic mail receivers, hand-held or portable computers, netbooks, notebooks, smart books, tablets, printers, copiers, scanners, facsimile devices, GPS receivers/navigators, cameras, MP3 players, camcorders, game consoles, wrist watches, clocks, calculators, television monitors, flat panel displays, electronic reading devices (e.g., e-readers), computer monitors, auto displays (e.g., odometer display, etc.), cockpit controls and/or displays, camera view displays (e.g., display of a rear view camera in a vehicle), electronic photographs, electronic billboards or signs, projectors, architectural structures, microwaves, refrigerators, stereo systems, cassette recorders or players, DVD players, CD players, VCRs, radios, portable memory chips, washers, dryers, washer/dryers, parking meters, packaging (e.g., electromechanical systems (EMS), MEMS and non-MEMS), aesthetic structures (e.g., display of images on a piece of jewelry) and a variety of electromechanical systems devices. The teachings herein may also be used in non-display applications such as, but not limited to, electronic switching devices, radio frequency filters, sensors, accelerometers, gyroscopes, motion-sensing devices, magnetometers, inertial components for consumer electronics, parts of consumer electronics products, varactors, liquid crystal devices, electrophoretic devices, drive schemes, manufacturing processes, electronic test equipment. Thus, the teachings are not intended to be limited to the implementations depicted solely in the figures, but instead have wide applicability as will be readily apparent to one having ordinary skill in the art.

FIGS. 5A, 5B, and 5C are scanning electron microscope (SEM) images and corresponding graphs illustrating simulated admittance responses for micro-resonator devices 100, 200, and 300 with straight, triangular, and arched edges, respectively, according to embodiments of the present disclosure. The term ROC denotes "radius of curvature." The curved and triangular SH0 $LiNbO_3$ LVRs effectively scatter the dispersed, higher-order acoustic energy in the inactive region. An orientation of 10° to −Y axis in the X-cut $LiNbO_3$ crystal may be selected for it is theoretically predicted to have the highest $k_t^2$ for SH0 mode. An upper case axis should not be confused with lower case axis. The upper case −Y axis refers to the orientation of the LVR on the $LiNbO_3$ crystal and is determined by the crystal structure of $LiNbO_3$, which cannot be altered. The lower case x, y, and z axes may be arbitrarily chosen, as illustrated in the present Figures, to differentiate between transverse direction and longitudinal direction of the LVR. In alternative embodiments, the LVR is manufactured in any orientation on the piezoelectric material without deviation from the benefits of the disclosed LVRs.

As illustrated in FIG. 5A, several higher-order SH0 transverse spurious modes are observed in the traditional micro-resonator 100. The spurious response can be further attenuated by employing the triangular and arched-shape edges. It is noteworthy that the micro-resonator with the arched edges may exhibit appreciably higher suppression of the spurious mode in comparison to the micro-resonator with the triangular edges.

More specifically, as illustrated in FIG. 5D, by modifying the straight top and bottom edges into an arched (or triangular)-shape, the inactive regions ($L_b$) are enlarged, thus discriminatingly dispersing higher percentage of energy into the bus region especially for higher-order transverse spurious modes. The higher order acoustic waves can be subsequently scattered from the modified non-parallel acoustic boundaries of the resonant cavity in the transverse direction, therefore significantly eliminating the spurious mode resonances.

Figures 6A, 6B, 6C:
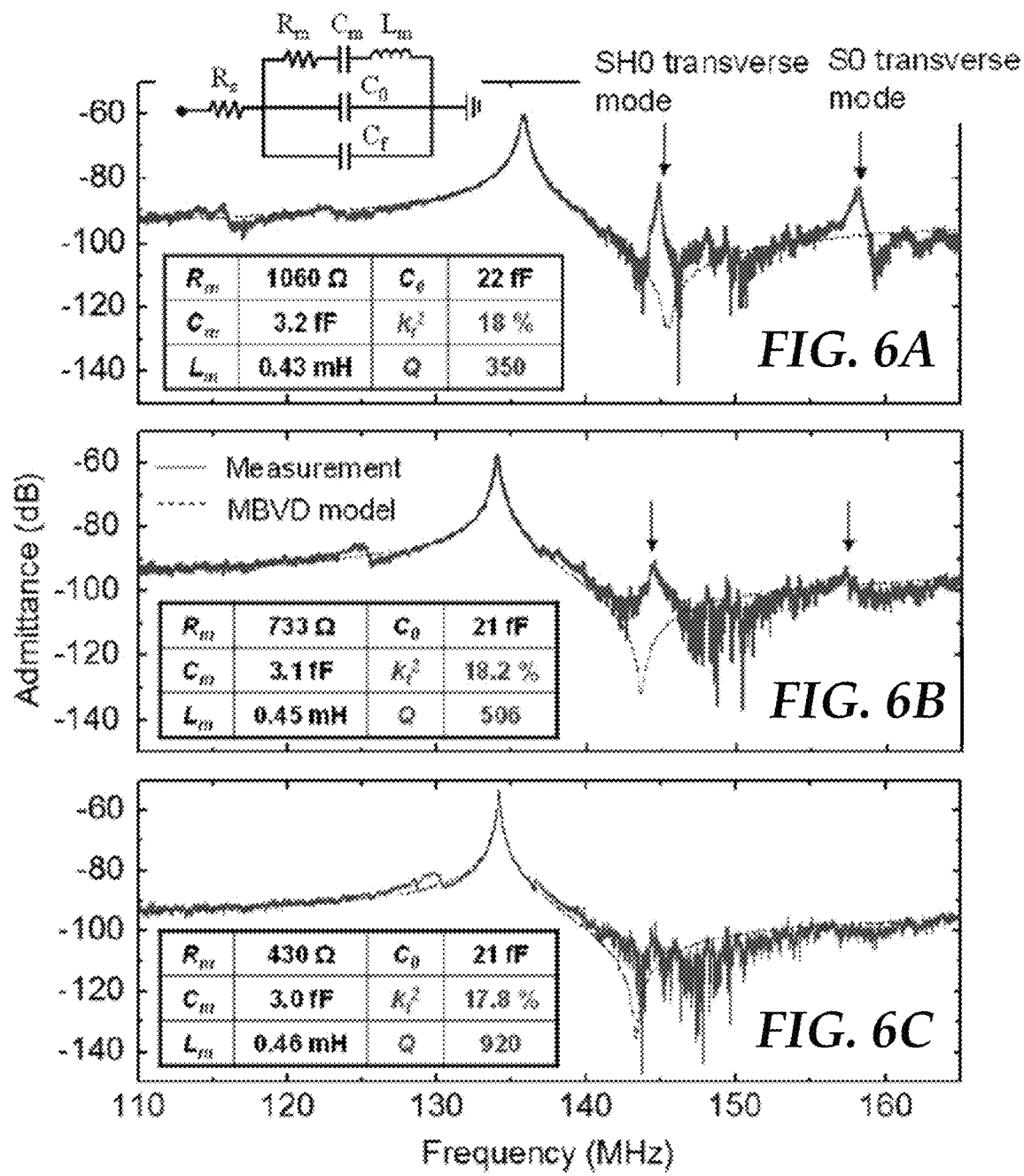
FIGS. 6A, 6B, 6C are graphs illustrating measured admittance responses for micro-resonator devices with straight, triangular, and arched edges, respectively, and FIG. 6A further illustrates a modified Butterworth-Van Dyke (MBVD) model with parameters listed therein, according to embodiments of the present disclosure.

The admittance response of the fabricated devices was measured with a network analyzer at a power level of −10 dBm and in dry air ambiance. The measurement results are shown in FIG. 6A-6C, and fitted with the modified Butterworth-Van Dyke (MBVD) model with the extracted parameters listed inset in each of FIGS. 6A, 6B, and 6C. As expected, the spurious modes in the vicinity of anti-resonance are significantly mitigated using the triangle-shaped edge (FIG. 6B) and arched-shape edge (FIG. 6C). The experimental results have shown good agreement with the theoretical analysis and simulations, confirming that the arched-shape edge can more-efficiently scatter the higher order transverse acoustic waves, without compromising the device performance (e.g., $k_t^2$ for the fundamental mode). An unwanted higher-order transverse S0 spurious mode at 158 MHz may also be mitigated in the same manner.

Figures 7A, 7B, 7C:
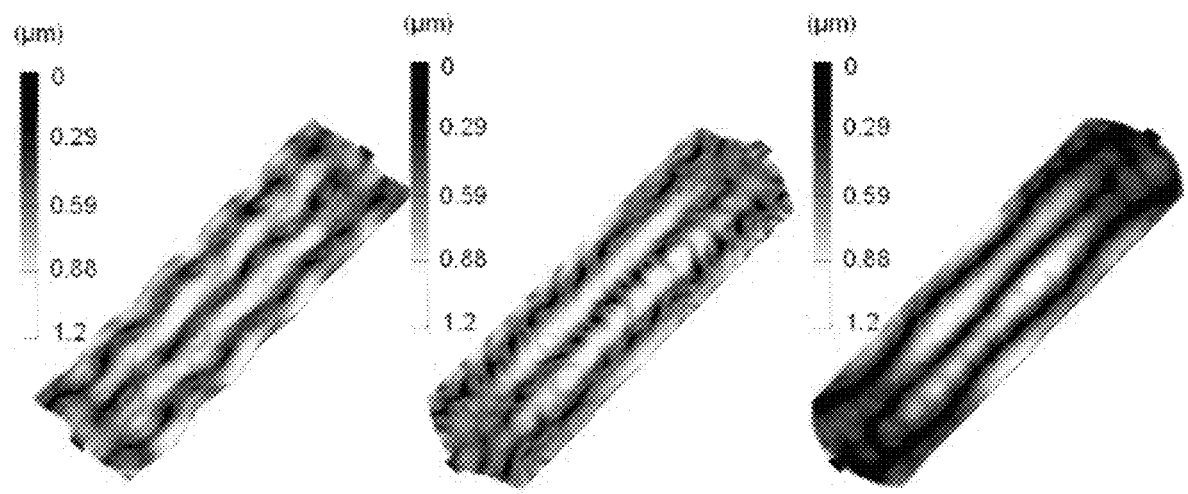
FIGS. 7A, 7B, 7C are images illustrating fundamental shear horizontal displacement mode shapes obtained by a fast piezoelectric analysis in CoventorWare® of straight, triangular, and arched designs, respectively, of a micro-resonator device according to embodiments of the present disclosure.

FIGS. 7A, 7B, 7C are images illustrating fundamental shear horizontal displacement mode shapes obtained by a fast piezoelectric (PZE) analysis in CoventorWare® of straight, triangular, and arched designs, respectively, of a micro-resonator device according to embodiments of the present disclosure. The Q for the fundamental SH0 mode of the device with the arched-shape edge (FIG. 7C) may be nearly doubled in comparison to the devices with the triangular edges (FIG. 7B) or traditional straight edges (FIG. 7A). This may due to the fact that the arched-shape boundary conditions enable the mechanical energy of the fundamental mode to be concentrated to the center of the micro-resonator body, as depicted in FIG. 7C. The concentration of displacement in the center reduces acoustic energy leakage to the surroundings via anchors, giving rise to higher Q values. Furthermore, Q values may be further increased by etching square sidewalls of the micro-resonator device as opposed to highly-sloped side walls.

Length-Control of LVR Electrode Fingers

Figure 8A:
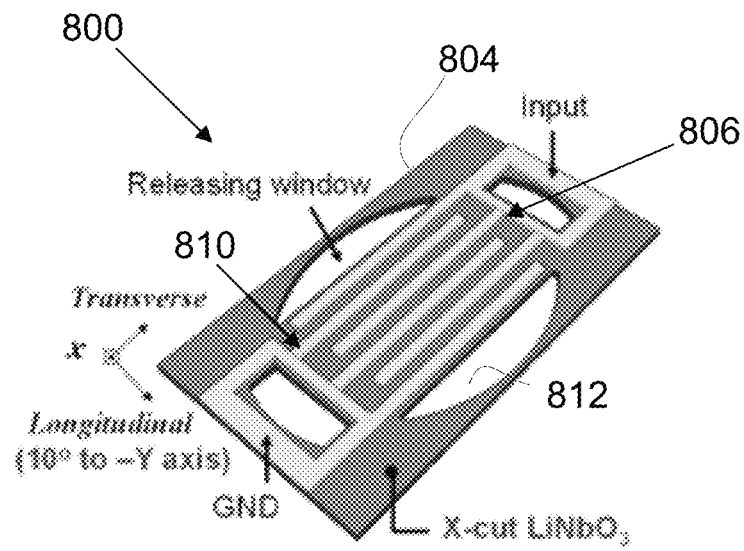
FIG. 8A is a schematic diagram of a LiNbO$_3$ micro-resonator, according to embodiments of the present disclosure.
Figure 8B:
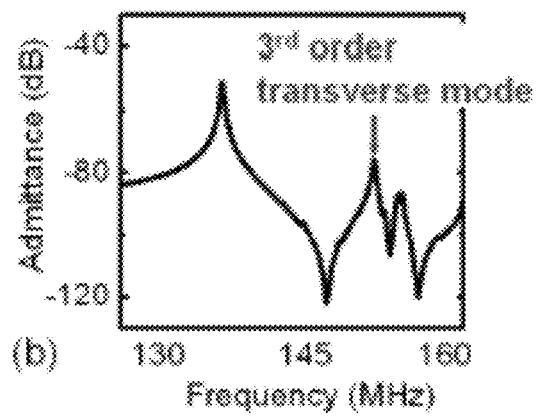
FIG. 8B is a graph illustrating an admittance response of the LiNbO$_3$ micro-resonator device of FIG. 8A, according to embodiments of the present disclosure.
Figure 8C:
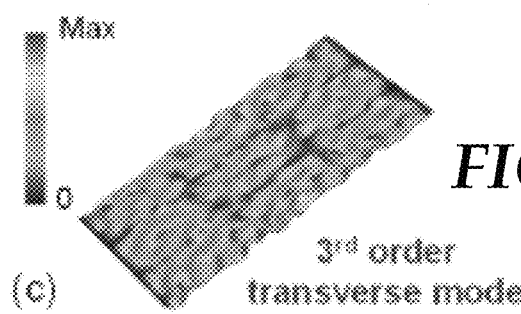
FIG. 8C is a displacement mode shape of the LiNbO$_3$ micro-resonator device of FIG. 8A, the mode shape of the third order transverse spurious mode, according to embodiments of the present disclosure.

FIG. 8A is a schematic diagram of a $LiNbO_3$ micro-resonator 800, according to embodiments of the present disclosure. FIG. 8B is a graph illustrating an admittance response of the $LiNbO_3$ micro-resonator device of FIG. 8A, according to embodiments of the present disclosure. FIG. 8C is a displacement mode shape of the $LiNbO_3$ micro-resonator device of FIG. 8A, the mode shape of the third order transverse spurious mode, according to embodiments of the present disclosure.

As illustrated in FIG. 8A, a traditional $LiNbO_3$ LVR includes a fully-suspended $LiNbO_3$ plate 804 with top inter-digitated transducers (IDTs), namely a set of input fingers 806 and a set of ground fingers 810. A mechanically-suspended, resonant cavity 812 may aid in confining acoustic energy and attaining high Q. In operation, the IDTs are alternatingly connected to the signal and ground, inducing time-varying E-field in the thin film. Through high piezoelectric coupling coefficients of $LiNbO_3$ and bounded by the four sides of the micro-resonator body, the E-field produces acoustic standing waves in the micro-resonator cavity 812 along both the longitudinal and transverse directions. The intended resonances of SH0 $LiNbO_3$ LVRs are manifested by the longitudinal SH0 acoustic standing waves. For this reason, the orientation of SH0 devices is selected to be 10° to the −Y axis in the X-cut plane for it features the largest $k_t^2$ for SH0-mode vibration. The resonant frequency of the SH0 mode may be set by the pitch of the metal electrodes. Therefore, multiple resonant frequencies can be lithographically defined on the same substrate.

Unfortunately, the aforementioned transverse acoustic modes often co-exist with the intended SH0 mode propagating in the longitudinal direction. As illustrated in FIG. 8B, the presence of the transverse acoustic modes translates to higher-order transverse spurious modes close to the anti-resonance of the micro-resonator. As an example, the mode shape of the 3rd transverse mode produced 3-D FEA is shown in FIG. 8C to illustrate the mode periodicity in the transverse direction. Due to vicinity to the intended SH0 resonance, fully removing or sufficiently subduing these modes may reduce or eliminate in-band ripples in filters made up of SH0 $LiNbO_3$ LVRs. However, attaining spurious-mode-free response remains challenging for $LiNbO_3$ devices, particularly when compared to AlN-based LVRs that also have similar transverse modes but at much less pronounced levels. The much greater piezoelectric properties of $LiNbO_3$ may cause more electrical energy intended for exiting the SH0 mode inadvertently coupled into the transverse modes. In contrast to the in-plane (c-axis) isotropic properties of AlN, the in-pane anisotropic elastic and electromechanical properties of LiNbO$_3$ presents a much more complex problem for suppressing the transverse spurious mode. Therefore, even with known techniques for suppressing the transverse modes in AlN LVRs, the elimination of these modes in LiNbO$_3$ cannot simply borrow the analysis from AlN-LVR reports and warrants an extensive study of its own.

FIG. 9A is a schematic illustration of a micro-resonator device with length-controlled electrode configuration, according to embodiments of the present disclosure. FIG. 9B is a graph illustrating a simplified distribution of the stress (T) and electric fields (E) along the transverse direction for the third order transverse mode of the micro-resonator device of FIG. 9A, according to embodiments of the present disclosure. To achieve the goal of removing the transverse spurious modes, the presented technique exploits a length-controlled electrode configuration that optimizes the overlapping length between the signal and ground electrodes to diminish the $k_t^2$ of the undesired spurious modes to zero.

In order to achieve further spurious mode suppression, a length-controlled electrode configuration may be employed. The length controlled electrode configuration involves setting the overlapping length between the signal and ground fingers to minimize the electromechanical coupling coefficient ($k_t^2$) of the undesired spurious modes. To conceptually explain the principle of minimizing the electromechanical coupling for the spurious modes, note the general definition of $k_t^2$, which is formulated as:

$$k_t^2 = \frac{U_m^2}{U_e U_d} = \frac{\left(\int_v T{:}d \cdot E dv\right)^2}{\int_v T{:}s^E{:}T dv \cdot \int_v E \cdot \varepsilon^T \cdot E dv}, \quad (5)$$

where $U_m$ is the mutual energy, $U_e$ is the electric energy, $U_d$ is the mechanical elastic energy, T is the stress tensor, E is the electric field vector, and d, $s^E$, $\varepsilon^T$ denote the piezoelectric strain constants, compliance constants at constant electric field, and permittivity constants at constant stress, respectively.

As shown in Equation 5, $k_t^2$ is directly related to $U_m^2$, the value of which depends on the interaction of stress (T) and electric field (E) through the piezoelectric strain coefficient d. FIG. 9B depicts the simplified distribution of the stress and electric fields for the 3rd order transverse mode, the most pronounced and troublesome spurious mode in the passband. By setting an optimized electrode overlapping length, the corresponding distribution of stress (T) and electric (E) fields can minimize the volumetric integral of the T-field and E-field product along the transverse direction of the micro-resonator, hence reducing the mutual energy and $k_t^2$ in accordance with Equation 5 to near zero.

This technique has been studied using a simple 1-D model that describes the stress and strain fields in the resonant cavity along only the transverse direction. The model assumes a micro-resonator cavity with an infinite longitudinal dimension. Even though the field distributions in an actual micro-resonator are 3-D in nature, the 1-D model herein provides accurate design insights with reasonable approximations. A 3-D finite element analysis will be offered later to confirm the theoretical predictions from the 1-D model.

Figure 10E:
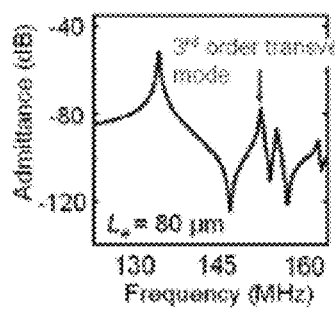
FIGS. 10E, 10F, 10G, and 10H are graphs illustrating simulated admittance response for $LiNbO_3$ micro-resonators with varying overlapping electrode length $L_e$, respectively 80 µm, 70 µm, 60 µm, and 50 µm, according to embodiments of the present disclosure.
Figure 10F:
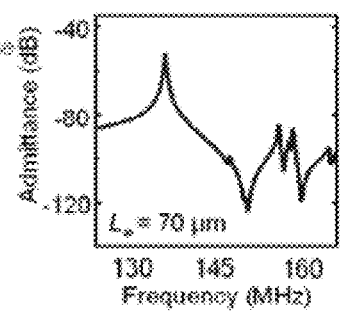
Figure 10G:
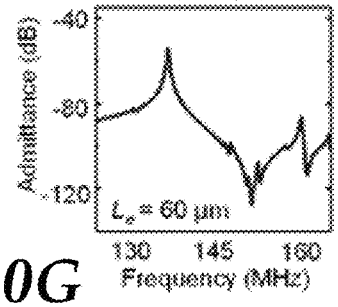
Figure 10H:
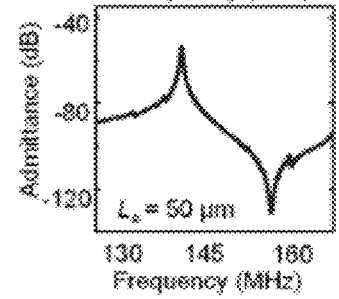

FIG. 10A is a graph illustrating the geometry of a prototype micro-resonator device with one transverse dimension (z), according to embodiments of the present disclosure. FIG. 10B is a graph illustrating normalized $k_t^2$ (to the maximum) for the fundamental and third order transverse modes with respect to the (L-L$_e$) for the LiNbO$_3$ micro-resonator, according to embodiments of the present disclosure. FIGS. 10C and 10D are graphs illustrating stress field profiles of fundamental and third order modes at the optimal L$_e$, respectively, according to embodiments of the present disclosure.

As illustrated in FIG. 10A, the micro-resonator is divided into two regions along the transverse direction (z-axis): an inactive region having the metal routing lines (indicated to the L$_e$/2 lines) and an electrode region with the interdigitated electrodes (indicated between the L$_e$/2 lines). The micro-resonator is symmetric about the center. The wave propagation characteristics, including acoustic impedance and phase velocity, are slightly different in these regions due to the difference in metal coverage. Therefore, the stress field distribution at resonance may be defined as follows:

$$T(z) = \begin{cases} a\cos(k_e z + \gamma) & \frac{L_e}{2} < x \leq \frac{L}{2} \\ b\cos(k_e z) & -\frac{L_e}{2} \leq x \leq \frac{L_e}{2} \\ a\cos(k_e z - \gamma) & -\frac{L}{2} \leq x < -\frac{L_e}{2} \end{cases} \quad (6A)$$

where a and b are the amplitudes of the stress standing waves in the inactive and electrode regions, respectively, and γ is the phase term. Furthermore, the $k_i$ and $k_e$ are the transverse (z-axis direction) wave numbers in the inactive and active regions respectively, and may be given by:

$$k = \frac{2\pi f}{v} = 2\pi f \sqrt{\frac{\rho}{c}} \quad (6B)$$

where v is the acoustic velocity, f is the resonant frequency, ρ is the equivalent density, and c is the equivalent stiffness constant. Using the continuity for displacement and stress at z=+/−L$_e$/2 and assuming stress-free boundary conditions at the top and bottom edges, z=+/−L/2, the following resonances may expressed as:

$$\tan\left(k_e \cdot \frac{L_e}{2}\right) \cdot \tan\left(k_i \cdot \frac{L-L_e}{2}\right) \cdot \frac{Z_i}{Z_e} = 1 \quad (7)$$

$$\gamma = \frac{k_e L}{2} - \frac{\pi}{2}(2n+1)$$

where n is the order number of the transverse modes, Z is the acoustic impedance, and L$_e$ is the length of the electrodes.

Unfortunately, closed-form solutions for the above equations from the Berlincourt formula are not attainable. Thus, a numerical study may be employed by adopting a scalar form of the original tensor equations. Also, for simplicity, assume that the electrode region is fully covered by an Au electrode on LiNbO$_3$ thin film and the inactive region is made of LiNbO$_3$ thin film. Equivalent parameters ($c_{eq}$ and $\rho_{eq}$) in the electrode region may be calculated by:

$$x_{eq} = \frac{x_{Au}t_{Au} + x_{LN}t_{LN}}{t_{Au} + t_{LN}} \quad (8)$$

where $x^{Au}$ and $x_{LN}$ are the material parameters of the Au electrode and the LiNbO$_3$ thin film, respectively. The term t indicates the thickness. Additionally, a Young's modulus of 78 GPa and density of 19300 kg/m$_3$ for the Au electrode were used for the calculation and the required material properties of the LiNbO$_3$ thin film were taken from R. H. Olsson, et. al., Journal of Microelectromechanical Systems, volume 23, number 5, pages 1198-1207 (2014). The shear stiffness constant ($c_{44}$=0.69×10$^{11}$ N/m$^2$) for the target orientation may be acquired using the transformation matrix. The employed cavity length (L) and thickness of the metal electrode (T$_e$) and LiNbO$_3$ plate (TON) are listed in Table 1 (below).

FIG. 10B illustrates normalized $k_t^2$ (to the maximum) for the fundamental and 3rd order transverse modes as a function of (L-L$_e$). As expected, the fundamental mode shows higher $k_t^2$ than the 3rd order mode and its value maximizes at an optimal overlap length of 65 µm, in one embodiment. For the 3rd order transverse mode, the $k_t^2$ is minimized at L$_e$=56 µm. In addition, $k_t^2$ of the fundamental mode at the optimal L$_e$ for suppressing the 3rd order mode is comparable to (even slightly higher than) that of the traditional topology (L$_e$=90 µm). It indicates elimination of the 3rd order transverse spurious mode can be attained without affecting $k_t^2$ of the intended mode. The corresponding stress field profiles for the fundamental and 3rd order transverse modes in the optimal length-controlled electrode configuration (L$_e$=56 µm) are shown in FIGS. 10C and 10D.

Assuming uniform distribution of the electric field in the electrode region and neglecting fringe electric fields at the edges (e.g., E(z) is unity over the electrode region and zero elsewhere), integral of the T-field and E field product along z-axis is indeed zero. Despite the overlapping length is selected to maximally subdue the 3rd order transverse mode, it can contribute to partial eliminations of higher order (5th, 7th . . . ) transverse modes in the same manner. The higher order transverse modes are more distant from the intended mode in the spectral response than the 3rd order. Thus, even if the partially suppressed higher order transverse modes still create unacceptable out-of-band spurious response, they can be removed by a filter-level approach of mixing micro-resonators with different widths.

FIGS. 10E, 10F, 10G, and 10H are graphs illustrating simulated admittance response for LiNbO$_3$ micro-resonators with varying overlapping electrode length L$_e$, respectively 80 µm, 70 µm, 60 µm, and 50 µm, according to embodiments of the present disclosure. As is evident, the 3rd order transverse mode close to the anti-resonance is gradually subdued as the overlapping electrode length (L$_e$) decreases. Admittance response with spurious modes extensively mitigated is achieved at L$_e$=50 µm, reaching good agreement with the 1-D theoretical analysis. The slight mismatch in the optimal Le between the 3-D simulation and 1-D analysis mainly stems from the 1-D approximation and negligence of fringing electric field in the inactive regions.

A 3D finite element analysis (FEA) may be implemented to identify the optimal overlapping length between the adjacent fingers. FIGS. 11A and 11B illustrate various parameters with reference to the manufacture of a LVR device according to an embodiment of the present disclosure. The numerical values of these parameters are given in Table 1.

TABLE 1

| Parameter | Symbol | Value |
|---|---|---|
| Plate length | L | 100 µm |
| Plate width | W | 59 µm |
| Plate thickness | T$_{LN}$ | 0.7 µm |
| Overlapping electrode length | L$_e$ | 50 µm |
| Electrode pitch | W$_P$ | 10 µm |
| Electrode thickness | T$_e$ | 8 nm |
| Number of Electrodes | N | 6 |
| Phase Velocity | v | 3000 m/s |
| Target Resonant Frequency | f$_s$ | 150 MHz |

Figure 12A:
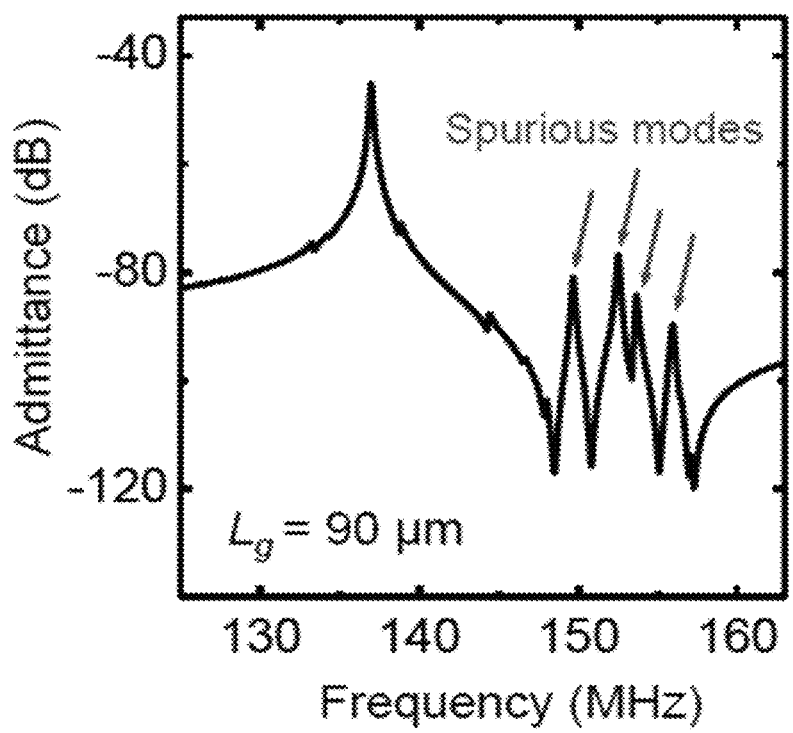
FIG. 12A is a graph illustrating simulated admittance response for a micro-resonator device with an electrode configuration with full overlapping electrode length, according to embodiments of the present disclosure.
Figure 12B:
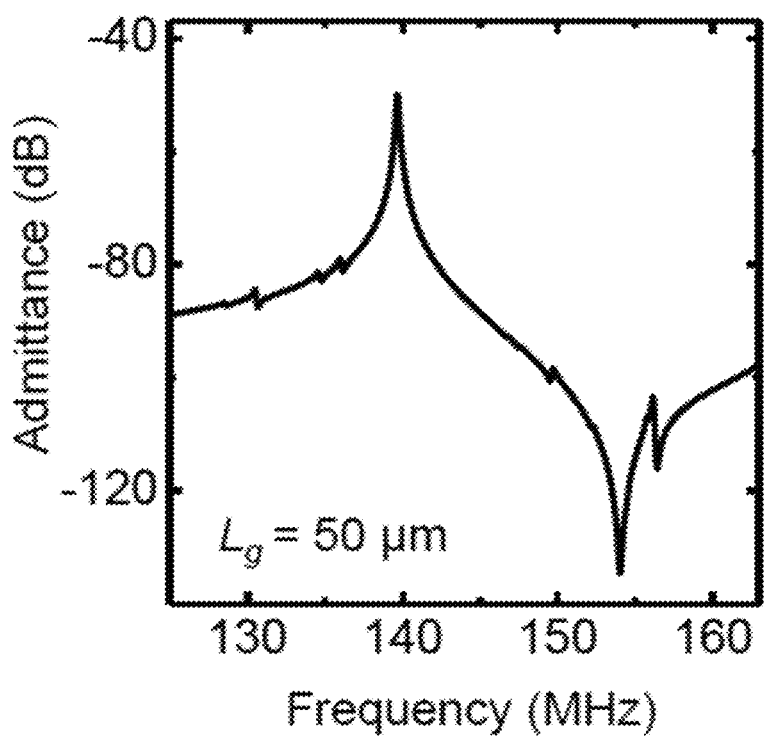
FIG. 12B is a graph illustrating simulated admittance response for a micro-resonator device with the length-controlled electrode configuration, according to embodiments of the present disclosure.

FIG. 11C is a circuit diagram of the MBVD model representing the micro-resonator behavior in the electrical domain. The micro-resonator of FIGS. 11A and 11B includes six fingers and corresponding rectangular edges. An acoustic loss was incorporated into the FEA by using a loss coefficient (η=1/Q) derived from the measured Q of the micro-resonator device. As illustrated in FIGS. 12A and 12B, with an overlapping electrode length (L$_e$) of 50 µm, several higher-order transversal spurious modes that plague the device with the traditional electrode configuration as illustrated in FIG. 12A (L$_e$=90 µm) are significantly subdued or entirely removed (See FIG. 12B). It indicates the length-controller electrode topology can effectively modify the T and E profiles in the resonant cavity, diminishing the $k_t^2$ of higher order transverse modes to near zero. While 50 µm is one number indicative of success in the tested device, different or additional overlapping electrode lengths are envisioned, and the present examples are not to limit the present disclosure by their inclusion herein.

Figure 13A:
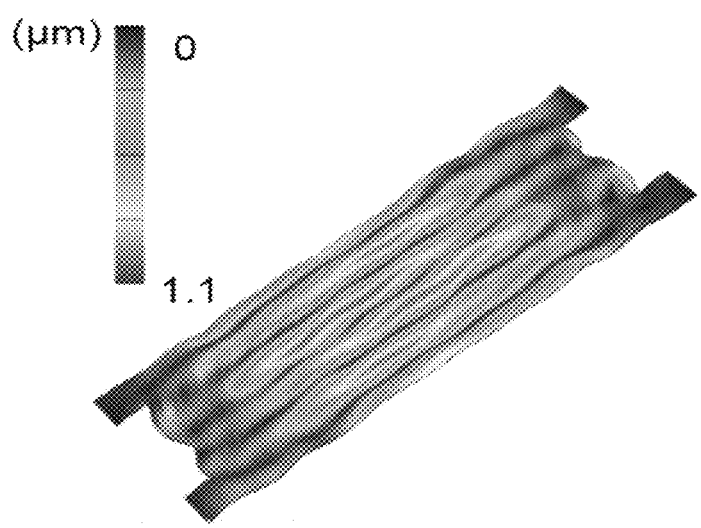
FIG. 13A is an image illustrating simulated displacement mode shapes of the fundamental SH0 mode in a micro-resonator device with the electrode configuration of FIG. 9A, according to embodiments of the present disclosure.
Figure 13B:
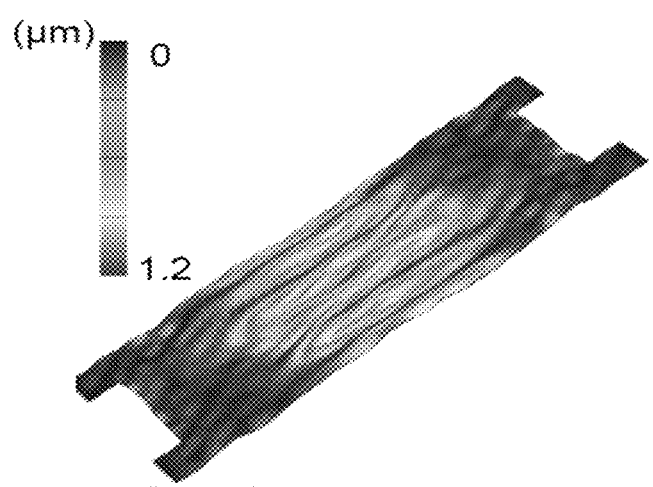
FIG. 13B is an image illustrating simulated displacement mode shapes of the fundamental SH0 mode in a micro-resonator device with the electrode configuration of FIG. 9B, according to embodiments of the present disclosure.

FIG. 13A is an image illustrating simulated displacement mode shapes of the fundamental SH0 mode in a micro-resonator device with the electrode configuration of FIG. 12A, according to embodiments of the present disclosure. FIG. 13B is an image illustrating simulated displacement mode shapes of the fundamental SH0 mode in a micro-resonator device with the electrode configuration of FIG. 12B, according to embodiments of the present disclosure. Due to the modified T and E profiles, mode displacement in the length-controlled electrode configuration (FIG. 11A) is more concentrated in the center region. In alternative embodiments, the length-controlled LVR may have more fingers and key parameters may have different values to obtain desired resonant frequencies. When the key parameters change, an overlapping electrode length may be optimized for the new parameters. Therefore, a person having ordinary skill in the art will appreciate that the disclosed design may be used to improve the electro-mechanical coupling coefficient of the higher order transverse spurious modes on devices with differing parameters without deviating from the core of the disclosure.

FIG. 14A is a schematic diagram illustrating wave vectors in a resonant cavity of a micro-resonator device with four top interdigitated electrodes, according to embodiments of the present disclosure. FIG. 14B is a graph illustrating an admittance response of a spurious mode plagued micro-resonator where i and j indicate mode orders in the longitudinal and transverse directions, respectively, according to embodiments of the present disclosure. FIG. 14C is a graph illustrating spectral spacing (Δf) between the fundamental and third order transverse modes with respect to the number of the interdigitated electrodes, according to embodiments of the present disclosure. FIG. 14D is a table illustrating estimated resonant frequencies for f$_{ij}$ of FIG. 14C, according to embodiments of the present disclosure.

As seen in FIG. 14A, in a typical rectangular resonant cavity formed by high X-cut LiNbO$_3$ thin film, SH0 mode acoustic waves can be excited in both longitudinal ($k_i$) and transverse ($k_j$) directions, forming standing waves of various order acoustic modes off the four boundaries (FIG. 14B). All of these modes can be interpreted as the superposition of the ith order longitudinal and jth order transverse standing waves. Therefore, the modes can be recognized with a composite wave vector ($k^{ij}$), of which the resonant frequency is directly set by the cavity dimensions and mode orders (FIG. 14C, inset equation). For a given number of electrodes (N), the resonant frequencies of higher-order transverse modes ($k_{(N-1),3}$, $k_{(N-1),5}$ . . . ) are often positioned closer to the desired mode ($k_{(N-1),1}$) as N increases. A device with a minimum number of interdigitated electrodes (N=2) would distance and attenuate higher order transverse modes (larger $\Delta f$), and create a larger spurious free range for the included filters. To compensate the loss of static capacitance from a reduced N, an array of parallel-connected, two-electrode micro-resonators modes can be employed for better impedance matching (FIGS. 15A, 15B, 15C).

FIGS. 15A, 15B, and 15C are SEM images of the fabricated LiNbO$_3$ SH0 devices illustrating a traditional micro-resonator, a micro-resonator array, and a zoomed-in view of a micro-resonator sidewall, respectively, according to embodiments of the present disclosure. The M denotes the number of identical micro-resonators in parallel and the N denotes the number of interdigitated electrodes in individual micro-resonators. The dummy electrodes may be implemented to ensure symmetry and identical resonances for the parallel micro-resonators. The micro-resonator array of FIG. 15A includes three micro-resonators. Each micro-resonator in the micro-resonator array includes two interdigitated electrodes and may be separated from each other by a longitudinal gap. As discussed above in relation to FIG. 1, each micro-resonator in the micro-resonator array may have different dimensions based on the desired characteristics of the micro-resonator.

FIGS. 16A, 16B, 16C, 16D, 16E, and 16F are graphs and images illustrating simulated admittance response and displacement mode shapes of the fundamental and third order transverse modes for the disclosed resonant devices with six interdigitated electrodes (FIGS. 16A-16C) and two interdigitated electrodes (FIGS. 16D-16F), according to embodiments of the present disclosure. As illustrated in FIGS. 16A, 16B, and 16C, the 3-D finite element analysis (FEA) confirms effectiveness of this approach and the resonance shift due to the mode order change, as illustrated in FIG. 16D. Reducing N and mode order i can create larger spectral spacing between the intended $k_{i1}$ and unwanted modes ($k_{i3}$, $k_{i5}$ . . . ), thus diminishing the presence of higher order spurious modes. Each micro-resonator array may be fabricated using the fabrication process describe above in relation to FIG. 4.

In the micro-resonator arrays of FIGS. 15A and 15B, the 3rd order transverse ($k_{13}$) mode in both arrays may be significantly attenuated, and produce the spurious-free response for filter synthesis. The micro-resonator array also displays comparable static capacitances ($C_0$) to the six-electrode micro-resonator, thus maintaining the low impedance interface. Moreover, the reduced width of the two-electrode micro-resonators has the effect of diminishing the longitudinal overtones of the intended mode ($k_{i1}$) over a very wide frequency range. In the micro-resonator array, each micro-resonator's input line may be connected to a single source. Similarly, each micro-resonator's ground line may be connected together. In alternative embodiments, each micro-resonator's input line is connected to different sources and independent of any other micro-resonator's input line. Similarly, in alternative embodiments, each micro-resonator's ground line is independent of any other micro-resonator's ground line. In alternative embodiments, the micro-resonator array may include up to 50 micro-resonators. In other alternative embodiments, each micro-resonator in the micro-resonator array may include four, six, or eight interdigitated electrodes.

Figure 17A:
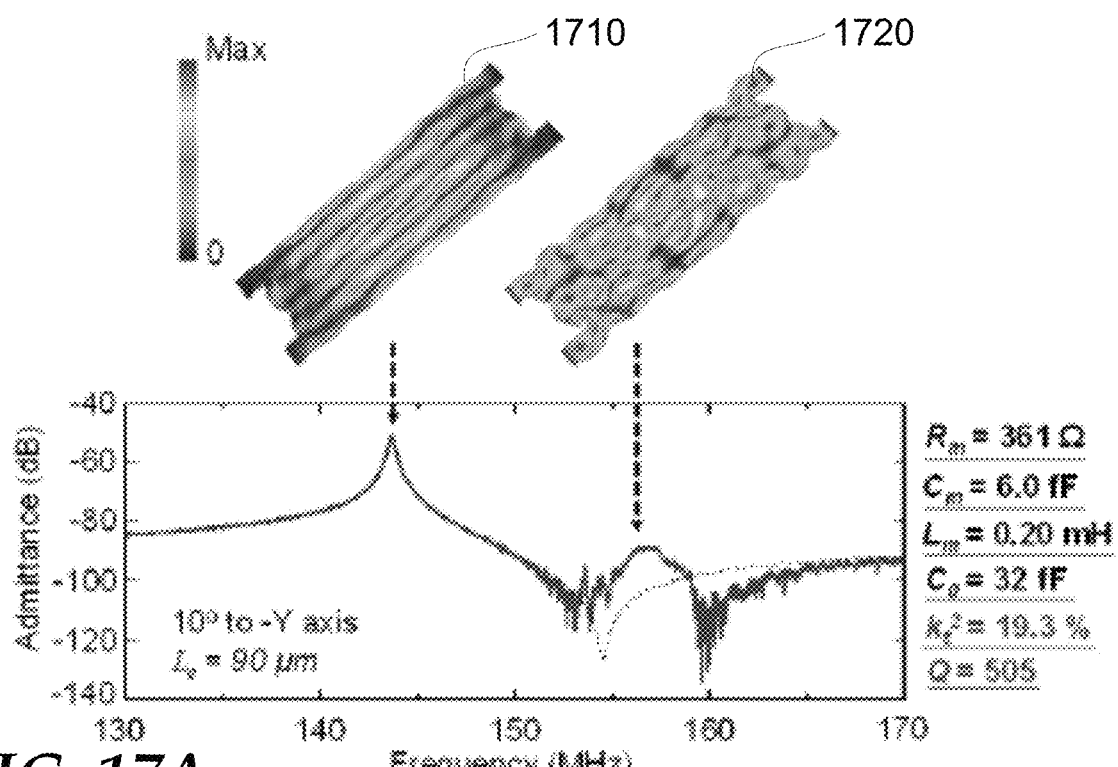
FIG. 17A is a graph illustrating measured admittance response for a micro-resonator device with a full-length electrode overlap, according to embodiments of the present disclosure.
Figure 17B:
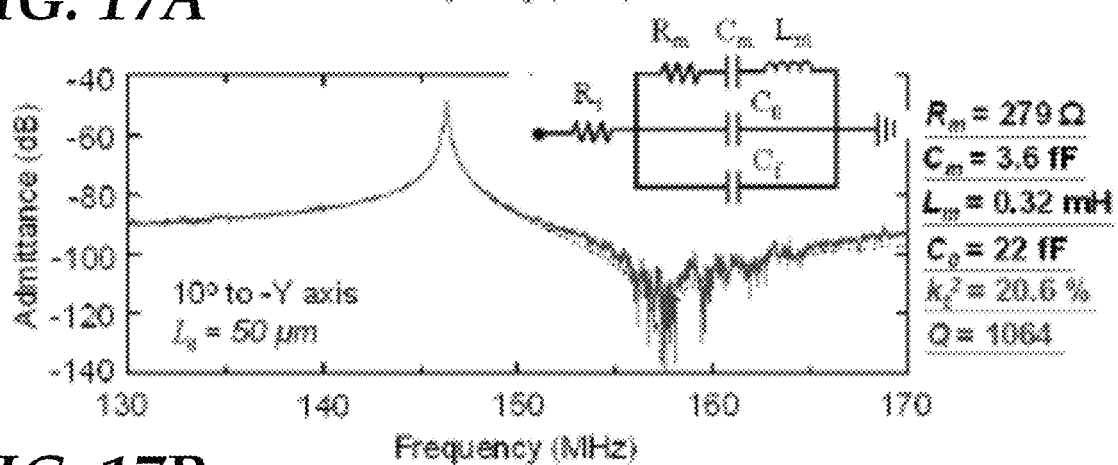
FIG. 17B is a graph illustrating measured admittance response for a micro-resonator device with the length-controlled electrode configuration for a design with four corner anchors, according to embodiments of the present disclosure.
Figure 17C:
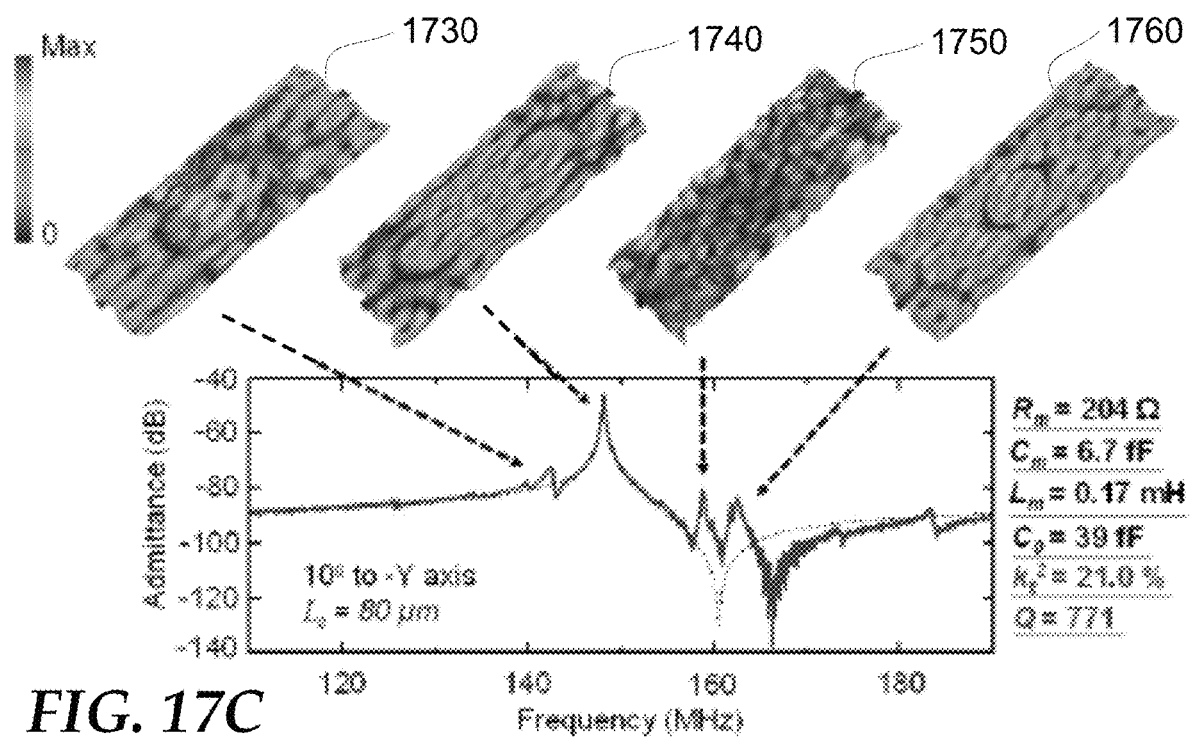
FIGS. 17C and 17D are graphs illustrating measured admittance response for a micro-resonator device with the length-controlled electrode configuration for a design with two center anchors at the orientations of 10° to −Y axis, according to embodiments of the present disclosure, with the dashed line illustrating the MBVD model.
Figure 17D:
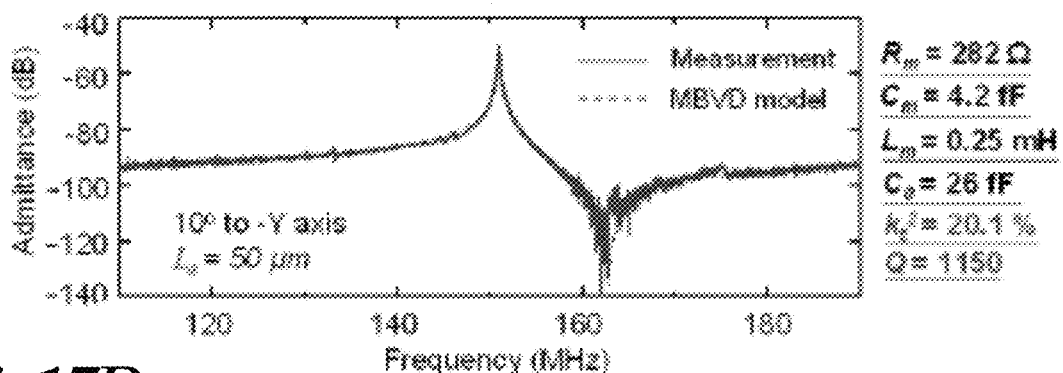

FIG. 17A is a graph illustrating measured admittance response for a micro-resonator device with a full-length electrode overlap, according to embodiments of the present disclosure. FIG. 17B is a graph illustrating measured admittance response for a micro-resonator device with the length-controlled electrode configuration for a design with four corner anchors, according to embodiments of the present disclosure. FIGS. 17C and 17D are graphs illustrating measured admittance response for a micro-resonator device with the length-controlled electrode configuration for a design with two center anchors at the orientations of 10° to −Y axis, according to embodiments of the present disclosure, with the dashed line illustrating the MBVD model.

Example Length-Controlled Devices

To validate the effect of length-controlled electrodes on transverse spurious modes, two groups of devices with four corner anchors (referred to hereafter as design A) and two center anchors (referred to hereafter as design B) were fabricated on the same sample substrate. Each group includes a device with both the traditional and length-controlled electrode configurations, for comparison. Excluding the difference in anchoring, design A and design B may have identical design parameters as presented in Table 1. The admittance response of the fabricated devices was measured with a vector network analyzer at room temperature and in dry air ambiance (input power=−10 dBm).

A. Electromechanical Coupling ($k_t^2$)

With reference to the LVR depicted in FIG. 17A, the measured admittance response of the devices with the traditional and length-controlled electrode configurations for both anchor designs (at an orientation 10° to −Y axis) is shown in FIGS. 17A through 17D. The modified Butterworth-Van Dyke (MBVD) model is used to extract the values for $k_t^2$ and motional components ($C_m$, $L_m$, and $R_m$). The extracted values are listed next to the corresponding admittance curves in FIGS. 17A through 17D. The feed-through capacitance ($C_f$) between the probing pads and ground lines was measured using an on-chip test structure with probing pad and grounding lines identical to the fabricated micro-resonators. Its effect has been de-embedded from the results shown in FIGS. 17A through 17D. De-embedding is a measurement technique that allows one to remove undesired effects from circuit parasitic effects, in this case, the feedthrough capacitance of $C_f$. The measured $k_t^2$ for both design A and B ranges from 19.3% to 21% for the intended SH0 mode are among the highest reported for micro-resonators. The displacement mode shapes 1710, 1720, 1730, 1740, 1750, and 1760 of the intended SH0 resonances in design A and B are illustrated in includes center frequencies ($f_s$) in the 145-150 MHz range. As expected, devices with the length-controlled electrode configuration maintain a comparable $k_t^2$ to devices with the traditional topology, showing no compromise to $k_t^2$ in the both suspension types of devices.

B. Spurious Mode Suppression

With further reference to FIGS. 17A through 17D, the 3rd order transverse spurious modes 1720 and 1760 in both device groups are significantly subdued using the length-controlled electrode configuration. The traditional device with design B produces additional spurious modes 1730 and 1750 in the vicinity of the target frequency. As seen in FIG. 17D, these modes are also sufficiently suppressed by the length-controlled topology. The undesired spurious mode 1730 in FIG. 17C arises from the interaction between the bus line and interdigitated electrode. Note that the design B maintains a closer gap between the bus line and interdigitated electrode (e.g., smaller $L_b$). The length-controlled topology also subdues this spurious mode by installing a larger gap between the bus line and interdigitated electrodes, dampening the interaction of acoustic wave with the bus line. We believe the spurious mode 1750 of FIG. 17C may be a modified 3rd order transverse mode and may originate from the non-uniform mechanical boundary condition owing to the anchors. In order to thoroughly investigate the mitigation of the 3rd order transverse mode, a group of devices with anchor design A and an orientation of 20° to −Y axis were fabricated and measured. The overlapping electrode length ($L_e$) was varied from 50 μm to 90 μm. As shown in FIGS. 18A, 18B, 18C, 18D, and 18E, the results display excellent agreement with the 1-D analysis and 3-D simulation and calculated results.

The suppression of the transverse spurious modes using the length-controlled electrode configuration does come at the expense of a lower static capacitance ($C_0$). $C_0$ is determined by the width, overlapping length, and pitch of the IDEs, and one of the key factors for achieving low motional resistance ($R_m$) and low insertion loss. This trade-off in lower $C_0$ can be compensated for by arranging multiple identical devices in parallel.

C. Quality Factor

As shown in Table 2 below, the length-controlled electrode configuration also has the additional benefit of Q enhancement, when compared with the traditional electrode configuration. The Q may be extracted by dividing the measured $f_s$ by the 3 dB bandwidth of the resonance. The reduced electrode coverage in the length-controlled electrode configuration lowers the loss at the interface between the metal electrodes and piezoelectric layer. This phenomenon is distinctly apparent as gold, a high acoustic loss metal, is used as the interdigitated electrodes. As a result, devices with design A and the length-controlled electrode configuration shows an average Q (Q=940) more than twice of the traditional one (Q=430). The comparison between the traditional and length controlled electrode configurations for design B shows the same phenomenon. Their average Q is higher than design A since the smaller anchor size of design B better confines the acoustic energy.

TABLE 2

| Anchor | Device | Traditional | Length-Controlled |
|---|---|---|---|
| Design A | #1 | 264 | 909 |
| | #2 | 505 | 1064 |
| | #3 | 525 | 850 |
| Design B | #1 | 771 | 1150 |
| | #2 | 720 | 1020 |

The demonstrated Q of 1150 and high $k_t^2$ of 20.1%, SH0 LiNbO$_3$ LVRs with length-controlled electrode con-figuration display a very high Figure of Merit (FoM) of 230 and spurious free response (100-200 MHz) simultaneously.

Application to Wideband LVRs

One of the promising candidates for enabling high performance RF filters is laterally vibrating micro-resonators (LVRs). These LVRs feature several technical advantages in comparison to film bulk acoustic wave devices (FBARs) and surface acoustic wave micro-resonators (SAW). For example, LVRs can be manufactured with multiple frequencies on a single chip, and some can be monolithically integrated with CMOS. The vibration in LVRs may be confined in suspended cavities and thus has a high mechanical Q. Despite these advantages, LVRs based on Alumina Nitride (AlN), Gallium Nitride, PZT on Si, ZnO on Si, AlN on Si, or SiC demonstrate $k_t^2$ less than 2% so far, and thus are not suitable to construct wideband filters (fractional bandwidth>5%). This percentage is specified for fractional bandwidth, which is defined as the 3 dB bandwidth over the center frequency of the filter. In contrast, LVRs based on thin-film Lithium Niobate (LiNbO$_3$) may be demonstrated with high $k_t^2$ (over 20%) and high Qs simultaneously, attracting significant interest as the building blocks for wide band filter synthesis. For example, a self-coupled RF filter based on two-port symmetric (S0) mode LiNbO$_3$ micro-resonators may be demonstrated to have a large 3-dB fractional bandwidth (FBW) of 3.9%. Along with the S0 mode, various other acoustic modes, including the shear horizontal (SH0) and asymmetric (A1) modes, may also be potential candidates for enabling wideband filtering. So far, the SH0 mode LVRs in X-cut LiNbO$_3$ may show the largest kt and highest FoM. Therefore, these LVRs are deemed as the foremost type of LVRs for enabling a very large fractional bandwidth.

Despite the impressive performance, current designs have not fully harnessed the pronounced piezoelectric properties of LiNbO$_3$ for achieving wide bandwidth, largely due to the spurious response in state-of-the-art LiNbO$_3$ micro-resonators. The spurious response originates from various kinds of unwanted spurious modes that are transduced as the by-products of the intended resonant mode. These spurious modes are particularly troublesome in LiNbO$_3$ LVRs as the high $k_t^2$ of LiNbO$_3$ inadvertently accentuates these spurious modes. As a result, the performance of filters that include the LVRs is afflicted with ripples in the pass-band and out-of-the-passband spurious responses. In particular, in-band ripples caused by the spurious modes adjacent to the intended mode may make it difficult to attain the maximum bandwidth and minimum insertion loss.

In the present disclosure, lateral spurious modes in a single SH0 mode micro-resonator are first studied and identified with their corresponding 2-D wave vectors. Subsequently disclosed is an optimized 2-electrode design that can effectively mitigate lateral, higher-order modes over a wide frequency range. Such a spurious-mode-free design may then be monolithically arrayed in a ladder topology to synthesize a 95 MHz filter with a large FBW of 8.9%, a low insertion loss of 2.1 dB, and spurious-free response up to 270 MHz.

FIG. 19A is graph illustrating simulated $K^2$ of the SH0 mode in an X-cut LiNbO$_3$ plate at various orientations, according to embodiments of the present disclosure. FIG. 19B is a graph illustrating simulated phase velocities of SH0 mode in an X-cut LiNbO$_3$ plate with a metallized top surface, according to embodiments of the present disclosure. FIG. 19C is a graph illustrating simulated phase velocities of SH0 mode in an X-cut LiNbO$_3$ plate with free boundary conditions, according to embodiments of the present disclosure where h denotes the thickness of the LiNbO$_3$ plate and λ is the wavelength, according to embodiments of the present disclosure. In FIGS. 19A through 19C, h denotes the thickness of the LiNbO$_3$ plate and λ is the wavelength.

SH0 Mode in LiNbO$_3$

The SH0 mode has been demonstrated with the largest K$^2$ in LiNbO$_3$ and low velocity dispersion over a wide range film thickness. The K$^2$ is intrinsic electromechanical coupling and determined by material properties, mode type, and direction of mode propagation. The K$^2$ also sets a transducer's maximally achievable electromechanical coupling (k$_t^2$) approximately given by k$_t^2$=K$^2$/(1+K$^2$). The K$^2$ can be extracted by comparing the phase velocities of the same acoustic mode in a piezoelectric plate with the metalized and un-metalized surfaces. As seen in FIG. 19A, phase velocities of the SH0 mode have been computed with COMSOL® for various directions of wave propagation, ranging from 0° to 180° in the X-cut plane. COMSOL® is a multi-physics finite element simulation software tool provided by COMSOL AB Corp. of Stockholm, Sweden. The SH0 mode shows the largest K$^2$ (>40%) at the orientation of 10° to the –Y axis and a low velocity dispersion of less than 300 m/s between h/λ of 0.01 and 0.25.

2-D Modal Analysis for Studying Spurious Response

As illustrated in FIG. 20A, a typical one-port LiNbO$_3$ LVR is composed of a suspended rectangular resonant cavity and top interdigitated transducers (IDTs) that are alternatingly connected to the input signal and ground. In operation, electric fields introduced by the top electrode induce periodic strain and stress fields, forming various order acoustic modes as depicted in FIG. 20B. The origin of these SH0 acoustic modes can be understood via a simple 2-D modal analysis. In a 2-D rectangular plate, SH0 acoustic waves can be excited in both longitudinal and transverse directions, producing standing waves of various order acoustic modes off the four reflective boundaries. Each of these modes can be defined as the superposition of the i$^{th}$ order longitudinal (y-axis, wave vector of $\hat{k}_i$) and j$^{th}$ order transverse (z-axis, wave vector of $\hat{k}_j$) standing waves. In various embodiments, each mode may be identified with a composite wave vector, of $\hat{k}_{ij}$:

$$\hat{k}_{ij} = \hat{k}_i + \hat{k}_j = \frac{2\pi}{\lambda_i}\hat{y} + \frac{2\pi}{\lambda_j}\hat{z}, \tag{9}$$

where $\lambda_i$ and $\lambda_j$ are the resonant wavelengths of the i$^{th}$ and j$^{th}$ order longitudinal and transverse acoustic waves. Bounded by the resonant conditions, the resonant wavelengths can be formulated as follows:

$$\lambda_i = \frac{2W}{i}, \lambda_j = \frac{2L}{j}, \tag{10}$$

where W and L are the width and length of the micro-resonator, and i and j are the orders of the longitudinal (y-axis) and transverse (z-axis) modes.

The intended SH0 mode in a traditional LVR with N electrodes is fundamental in the transverse direction (j=1). The longitudinal mode order of the intended mode is typically N−1, as the stress fields of the (N−1)th order mode periodically matches the electric fields induced by N interdigitated electrodes. It is also for this reason that the intended longitudinal mode is the most excited one as seen FIG. 20B. Thus, the composite wave vector identifying the intended SH0 mode is ($\hat{k}_{(N-1),1}$).

In addition to the intended mode, there are other unwanted modes of various kinds and orders. To illustrate the nature of these acoustic modes, assume a traditional 4-electrode device (N=4) as an example. The 3-D finite element analysis (FEA) was performed to identify resonances and their corresponding displacement mode shapes. As shown in FIG. 20C, an acoustic mode with displacement variations of 1.5 periods along the longitudinal direction and of a 0.5 period along the transverse direction is the intended mode ($\hat{k}_{3,1}$). Along with the $\hat{k}_{(N-1),1}$ mode, two categories of spurious modes, first the lower or higher order longitudinal ($\hat{k}_{(N-3),1} \ldots$ or $\hat{k}_{(N+1),1} \ldots$) and secondly the higher order transverse ($\hat{k}_{(N-3),3}$, $\hat{k}_{(N-1),5} \ldots$) modes, are also produced. These modes are deemed as unwanted spurious modes. In the case of a traditional LVR with four electrodes, these unwanted modes are confirmed as $\hat{k}_{11}$, $\hat{k}_{51}$, $\hat{k}_{33}$, and $\hat{k}_{35}$ via inspecting the displacement periodicity along both the transverse and longitudinal directions illustrated in FIG. 20D. This disclosure will focus the spurious mode discussions on the aforementioned two categories and exclude arbitrary composite modes of ($\hat{k}_{ij}$) (i≠N−1 and j≠1) since these latter modes typically have more damped presence in comparison.

Assuming negligible dispersion, the resonant frequencies of these acoustic modes, intended or unwanted, may be set by the cavity dimensions and mode orders, and may be expressed as:

$$f_{ij} = \frac{v_0 |\hat{k}_{ij}|}{2\pi} = v_0 \sqrt{\left(\frac{i}{2W}\right)^2 + \left(\frac{j}{2L}\right)^2}, \tag{11}$$

where v$_0$ is the phase velocity of the acoustic wave. As seen in FIG. 19B, the phase velocity varies as the orientation of device changes. The corresponding phase velocities at 10° to –Y axis in the X-cut plane are 3,500 m/s and 4500 m/s (at h/λ=0.05), respectively. Given that the metal coverage of the micro-resonators is 50%, an average of both phase velocities is employed in the calculations of the resonant frequencies.

Higher Order Transverse Modes

Based on Equation 11, for a device with a sufficiently large L, higher order transverse modes ($\hat{k}_{(N-1),3}$, $\hat{k}_{(N-1),5} \ldots$) are positioned in the vicinity of the anti-resonance of the intended mode, thereby introducing in-band ripples. Moreover, the spectral spacing between the fundamental and 3$^{rd}$ order transverse modes ($\Delta f_1$ in FIG. 20B) gradually decreases as the number of electrodes increases for a given electrode pitch (W$_p$), as seen in FIG. 20C. Consequently, employing a minimum number of interdigitated electrodes (i.e. N=2) would be an effective approach to distance higher order transverse modes (larger $\Delta f_1$) from the intended mode, and create a larger spurious free range for the comprising filters.

FIGS. 16A through 16F illustrate the 3-D finite element analysis (FEA) results for the micro-resonators with six (FIGS. 16A-16C) and two interdigitated electrodes (FIGS. 16D-16F). The parameters employed for both micro-resonators are listed in Table 3.

TABLE 3

| Parameter | Symbol | 2-elec. | Both | 6-elec. |
|---|---|---|---|---|
| Plate width | W | 20 μm | | 60 μm |
| Plate length | L | | 100 μm | |
| Plate thickness | T$_{LN}$ | | 0.7 μm | |
| Electrode pitch | W$_p$ | | 10 μm | |
| Electrode thickness | T$_e$ | | 80 μm | |

As expected, reducing N and the mode order i enables a larger spectral spacing ($\Delta f_1$), and thus can diminish the presence of in-band ripples that arise from the higher order transverse spurious modes. The corresponding modeshapes of the intended (or designed) modes and the $3^{rd}$ order transverse modes for the six-electrode and two-electrode configurations are also illustrated in FIGS. 16A-16C and FIGS. 16D-16F, respectively. The 3-D FEA confirms effectiveness of this approach and the resonance shift due to the mode order change. Comparison of the results in FIG. 20C and in FIG. 16D illustrates that $\Delta f_1$ in the 3-D FEA simulation is slightly larger than that in the 2-D model. This minor $\Delta f_1$ discrepancy may be due to the fact that the phase velocity employed in the 2-D model is approximated as a constant value independent of the wave propagation direction and mode orders.

Higher Order Longitudinal Modes

In addition to diminishing the higher order transverse modes, the minimum (N=2) electrode design also subdues the longitudinal spurious undertones and overtones ($\hat{k}_{(N-3),1}$, $\hat{k}_{(N+1),1}$ . . . ). FIG. 21 illustrates the calculated (line) and simulated (symbol) resonant frequencies of the intended mode and the longitudinal undertone and overtones for the two-electrode and six-electrode topologies, respectively. The symbol 'X' represents the absence of any undertone for the two-electrode design. Equation 11 and CoventorWare® 3-D FEA may be employed for the calculation and simulation, respectively. In contrast to the six-electrode device, the two-electrode design may induce a larger spectral spacing between the intended and the closest longitudinal overtone ($\Delta f_2$ in FIG. 20B). Furthermore, the two-electrode device may result in a response devoid of the longitudinal undertone since the intended mode has the lowest mode order. Thus, the two-electrode design can effectively diminish both the longitudinal and transverse spurious modes.

Design of Lithium Niobate RF-MEMS Filters

Among the several filter topologies based on acoustic micro-resonators, present disclosure may use the ladder-type as ladder-type acoustic micro-resonators provide sharp roll-off, and may be a straightforward implementation. FIG. 22A is a schematic diagram illustrating a lumped equivalent circuit model 2200 of a one-port micro-resonator, according to an embodiment of the present disclosure. As illustrated in FIG. 22B, the one-port micro-micro-resonator may be a series micro-resonator 2210 or a shunt micro-resonator 2220, and may be combined in different combinations to form a ladder-type filter 2202 as a micro-resonator array. The ladder-type filter 2202 of FIG. 22B, in one embodiment, may be formed by cascading three series one-port micro-resonators 2210 and two shunt one-port micro-resonators 2220 as illustrated in FIG. 22B. Arrays of micro-resonators, instead of individual micro-resonators, may be used as the building blocks of the ladder filters to attain a higher static capacitance ($C_0$) for better impedance matching. Assuming that individual micro-resonators in an array feature identical response, the micro-resonator array may be capable of achieving the same resonance as a single micro-resonator but with a higher $C_0$. In each series and shunt branch, fifteen two-electrode micro-resonators (M=15, N=2) and five six-electrode micro-resonators (M=5, N=6), respectively, may be arrayed. M denotes the number of identical micro-resonators in parallel. Naturally, M is higher for the two-electrode design so that a comparable $C_0$ can be achieved as compared to the six-electrode design.

To attain the required frequency offset between the series and shunt micro-resonators, interdigitated electrode pitches ($W_P$) may be varied for resonant frequency setting. To achieve a maximum bandwidth, the anti-resonance of the shunt micro-resonators 2220 should align with the series-resonance of the series micro-resonators 2210. To this end, the electrode pitches for the series and shunt micro-resonators are chosen as 10 µm and 10.7 µm, respectively, based on the prediction of resonances in 3-D FEA.

To predict the filter response, the admittance response for the single series and shunt micro-resonators was first simulated. The FEA results for individual micro-resonators were then adopted in an advanced design system (ADS) simulation to extract the S-parameter response of the ladder filter make up of these micro-resonator arrays. FIGS. 23A, 23B, 23C, 23D are graphs illustrating simulated admittance responses (FIGS. 23A, 23C) and S21 responses (FIGS. 23B, 23D) of the single series and shunt micro-resonators of FIG. 22B for a six-electrode micro-resonator design (FIGS. 23A-23B) and two-electrode micro-resonator design (FIGS. 23C-23D), according to embodiments of the present disclosure. FEA results, instead of lumped equivalent circuit models, were used to represent micro-resonators in circuit-level simulations because FEA may capture the presence of higher order spurious modes. The simulation results using FEA are illustrated in FIGS. 23A through 23D present a comparison between the two-electrode and six-electrode designs. As predicted, in-band ripples stemming from the $3^{rd}$ order transverse modes are seen in the response of the six-electrode configuration, dramatically degrading the passband response. On the other hand, thanks to the larger spectral gap between the fundamental and $3^{rd}$ order transverse mode ($\Delta f_1$), the two-electrode ladder filter 2220 illustrates a ripple-free response in a passband with a 3-dB FBW of 10.2%.

Measurement Results

Single One-Port Micro-Resonators

To validate the benefits of the two-electrode design, one-port micro-resonators with the two electrodes and six electrodes at an orientation of 10° to −Y axis were first fabricated with the process described with reference to FIG. 4A through 4H. For a fair comparison against a traditional six-electrode micro-resonator (M=1, N=6), the two-electrode design is fabricated in an array format with either three or four parallel-connected, two-electrode micro-resonators (M=3 and 4, N=2) to attain a comparable Co. The fabricated micro-resonators are shown in FIGS. 24A and 24B. Note that dummy electrodes were introduced on the edges to ensure the structure symmetry and identical resonances for parallel micro-resonators in the micro-resonator arrays (see FIG. 24B). The fabricated devices were measured on a probe station using a vector network analyzer in dry air and at room temperature.

Figure 25A:
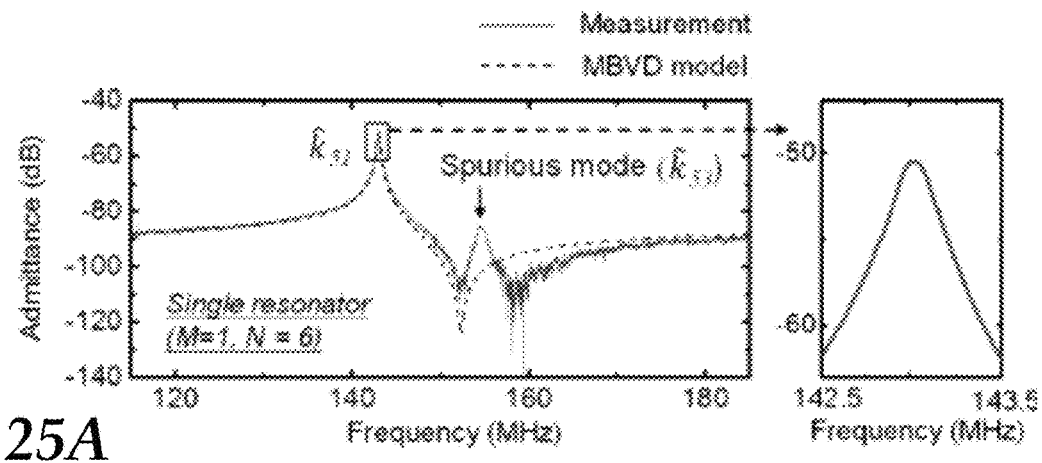
FIGS. 25A, 25B, and 25C are graphs of measured admittance response of the traditional micro-resonator (N=6), three-parallel-connected micro-resonator array (N=2), and four-parallel-connector micro-resonator array (N=2), respectively, where inset tables list the extracted parameters for the MBVD model and measured electromechanical coupling ($kt^2$) and Q, according to embodiments of the present disclosure.
Figure 25B:
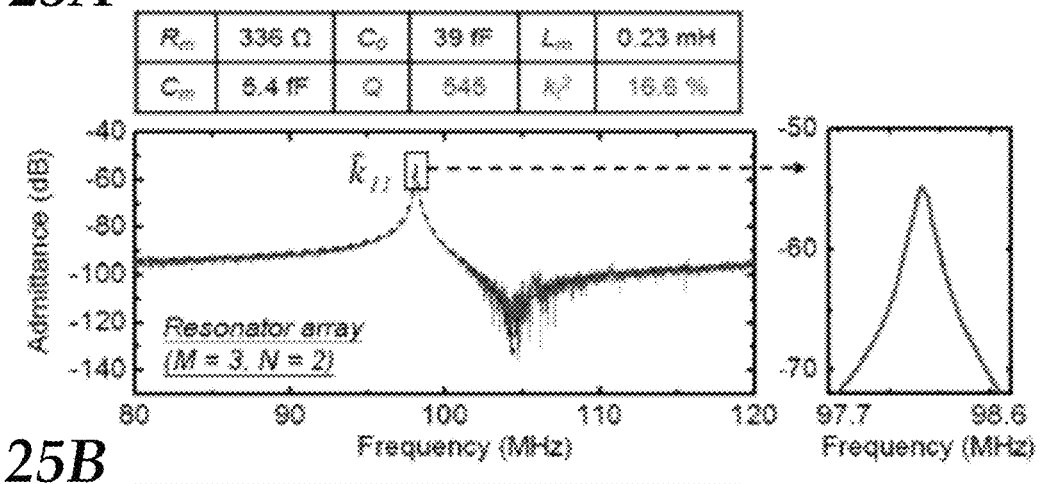
Figure 25C:
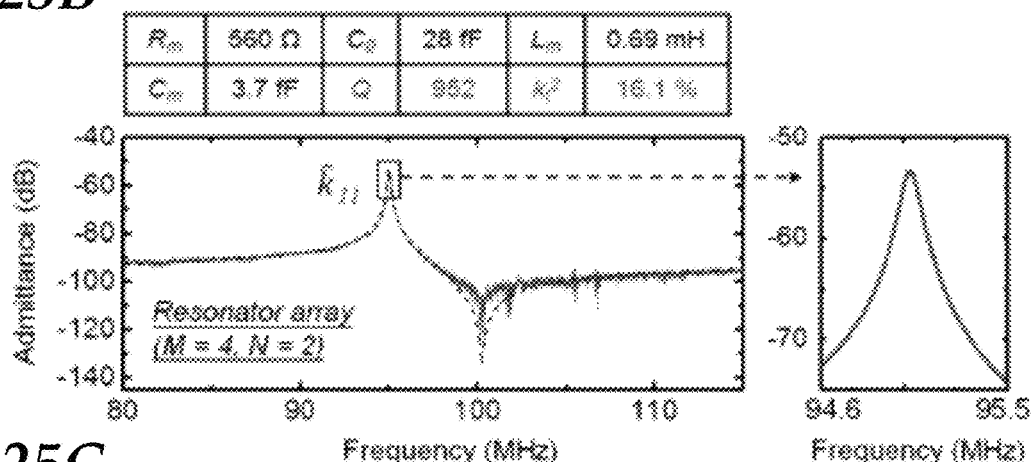
Figures 27A, 27B, 27C, 27D, 27E:
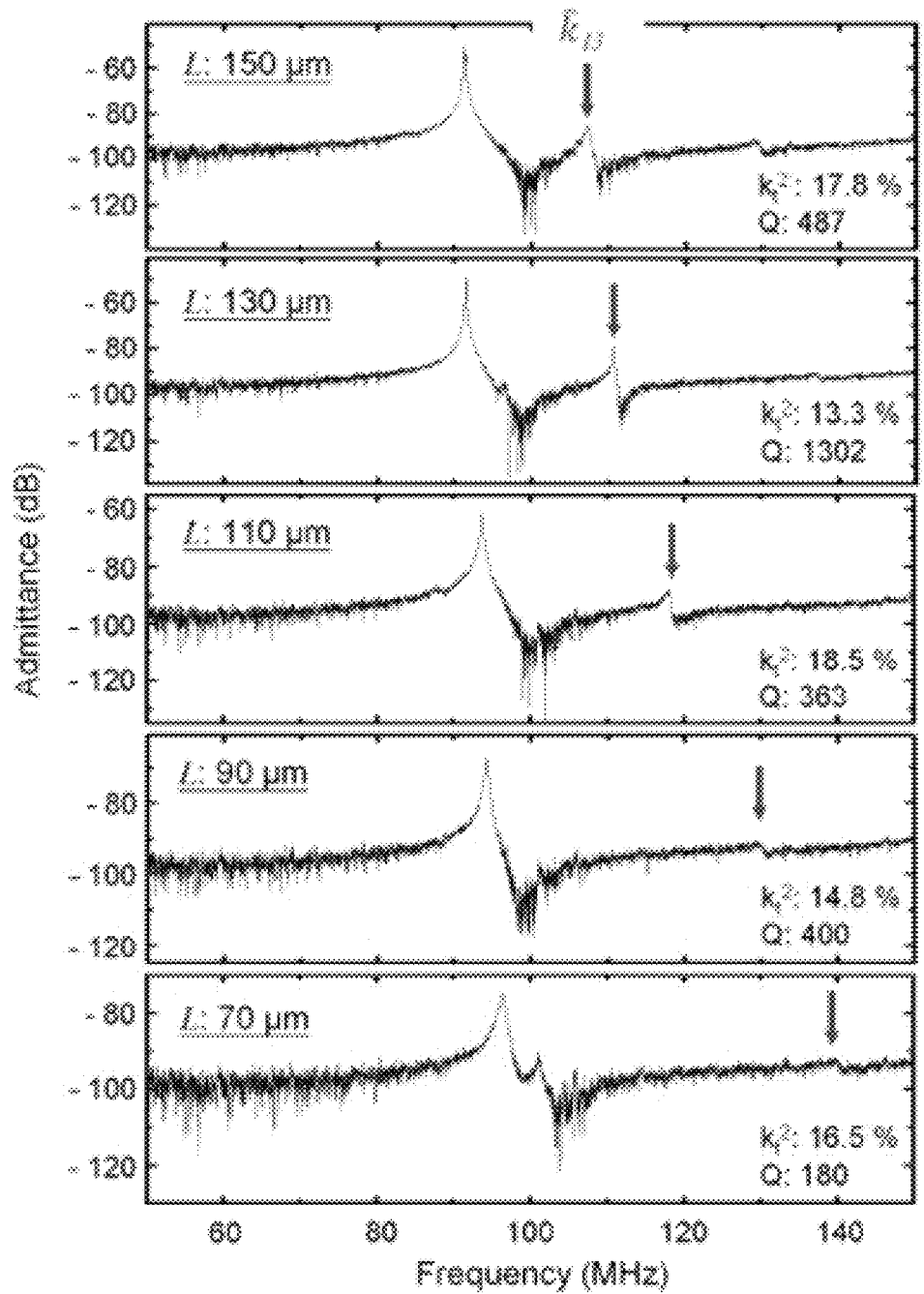
FIGS. 27A, 27B, 27C, 27D, and 27E are graphs illustrating measured admittance responses of the one-port micro-resonator arrays (M=3, N=2) for different resonant cavity lengths, L, and a given cavity width (W), according to embodiments of the present disclosure.

FIGS. 25A, 25B, and 25C illustrate the measured admittance response for a traditional electrode micro-resonator array, the six-electrode micro-resonator array, and the two-electrode micro-resonator array, respectively. The $C_0$, $k_t^2$, Q, and motional components including $R_m$, $C_m$, and $L_m$ are extracted by fitting the measured admittance response with the modified Butterworth-Van Dyke (MBVD), as shown in the inset of each of FIGS. 25A-25C. Feedthrough capacitances ($C_f$) that are responsible for the low $k_t^2$ were measured as well and their effects have been de-embedded, e.g., removed. As shown in FIGS. 25B and 25C, in contrast to the traditional topology (N=6), the 3rd order transverse modes ($\hat{k}_{1,3}$) in both micro-resonator arrays shift further away from the anti-resonance. In addition, as depicted in the insets of FIGS. 25B and 25C, the zoomed-in measurement of each array displays only one discernable resonance, indicating that micro-resonators in each array vibrate in tandem at the same frequency. This response also highlights the excellent uniformity achieved in fabrication.

All single one-port micro-resonators show a high $k_t^2$ from 14.1% to 16.6% and the effective $k_t^2$ of the micro-resonator arrays are comparable to that of the six-electrode micro-resonator. The measured Qs of micro-resonator arrays are about two times higher than that of the six-electrode device. From this data, one may determine that the acoustic energy of SH0 with a low longitudinal order can be more efficiently confined in a smaller cavity. The concurrently-achieved high $k_t^2$ and Qs for the arrays of FIGS. 25B and 25C have produced very high FoMs of 153 and 154, respectively.

FIG. 26A is a graph illustrating measured admittance response of the traditional one-port micro-resonator (M=1, N=6), and FIG. 26B is a graph illustrating measured admittance response of a micro-resonator array with three single devices (M=3, N=2) over a wide frequency range, according to embodiments of the present disclosure. As expected, the traditional micro-resonator exhibits a relatively small spectral spacing between the intended mode ($\hat{k}_{51}$) and higher order longitudinal overtones ($\hat{k}_{31}$, $\hat{k}_{71}$, and $\hat{k}_{91}$). In contrast to the traditional device, the two-electrode micro-resonator array may only feature one spurious mode at 290 MHz, namely the longitudinal overtone ($\hat{k}_{31}$) (FIG. 26B). This single spurious mode may provide for a much larger spurious-free spectral range near the intended resonance. The results display good agreement with the 2-D analysis and 3-D simulation in FIG. 21, therefore experimentally substantiating the theory outlined previously.

Note that the 3rd order transverse mode of the micro-resonator arrays are also significantly subdued, as illustrated in FIGS. 26A and 26B, which is a noticeable discrepancy between the simulated (FIGS. 16A and 16D) and measured results. It is believed that a larger $\Delta f_1$ can dampen the response of the 3rd order transverse mode. To verify the effect of $\Delta f_1$ on the $3^{rd}$ order transverse mode, identical two-electrode micro-resonator arrays with different cavity lengths, L, and the same width were fabricated and tested. The L is varied to effectively introduce different values of $\Delta f_1$ based on Equation 11. As illustrated in FIGS. 27A, 27B, 27C, 27D, and 27E, the $3^{rd}$ order transverse mode is gradually mitigated as the cavity length, L, decreases, confirming that a wider $\Delta f_1$ results in the mitigation of the $3^{rd}$ order transverse mode.

Ladder Filters

Upon the experimental confirmation that the two-electrode micro-resonators display spurious-mitigated response, ladder filters were synthesized by arraying both two-electrode and six-electrode micro-resonators. Assume that an array of ten micro-resonators (M=10, N=6) is used for the shunt branch of the six-electrode ladder filter, and also assume the micro-resonator filters have the same topology as the ones in the simulation. The SEM images of the fabricated filters are illustrated in FIGS. 28A, 28B, 28C, and 28D. FIGS. 28A and 28B are SEM images of the fabricated SH0 ladder filters made up of two-electrode and six-electrode micro-resonator arrays, respectively, according to embodiments of the present disclosure. FIGS. 28C and 28D are SEM images of zoomed-in views of the two-electrode and six-electrode micro-resonator arrays in the ladder filters of FIGS. 28A and 28B, respectively, according to embodiments of the present disclosure.

In the disclosed embodiments, the overall filter footprints are 1.2×0.48 mm$^2$ and 0.92×0.48 mm$^2$ for the two-electrode and six-electrode designs, respectively. The 5 μm-gap (e.g., longitudinal gap) between two adjacent single micro-resonators in the array may be the cause for the size difference between the single micro-resonators. With a finer lithography tool, micro-resonator filters based on two-electrode micro-resonator arrays may have a comparable size to the micro-resonator filters formed by multiple-electrode micro-resonators.

Figure 29A:
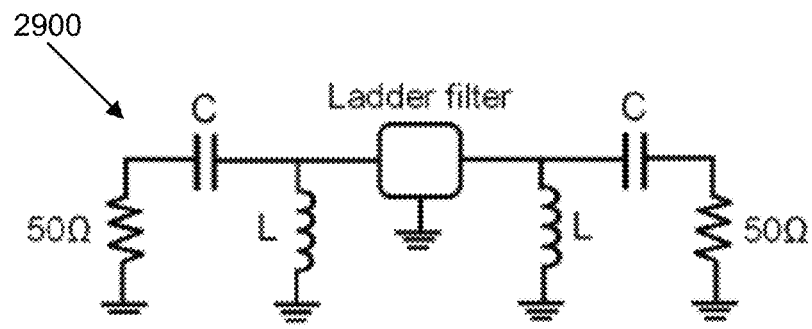
FIG. 29A is a schematic diagram illustrating a configuration of an inductor (L)-capacitor (C) matching network employed to match the ladder filters to 50Ω, according to embodiments of the present disclosure.

FIG. 29A is a schematic diagram illustrating a Configuration of an inductor (L)-capacitor (C) matching network employed to match the ladder filters to 50Ω, according to embodiments of the present disclosure. As shown in FIG. 29A, a lumped-element inductor-capacitor (L-C) network 2900 may be utilized to match the filters to 50Ω. The lumped-element network 2900 may include a 50Ω resistor on either side, each coupled serially to a capacitor and in parallel to an inductor before being coupled to the micro-resonator ladder filter. In one embodiment, the inductance of each inductor is 319 nH and the capacitance of each capacitor is 3.0 pF for the six-electrode micro-resonator filter. Furthermore, the inductance of each inductor is 845 nH and the capacitance of each capacitor is 2.9 pF for the 2-electrode filter. The employed Qs for the capacitors and inductors may be 1,000 and 100, respectively. The L-C helper circuits with large inductances may be required due to the relatively low $C_0$ of individual micro-resonators and the limited numbers of the micro-resonators in the micro-resonator arrays.

Figure 29B:
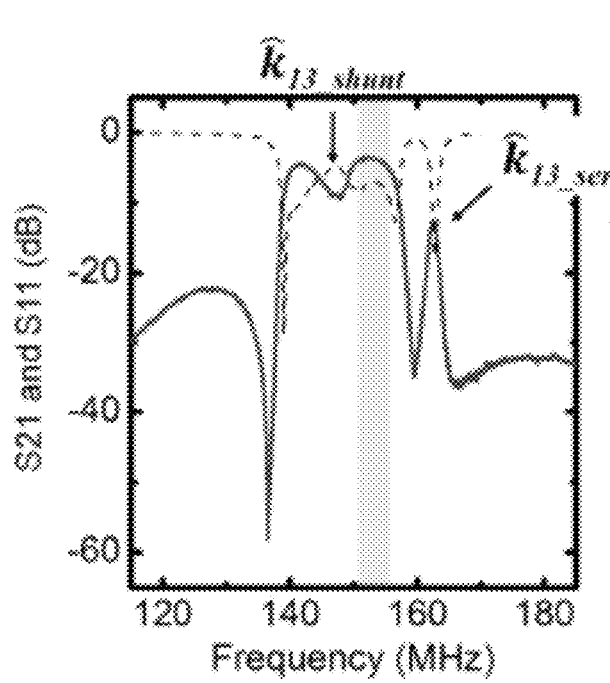
FIGS. 29B and 29C are graphs illustrating measured response of the bandpass filters with impedance matching of FIG. 29A applied for six-electrode and two-electrode micro-resonator array designs, respectively, according to embodiments of the present disclosure.
Figure 29C:
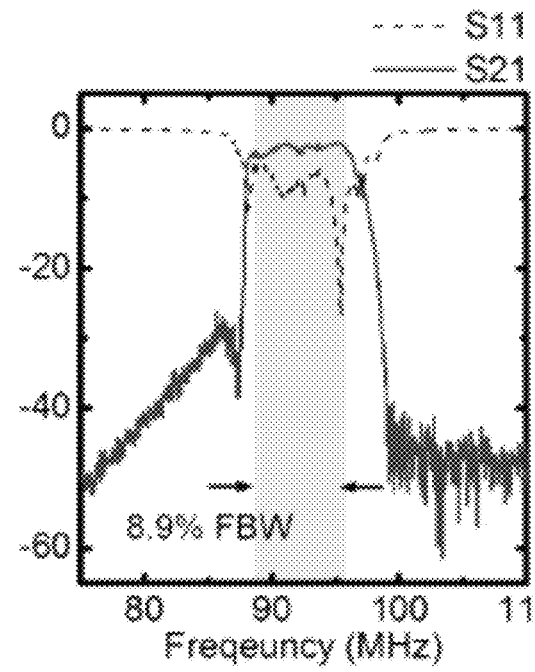

FIGS. 29B and 29C are graphs illustrating measured S21 and S11 responses of the bandpass resonance filters with the impedance matching of FIG. 29A applied for six-electrode and two-electrode micro-resonator array designs, respectively, according to embodiments of the present disclosure. The effective feedthrough capacitances ($C_f$) may be included in the filter measurement. As illustrated in FIG. 29B, the response of the six-electrode micro-resonator ladder filter is severely deteriorated in the passband and slightly beyond the passband by the $3^{rd}$ order transverse modes of the series and shunt micro-resonator arrays. On the other hand, flat and ripple-free response may be accomplished in the two-electrode micro-resonator ladder filter with a high 3-dB FBW of 8.9% (FIG. 29C). The measured filter response illustrates great agreement with the simulation results. The measured FBW of the filter formed by two-electrode micro-resonator filters is slightly smaller than the 3-D FEA result because the measured resonant frequencies of both the series and shunt micro-resonator arrays slightly deviate from the simulated values. In addition, parasitic capacitances introduced by probing pads and routing lines may slightly diminish the FBW. The insertion loss for the two-electrode design is 2.1 dB, which is smaller than that of the six-electrode ladder filter (3.3 dB) owing to the higher Q of the one-port two-electrode micro-resonator arrays. Moreover, the high Q enables a 30-dB shape factor as low as 1.48. The performance of the device is summarized and compared to previously-reported LVR-based filters in Table 4.

While minimizing the number of electrodes in each portion of a micro-resonator array may best minimize the spurious modes, other designs are envisioned that may include three or four electrodes, for example, in performing a tradeoff in other aspects of the design that may benefit from more than two electrodes. For example, the two-electrode design may lead to a low static capacitance, Co, and make it difficult to interface with 50Ω systems. Having more than two electrodes, in certain design scenarios, may reduce the amount of parallel resonators required to attain a reasonable $C_0$ and impedance matching while still providing acceptable mitigation to spurious modes. Accordingly, the disclosed micro-resonator array is not limited to two electrodes in any given embodiment unless explicitly stated to be a two-electrode design.

TABLE 4

| Reference | Insertion loss | Out-of-band reject. | Center freq. | 3-dB FBW |
|---|---|---|---|---|
| S. Gong and G. Piazza, "Monolithic multi-frequency wideband RF filters using two-port laterally vibrating lithium niobate MEMS resonators," *J. Microelectromech. Syst.*, vol. 23, no. 5, pp. 1188-1197, October 2014. | 4 dB | 46 dB | 750 MHz | 3.9% |
| S. Gong and G. Piazza, "An 880 mhz ladder filter formed by arrays of laterally vibrating thin film lithium niobate resonators," in *IEEE 27th Int. Conf. Micro Electro Mechanical Syst. (MEMS)*, pp. 1241-1244, 2014. | 3.5 dB | <10 dB | 880 MHz | 2.2% |
| C. Zuo, N. Sinha, and G. Piazza, "Very high frequency channel-select MEMS filters based on self-coupled piezoelectric AlN contour-mode resonators," *Sens. Actuators A, Phys.*, vol. 160, no. 1, pp. 132-140, May 2010. | 2.3 dB | 60 dB | 251 MHz | 0.53% |
| R. H. Olsson, J. Nguyen, T. Pluym, and V. M. Hietala, "A method for attenuating the spurious responses of aluminum nitride micromechanical filters," *J. Microelectromech. Syst.*, vol. 23, no. 5, pp. 1198-1207, March 2014. | 6.2 dB | 60 dB | 494 MHz | <1% |
| G. Piazza, P. J. Stephanou, and A. P. Pisano, "Single-chip multiple frequency AlN MEMS filters based on contour-mode piezoelectric resonators," *J. Microelectromech. Syst.*, vol. 16, no. 2, pp. 319-328, April 2007. | 4 dB | 27 dB | 93 MHz | <1% |
| C. Cassella, G. Chen, Z. Qian, G. Hummel, and M. Rinaldi, "Crosssectional lam´e mode ladder filters for UHF wideband applications," *IEEE Electron Device Lett.*, vol. 37, no. 5, pp. 681-683, May 2016. | 1.8 dB | 5 dB | 880 MHz | 3.3% |
| J. Liang, H. Zhang, D. Zhang, X. Duan, H. Zhang, and W. Pang, "Design and fabrication of aluminum nitride lamb wave resonators towards high figure of merit for intermediate frequency filter applications," *Journal of Micromechanics and Microengineering*, vol. 25, no. 3, p. 035016, March 2015. | 4.5 dB | 40 dB | 252 MHz | <1% |
| Disclosed Two-Electrode Design | 2.1 dB | 27 dB | 95 MHz | 8.9% |

Figure 30A:
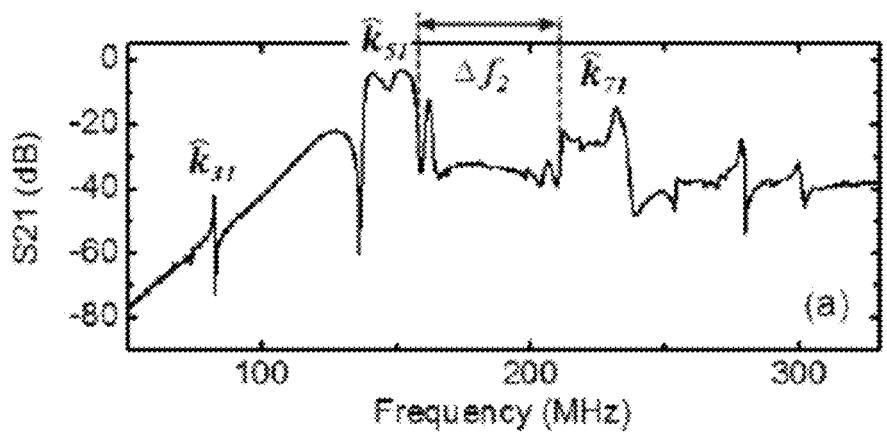
FIGS. 30A and 30B are graphs illustrating measured S21 response of the SH0-mode ladder filters formed by six-electrode and two-electrode micro-resonator arrays, respectively, according to embodiments of the present disclosure.
Figure 30B:
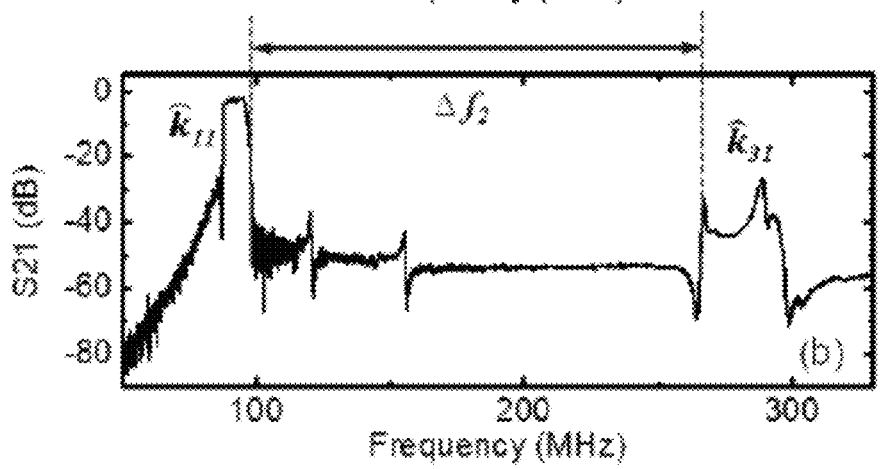

FIGS. 30A and 30B are graphs illustrating measured S21 response of the SH0-mode ladder filters formed by six-electrode and two-electrode micro-resonator arrays, respectively, according to embodiments of the present disclosure. Over a wider frequency range from 50 MHz to 350 MHz, the traditional six-electrode ladder filter may exhibit relatively small spectral spacing between the intended passband and spurious passband that comes from the higher order longitudinal overtone ($\hat{k}_{71}$). In comparison, the two-electrode ladder filter has shown excellent spurious-free response up to 270 MHz, as illustrated in FIG. 30B. Different from the single one-port micro-resonator array, the 3rd order transverse mode in the two-electrode ladder filter is not perfectly subdued. This may primarily be because the uniformity requirement for the ladder filter is more stringent than a single micro-resonator array. The fabrication non-uniformity, particularly in terms of the size of the release region, may introduce performance deviation between identically-designed micro-resonators in shunt and series branches.

Figure 31A:
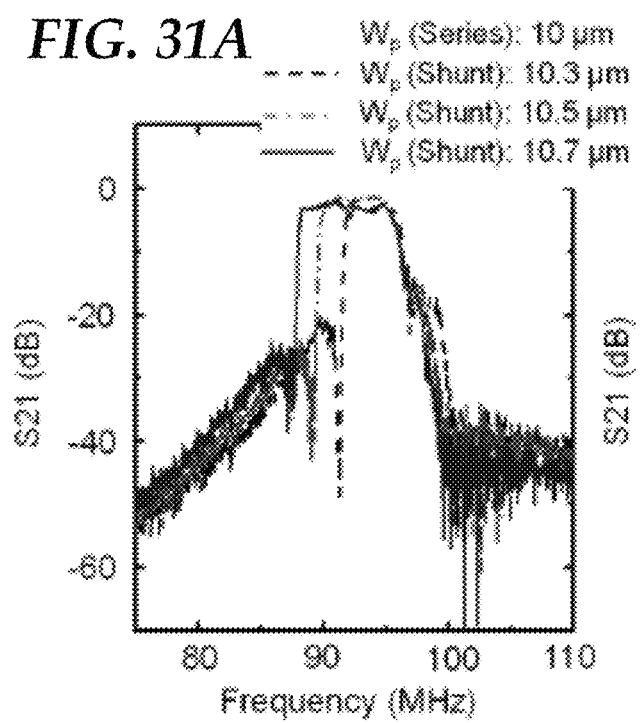
FIGS. 31A and 31B are graphs illustrating measured responses of the two-electrode bandpass filters with various electrode pitches and identical single micro-resonator numbers of the shunt branch micro-resonator arrays, respectively, according to embodiments of the present disclosure.
Figure 31B:
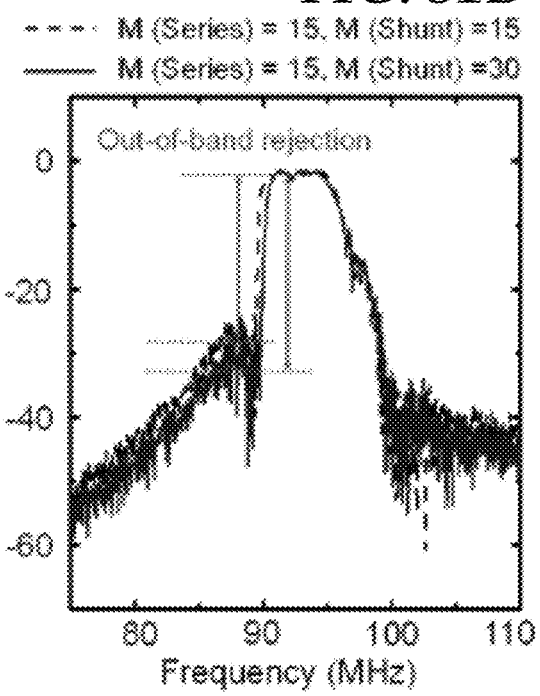

FIGS. 31A and 31B are graphs illustrating measured responses of the two-electrode bandpass filters with various electrode pitches and identical single micro-resonator numbers of the shunt branch micro-resonator arrays, respectively, according to embodiments of the present disclosure. In addition to demonstrating the wideband spurious free response, the present disclosure also discusses experimentally investigating the frequency setting of LiNbO$_3$ filters. As an advantage of LVR-based filters, the FBW of the LiNbO$_3$ filter may be readily adjustable by setting the electrode pitches lithographically. To this end, the two-electrode ladder filters using shunt branch micro-resonators with different electrode pitches were also fabricated and measured. As seen in FIG. 31A, the electrode pitch ($W_{p\text{-}shunt}$) may be varied from 10.3 μm to 10.7 μm, resulting in a 3-dB FBW from 4.1% to 8.9% accordingly.

In various embodiments, the out-of-band rejection of the demonstrated ladder-filter may range from 22 dB to 27 dB. The out-of-band rejection for an n-stage filter (e.g., one stage denotes a series and a shunt branch in combination) may be approximately determined by:

$$S_{21\text{-}Out\text{-}of\text{-}Band} \approx \frac{1}{\left(1 + \frac{C_{shunt}}{C_{series}}\right)^n}, \qquad (12)$$

where $C_{series}$ and $C_{shunt}$ represent the micro-resonator static capacitance for the series and the shunt branch micro-resonators, respectively. Based on application of Equation 12, the out-of-band rejection may be improved with a higher $C_{shunt}/C_{series}$ and a larger stage (n). As illustrated in FIG. 31B, the out-of-band rejection of the two-electrode ladder filter may be enhanced by changing the number of identical micro-resonators in the shunt branch (i.e. $C_{shunt}/C_{series}$) without significantly compromising the device performance (e.g. insertion loss). For even better out-of-band rejection, a higher n may be employed, although the improved out-of-band rejection may come at the cost of possible degradation in insertion loss.

Unless defined otherwise, all technical and scientific terms used herein have the same meaning as commonly understood by one of skill in the art to which the disclosure pertains. Although any methods and materials similar to or equivalent to those described herein can be used in the practice or testing of the present disclosure, the preferred methods and materials are described herein.

The above-disclosed subject matter is to be considered illustrative, and not restrictive, and the appended claims are intended to cover all such modifications, enhancements, and other embodiments, which fall within the true spirit and scope of the present disclosure. Thus, to the maximum extent allowed by law, the scope of the present embodiments are to be determined by the broadest permissible interpretation of the following claims and their equivalents, and shall not be restricted or limited by the foregoing detailed description. While various embodiments have been described, it will be apparent to those of ordinary skill in the art that many more embodiments and implementations are possible within the scope of the above detailed description. Accordingly, the embodiments are not to be restricted except in light of the attached claims and their equivalents, now presented or presented in a subsequent application claiming priority to this application.

What is claimed is:

1. A micro-resonator comprising:
    a piezoelectric plate disposed on a bulk substrate, the bulk substrate defining a cavity under a released region of the piezoelectric plate, wherein a first end of the piezoelectric plate comprises a first arch-shaped portion and a second end of the piezoelectric plate comprises a second arch-shaped portion;
    a first electrode positioned on the piezoelectric plate at the first end of the piezoelectric plate, the first electrode comprising a first set of fingers extending from a first side of a first conductive bus towards the second end of the piezoelectric plate; and
    a second electrode positioned on the piezoelectric plate at the second end of the piezoelectric plate, the second electrode comprising a second set of fingers extending from a first side of a second conductive bus towards the first end of the piezoelectric plate and interdigitated with the first set of fingers with an overlapping distance.

2. The micro-resonator of claim 1, wherein the first electrode further comprises a first arch-shaped element extending from a second side of the first conductive bus opposite from the first side, the first arch-shaped element having curved ends that connect to opposing ends of the first conductive bus, and the first arch-shaped element positioned on and matching a shape of the first arch-shaped portion of the piezoelectric plate.

3. The micro-resonator of claim 2, wherein the second electrode further comprises a second arch-shaped element extending from a second side of the second conductive bus opposite from the first side, the second arch-shaped element having curved ends that connect to opposing ends of the second conductive bus, and the second arch-shaped element positioned on and matching a shape of the second arch-shaped portion of the piezoelectric plate.

4. The micro-resonator of claim 1, wherein the overlapping distance is less than seven-tenths a length of the released region of the piezoelectric plate.

5. The micro-resonator of claim 4, wherein the overlapping distance is also more than four-tenths the length of the released region of the piezoelectric plate.

6. The micro-resonator of claim 1, wherein the first set of fingers are approximately parallel to and spaced from the second set of fingers.

7. The micro-resonator of claim 1, wherein the first electrode further comprises a signal connector connected to the first conductive bus, and wherein the second electrode further comprises a ground connector connected to the second conductive bus.

8. A micro-resonator comprising:
    a piezoelectric plate disposed on a bulk substrate, the bulk substrate defining a cavity under a released region of the piezoelectric plate, wherein a first end of the piezoelectric plate comprises a first triangular-shaped portion and a second end of the piezoelectric plate comprises a second triangular-shaped portion;
    a first electrode positioned on the piezoelectric plate at the first end of the piezoelectric plate, the first electrode comprising a first set of fingers extending from a first side of a first conductive bus, wherein the first conductive bus defines an entirety of a side of the first triangular-shaped portion; and
    a second electrode positioned on the piezoelectric plate at a second end of the piezoelectric plate, the second electrode comprising a second set of fingers extending from a first side of a second conductive bus and interdigitated with the first set of fingers with an overlapping distance, wherein the second conductive bus defines an entirety of a side of the second triangular-shaped portion.

9. The micro-resonator of claim 8, wherein the first electrode further comprises a first triangular-shaped element extending from a second side of the first conductive bus opposite from the first side, the first triangular-shaped element having ends that connect to opposing ends of the first conductive bus, and the first triangular-shaped element positioned on and matching a shape of the first triangular-shaped portion of the piezoelectric plate.

10. The micro-resonator of claim 9, wherein the ends of the first triangular-shaped element forms a first pair of angles with respect to the first conductive bus, wherein each angle of the first pair of angles is less than or equal to 75 degrees.

11. The micro-resonator of claim 10, wherein each angle is between 15 and 45 degrees.

12. The micro-resonator of claim 8, wherein the second electrode further comprises a second triangular-shaped element extending from a second side of the first conductive bus opposite from the first side, the second triangular-shaped element having ends that connect to opposing ends of the second conductive bus, and the second triangular-shaped element positioned on and matching a shape of the second triangular-shaped portion of the piezoelectric plate.

13. The micro-resonator of claim 12, wherein the ends of the second triangular-shaped element forms a first pair of angles with respect to the second conductive bus, wherein each angle of the first pair of angles is less than or equal to 75 degrees.

14. The micro-resonator of claim 13, wherein each angle is between 15 and 45 degrees.

15. The micro-resonator of claim 8, wherein the overlapping distance is less than seven-tenths a length of the released region of the piezoelectric plate.

16. The micro-resonator of claim 15, wherein the overlapping distance is also greater than one-tenth the length of the released region of the piezoelectric plate.

17. The micro-resonator of claim 8, wherein the first electrode further comprises a signal connector connected to the first conductive bus, and wherein the second electrode further comprises a ground connector connected to the second conductive bus.

18. A filter comprising:
a piezoelectric plate disposed on a bulk substrate, the bulk substrate defining a cavity under a released region of the piezoelectric plate, wherein a first end of the piezoelectric plate comprises a first triangular-shaped portion and a second end of the piezoelectric plate comprises a second triangular-shaped portion;
an array including a first two-electrode micro-resonator and a second two-electrode micro-resonator, each comprising:
a first electrode positioned on the piezoelectric plate at the first end of the piezoelectric plate, the first electrode comprising at least a first finger extending from a first side of a first conductive bus; and
a second electrode positioned on the piezoelectric plate at a second end of the piezoelectric plate, the second electrode comprising at least a second finger extending from a first side of a second conductive bus and interdigitated with the at least the first finger with an overlapping distance, wherein the overlapping distance is less than seven-tenths and greater than one-tenth a length of the released region of the piezoelectric plate; and
a longitudinal gap defined in the piezoelectric plate between the first two-electrode micro-resonator and the second two-electrode micro-resonator.

19. The filter of claim 18, wherein each second electrode further comprises a second triangular-shaped element extending from a second side of the first conductive bus opposite from the first side, the second triangular-shaped element having ends that connect to opposing ends of the second conductive bus, and the second triangular-shaped element positioned on and matching a shape of the second triangular-shaped portion of the piezoelectric plate.

20. The filter of claim 18, wherein each first electrode further comprises a first triangular-shaped element extending from a second side of the first conductive bus opposite from the first side, the first triangular-shaped element having ends that connect to opposing ends of the first conductive bus, and the first triangular-shaped element positioned on and matching a shape of the first triangular-shaped portion of the piezoelectric plate.

* * * * *